US006506674B2

(12) United States Patent
Ikeda et al.

(10) Patent No.: US 6,506,674 B2
(45) Date of Patent: Jan. 14, 2003

(54) METHOD OF MANUFACTURING A SEMICONDUCTOR INTEGRATED CIRCUIT DEVICE

(75) Inventors: Takenobu Ikeda, Ome (JP); Masahiro Tadokoro, Hachioji (JP); Masaru Izawa, Hino (JP); Takashi Yunogami, Sagamihara (JP)

(73) Assignees: Hitachi, Ltd., Tokyo (JP); NEC Corporation, Sagamihara (JP)

( * ) Notice: Subject to any disclaimer, the term of this patent is extended or adjusted under 35 U.S.C. 154(b) by 0 days.

(21) Appl. No.: 09/964,628

(22) Filed: Sep. 28, 2001

(65) Prior Publication Data

US 2002/0039843 A1 Apr. 4, 2002

(30) Foreign Application Priority Data

Sep. 29, 2000 (JP) ........................................ 2000-299854

(51) Int. Cl.[7] ........................................... H01L 21/4763
(52) U.S. Cl. ........................ 438/637; 438/640; 438/714; 438/723
(58) Field of Search ................................ 438/723, 637, 438/638, 640, 712, 714, 738

(56) References Cited

U.S. PATENT DOCUMENTS

| 5,591,675 A | * | 1/1997 | Kim et al. ................... 438/637 |
| 5,786,276 A | * | 7/1998 | Brooks et al. .............. 438/724 |
| 5,817,579 A | * | 10/1998 | Ko et al. ...................... 438/40 |
| 5,893,794 A | * | 4/1999 | Jeng et al. ................... 438/239 |
| 5,972,799 A | * | 10/1999 | Koshiishi et al. ........... 438/723 |
| 6,074,952 A | * | 6/2000 | Liu et al. .................... 438/706 |
| 6,117,786 A | * | 9/2000 | Khajehnouri et al. ....... 438/700 |
| 6,194,325 B1 | * | 2/2001 | Yang et al. ................. 438/740 |
| 6,355,572 B1 | * | 3/2002 | Ikegami ..................... 438/706 |

FOREIGN PATENT DOCUMENTS

JP 10209124 8/1998

* cited by examiner

Primary Examiner—T. N. Quach
(74) Attorney, Agent, or Firm—Antonelli, Terry, Stout & Kraus, LLP

(57) ABSTRACT

A hole is formed on an insulating film made of silicon oxide by selectively plasma-etching the insulating film with an etching gas containing $C_5F_8$, $O_2$, and Ar firstly under a condition in which the deposition property of a polymer layer is weak and secondly under a condition in which that of the polymer layer is strong.

35 Claims, 43 Drawing Sheets

$C + F \rightarrow CF \uparrow$

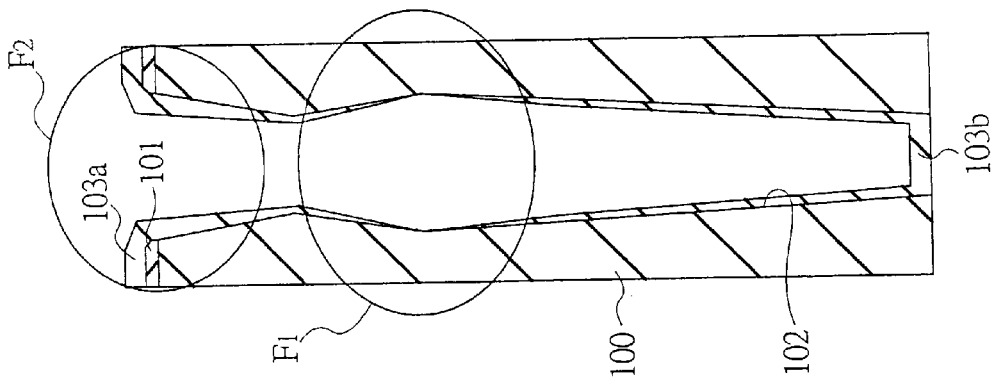
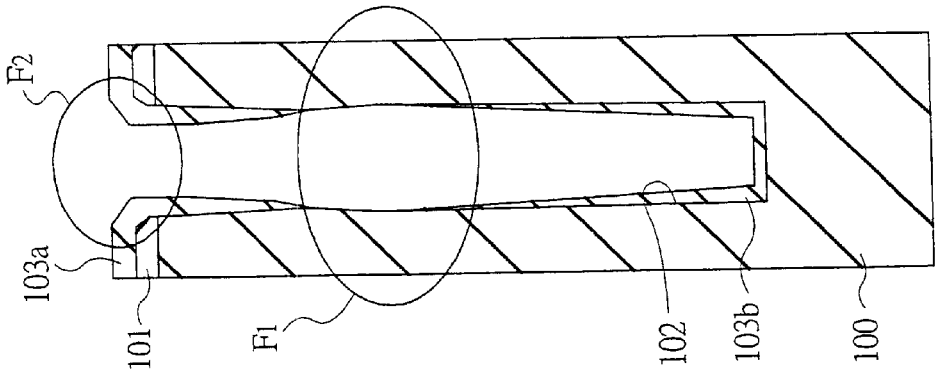
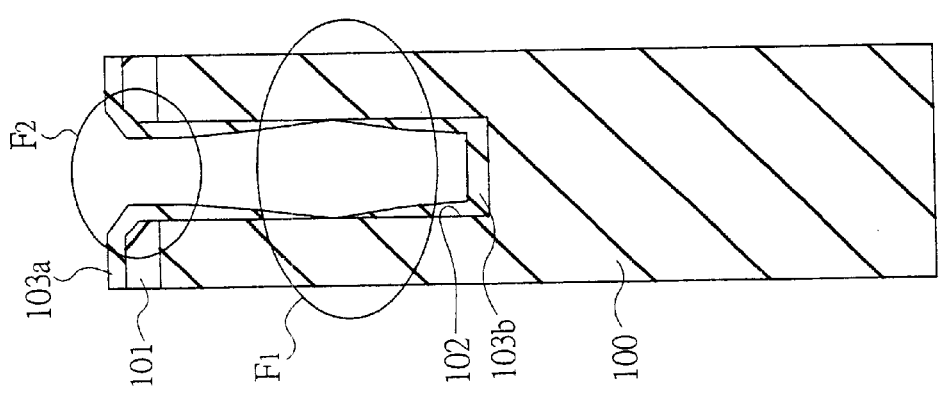
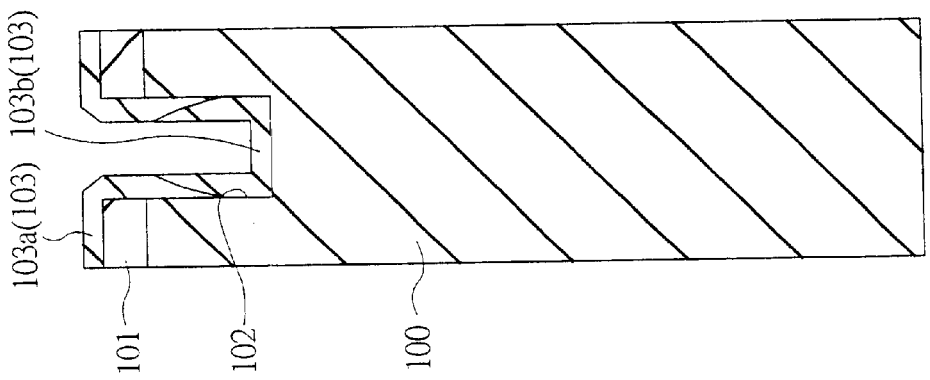

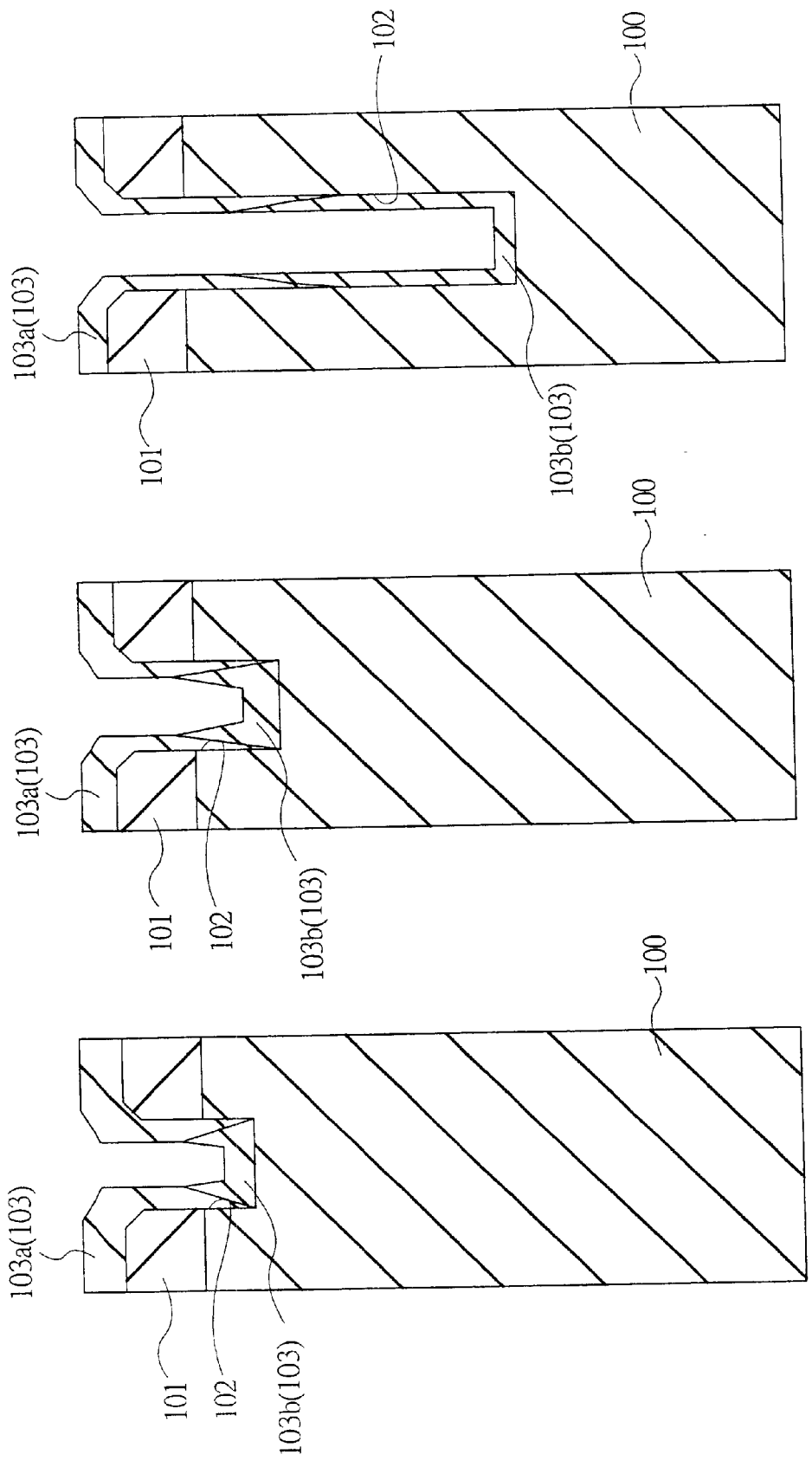

FUNCTIONS OF CFx AND AR+

FUNCTION OF O
FUNCTION OF F

| TIME (DEPTH) IN 1ST STEP | $O_2$ FLOW RATE IN 2ND STEP | | |
|---|---|---|---|
| | $24 cm^3/min$ | $26 cm^3/min$ | $28 cm^3/min$ |
| 30″ (300nm) | × | × | △ NO MASK |
| 1′ 00″ (600nm) | × | ○ | △ NO MASK |
| 2′ 00″ (1.2 μm) | ○ | ○ | △ NO MASK |

METHOD OF MANUFACTURING A SEMICONDUCTOR INTEGRATED CIRCUIT DEVICE

TECHNICAL FIELD OF THE INVENTION

The present invention relates to a semiconductor integrated circuit device manufacturing art, particularly to an art to be effectively applied to a method for forming a hole or trench (hereafter referred to as hole or the like) in the manufacturing process of a semiconductor integrated circuit device.

BACKGROUND OF THE INVENTION

The method for forming a hole or the like studied by the present inventors is described below. That is, an etching mask is formed on a layer insulating film and then, the layer insulating film exposed beyond the etching mask is removed through etching by using a fluorocarbon-based gas and an etching gas containing oxygen to form a hole. In this case, however, such problems occur that a part of the hole becomes thick (bowing) and an etching mask is shaved (decrease of selection ratio). By considering these problems, it is effective to reduce the quantity of oxygen to a fluorocarbon-based gas in an etching gas and improve the deposition property of a polymer layer. However, when improving the deposition property, a new problem occurs that etching does not progress (etch stop). Therefore, at the initial stage of etching, the quantity of oxygen is slightly decreased and then increased while finely adjusting the above quantity of oxygen so that the above mentioned bowing does not occur or the selection ratio does not decrease.

SUMMARY OF THE INVENTION

The present inventors, however, finds that the above art for forming a hole or the like has problems that it is more difficult to form a hole or the like as the aspect ratio of the hole or the like increases or the adjacent interval between holes or the like decreases.

Moreover, the present inventors have examined publicly-known examples from the viewpoint of a method for forming a hole or the like. The art of this type is disclosed in, for example, the official gazette of Japanese Patent Laid-Open Publication No. 10-209124. That is, an art is disclosed in which a hole is drilled by removing approx. 80% of the total thickness of an inter-layer oxide film through etching at a strong anisotropy though the etching selection ratio between the inter-layer oxide film and a lower titanium-nitride film is low at the first stage and removing the remaining inter-layer oxide film at a high etching selection ratio though anisotropy is weak at the second stage when drilling a through-hole from which a part of the titanium-nitride film on the inter-layer oxide film.

It is an object of the present invention to provide an art capable of forming a hole or trench having a high aspect ratio.

The above and other objects and novel features of the resent invention will become more apparent from the description of this specification and the accompanying drawings.

Typical ones of the aspects of the present invention disclosed in this specification are briefly outlined below.

That is, in the case of an aspect of the present invention, when selectively etching a silicon-oxide insulating film deposited on a semiconductor substrate through plasma-etching of the insulating film with a fluorocarbon-based gas and an etching gas containing oxygen, the insulating film is first etched by weakening the deposition property of a polymer layer and then etched by strengthening the deposition property of the polymer.

In the case of another aspect of the present invention, when selectively etching a silicon-oxide insulating film deposited on a semiconductor substrate through plasma-etching of the insulating film with a fluorocarbon-based gas and an etching gas containing oxygen, the insulating film is etched by changing etching conditions in accordance with the quantity of CF-based deposit.

In the case of still another aspect of the present invention, when selectively etching a silicon-oxide insulating film deposited on a semiconductor substrate through plasma-etching of the insulating film with a fluorocarbon-based gas and an etching gas containing oxygen and thereby, forming a hole or trench on the insulating film, comprising the steps of:

(a) forming up to the half depth of a hole or trench is executed by assuming the flow-rate ratio of the oxygen in the etching gas as a first flow-rate ratio in a first step, and (b) forming the hole or trench is executed by applying etching while making the flow-rate ratio of the oxygen in the etching gas lower the first flow-rate ratio in a second step.

In the case of still another aspect of the present invention, when selectively etching a silicon-oxide insulating film deposited on a semiconductor substrate through plasma-etching of the insulating film with a fluorocarbon-based gas and an etching gas containing oxygen and thereby, forming a hole or trench on the insulating film, comprising the steps of:

(a) forming the hole or trench up to the half depth of it by assuming the bias power between upper and lower electrodes of the etching system as a first bias power in a fist step, and (b) forming the hole or trench by executing etching while making the bias power between upper and lower electrodes of the etching system lower than the first bias power in a second step.

In the case of still another aspect of the present invention, the final aspect ratio of the hole or trench formed through the etching is larger than 12.

In the case of still another aspect of the present invention, the final aspect ratio of the hole or trench formed through the etching is larger than 14.

In the case of still another aspect of the present invention, the final aspect ratio of the hole or trench formed through the etching is larger than 16.

In the case of still another aspect of the present invention, the above fluorocarbon-base gas uses $C_5F_3$.

In the case of still another aspect of the present invention, the above etching gas contains argon gas.

BRIEF DESCRIPTIONS OF THE DRAWINGS

FIGS. 1A and 1B are sectional views of an essential portion of a sample for explaining problems of the etching formation of a deep hole studied by the present inventor et al, wherein FIG. 1A shows a case in which relatively much $C_5F_8$ is used and FIG. 1B shows a case in which a relatively little $C_5F_8$ is used;

Figure 5:
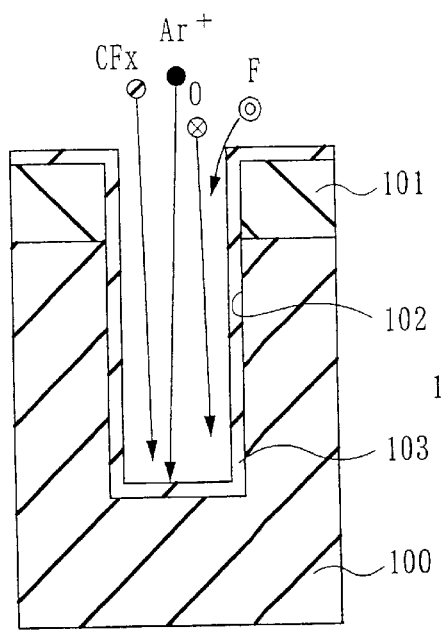
Figure 5:
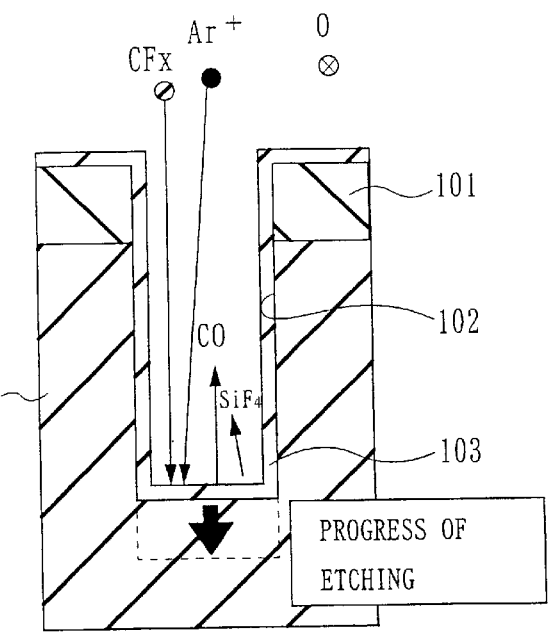
Figure 5:
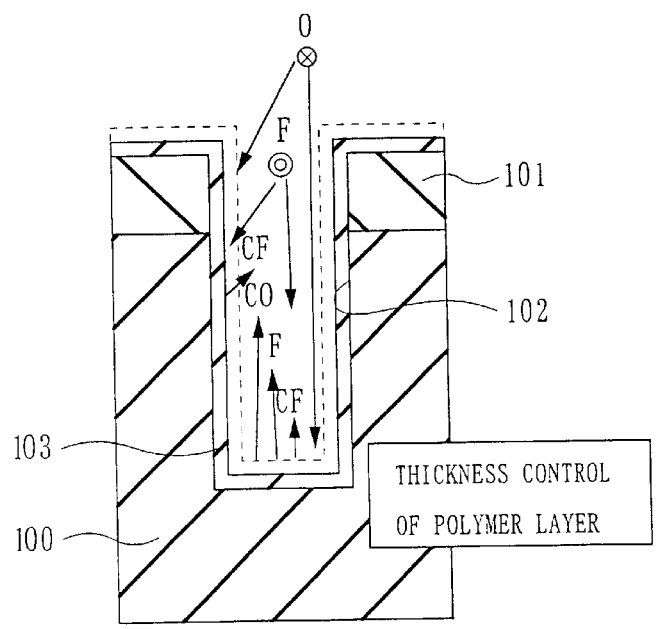
Figure 6:
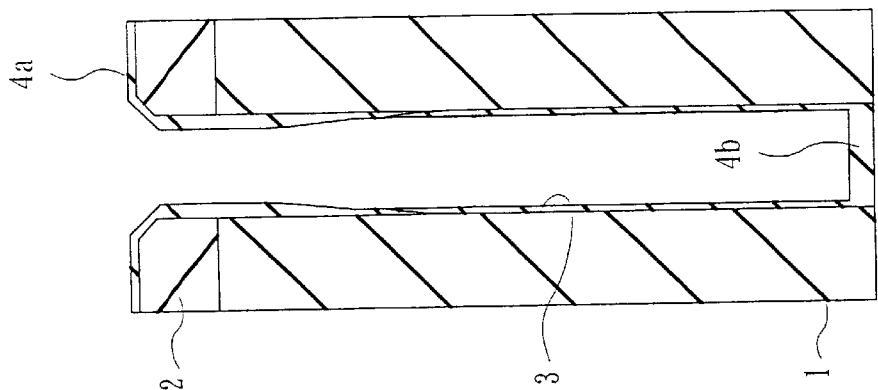
Figure 6:
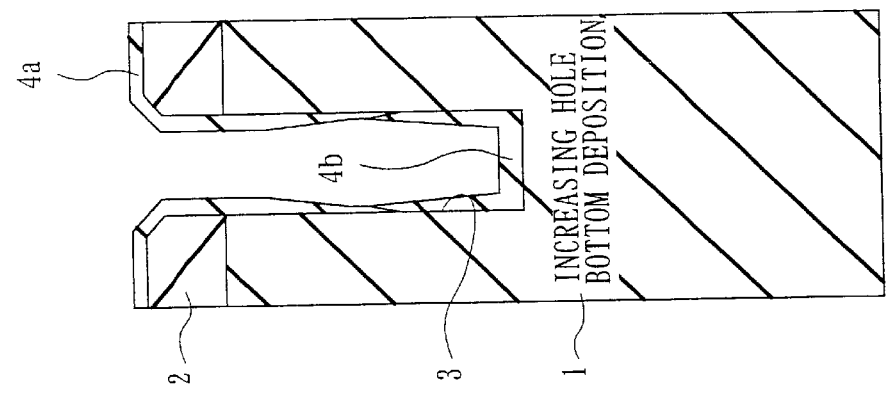
Figure 6:
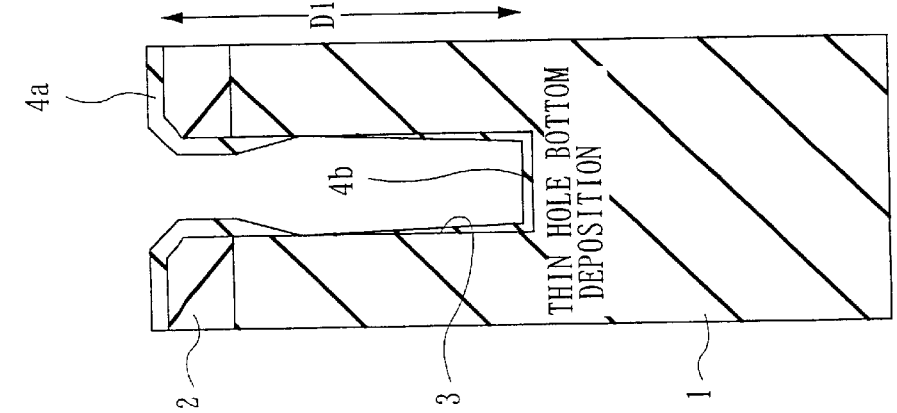
Figure 6:
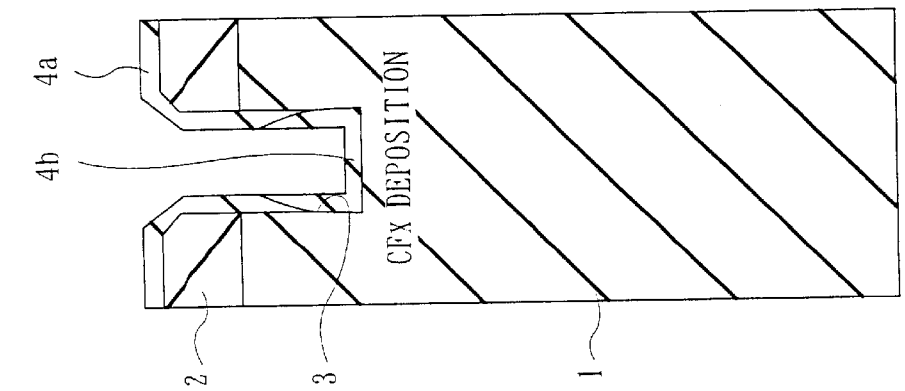
Figures 7, 8:
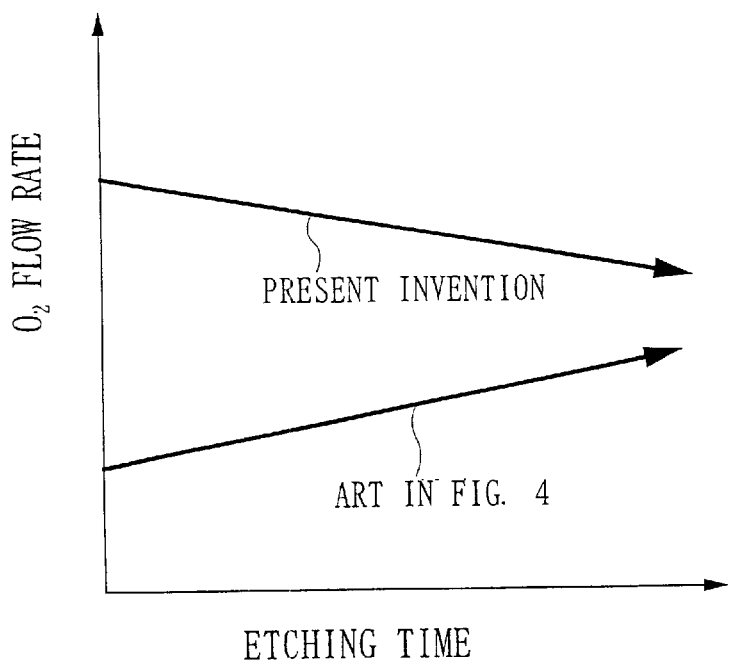
Figure 9:
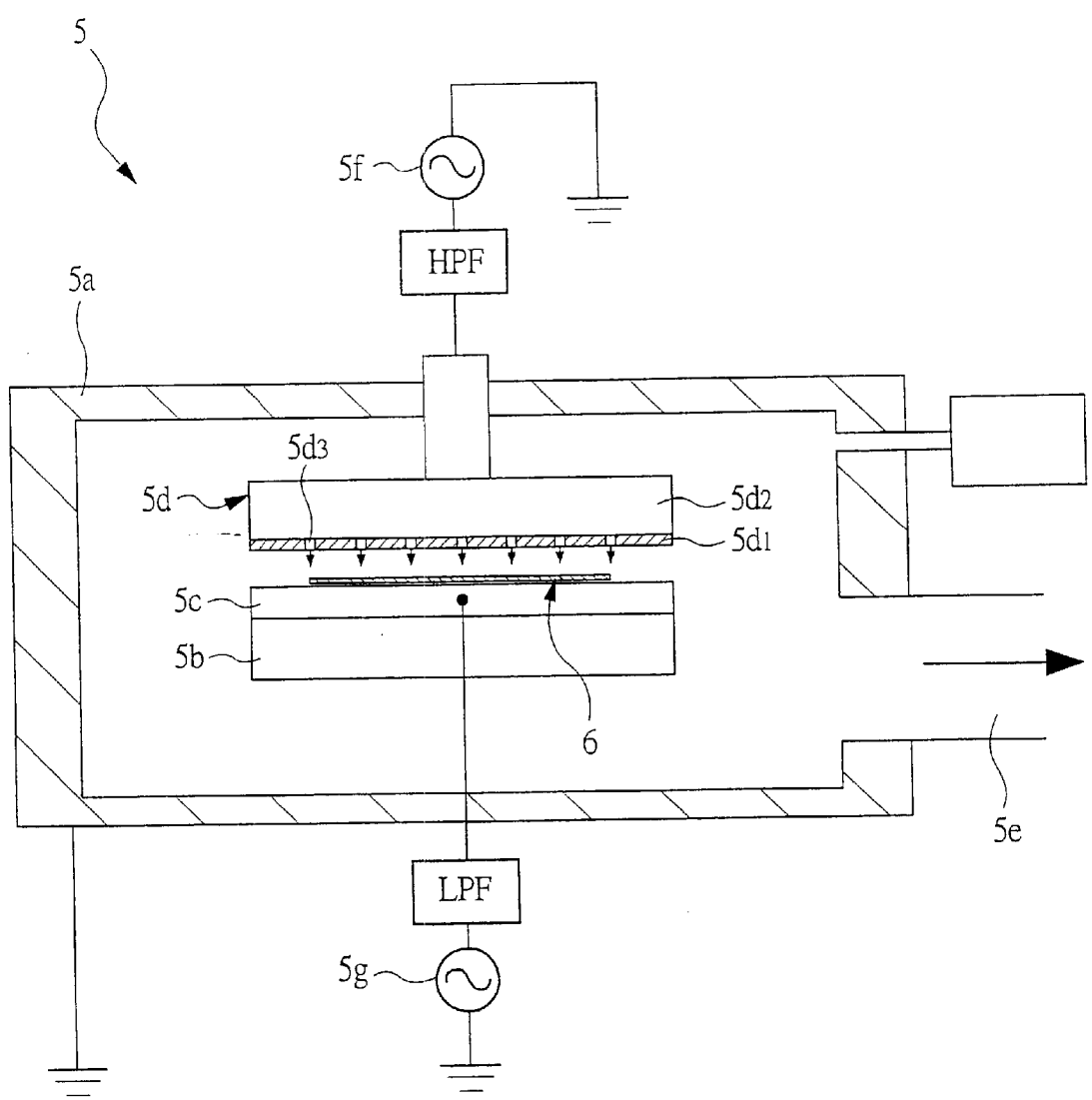
Figure 10:
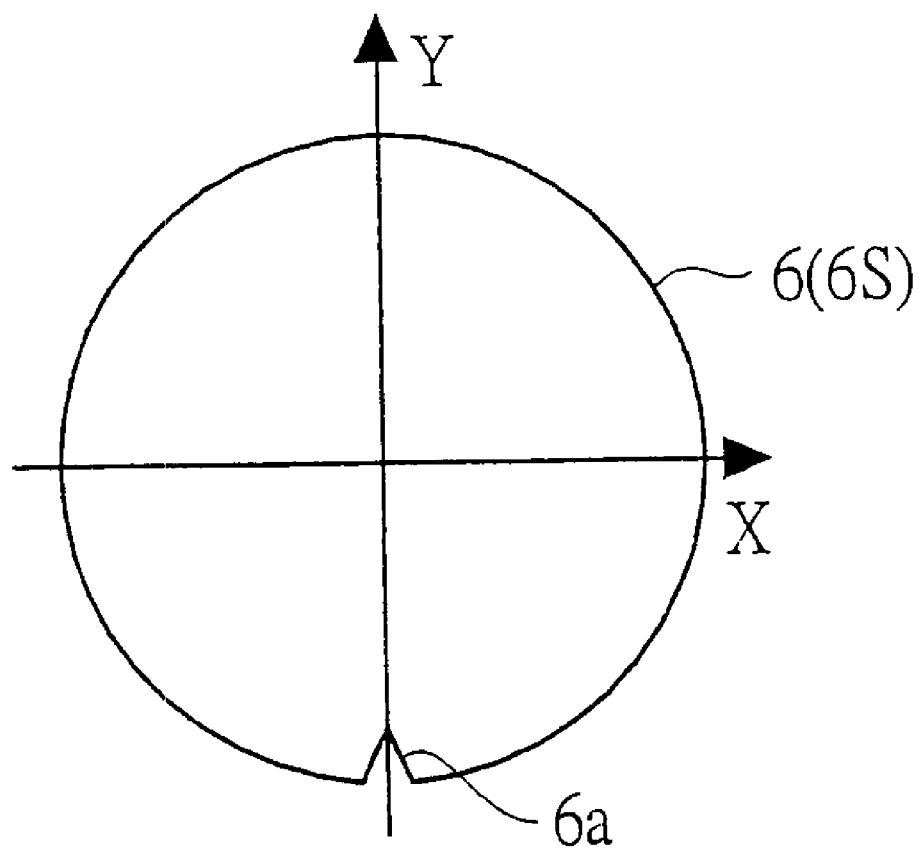
Figure 11:
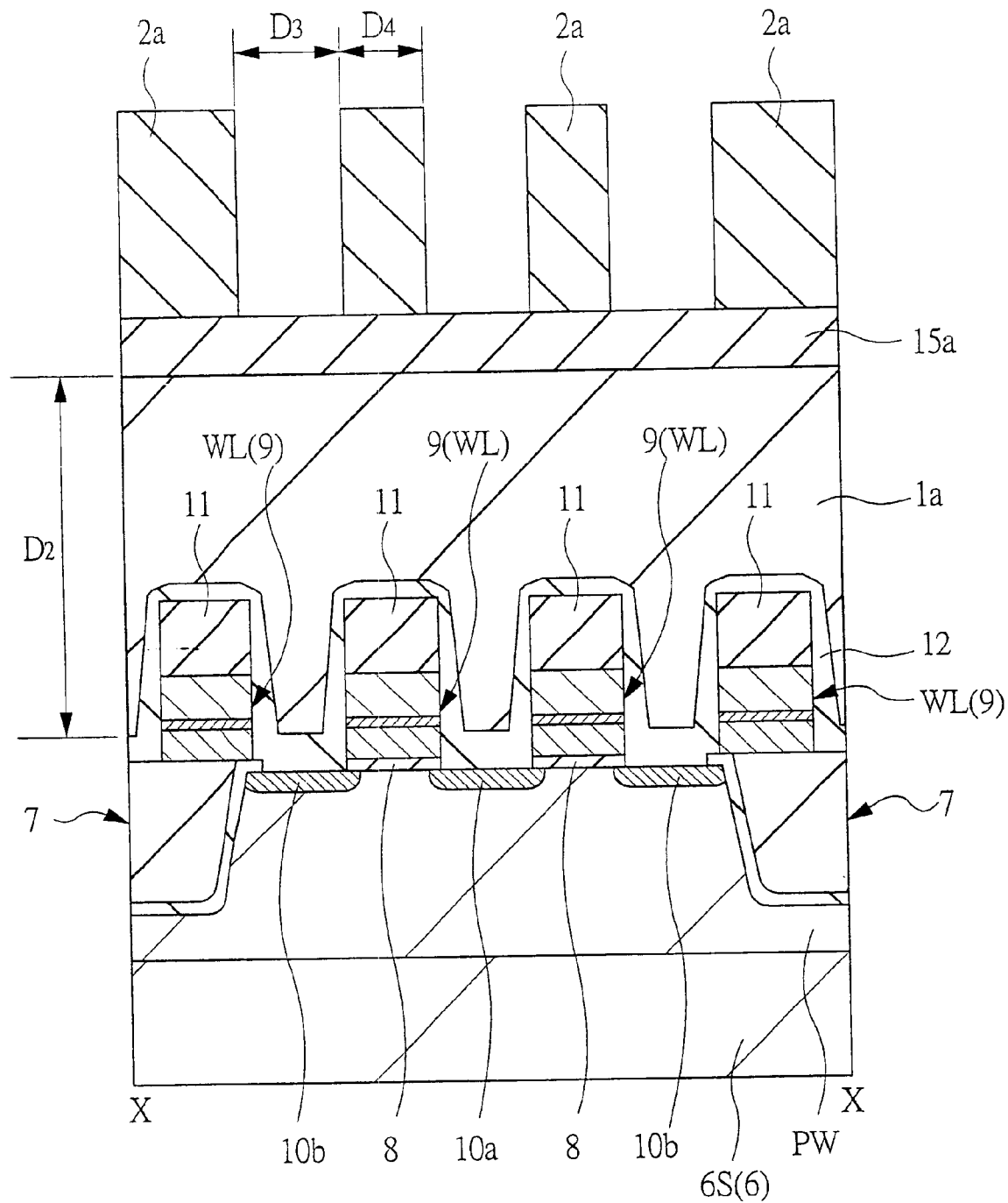
Figure 12:
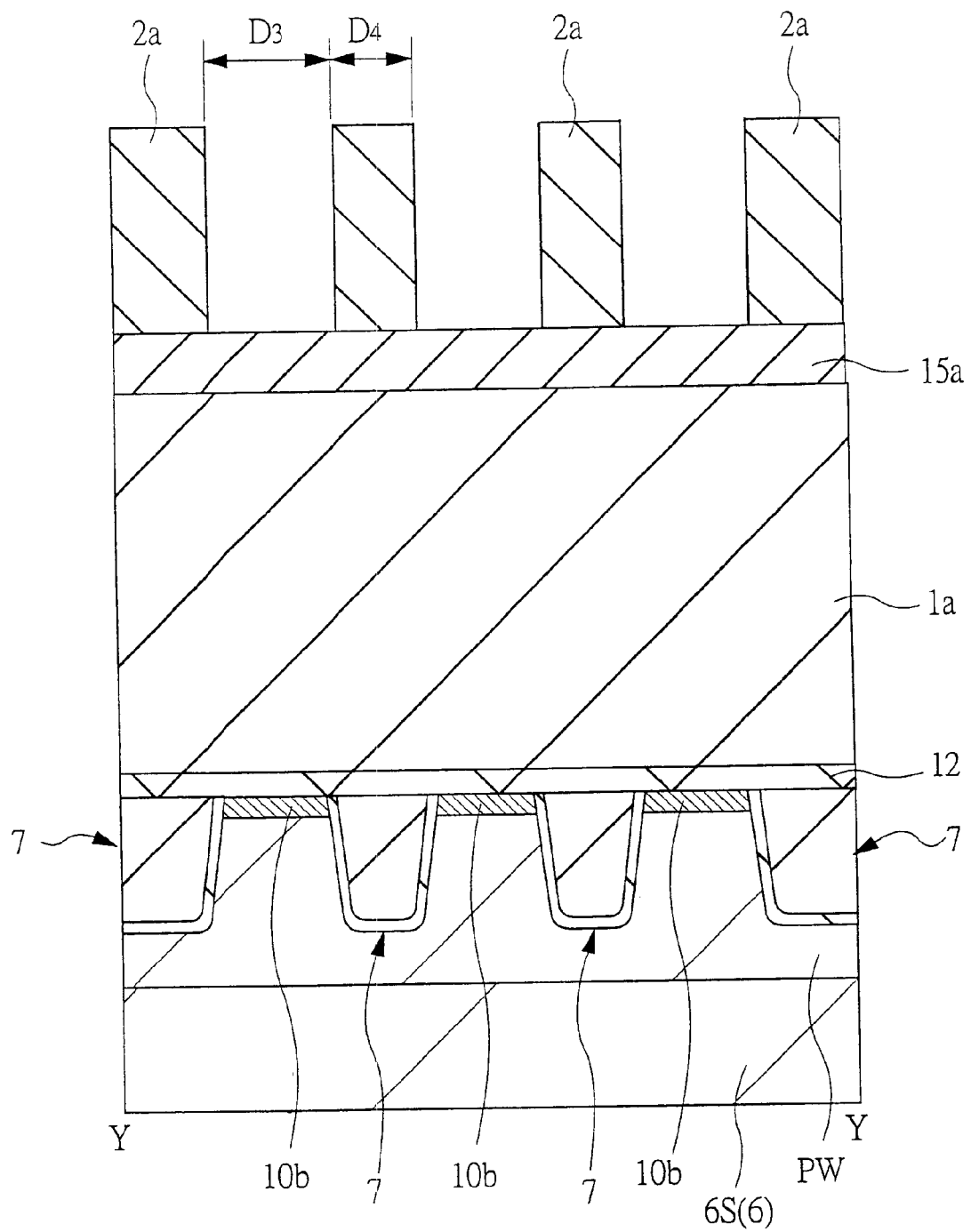
Figure 13:
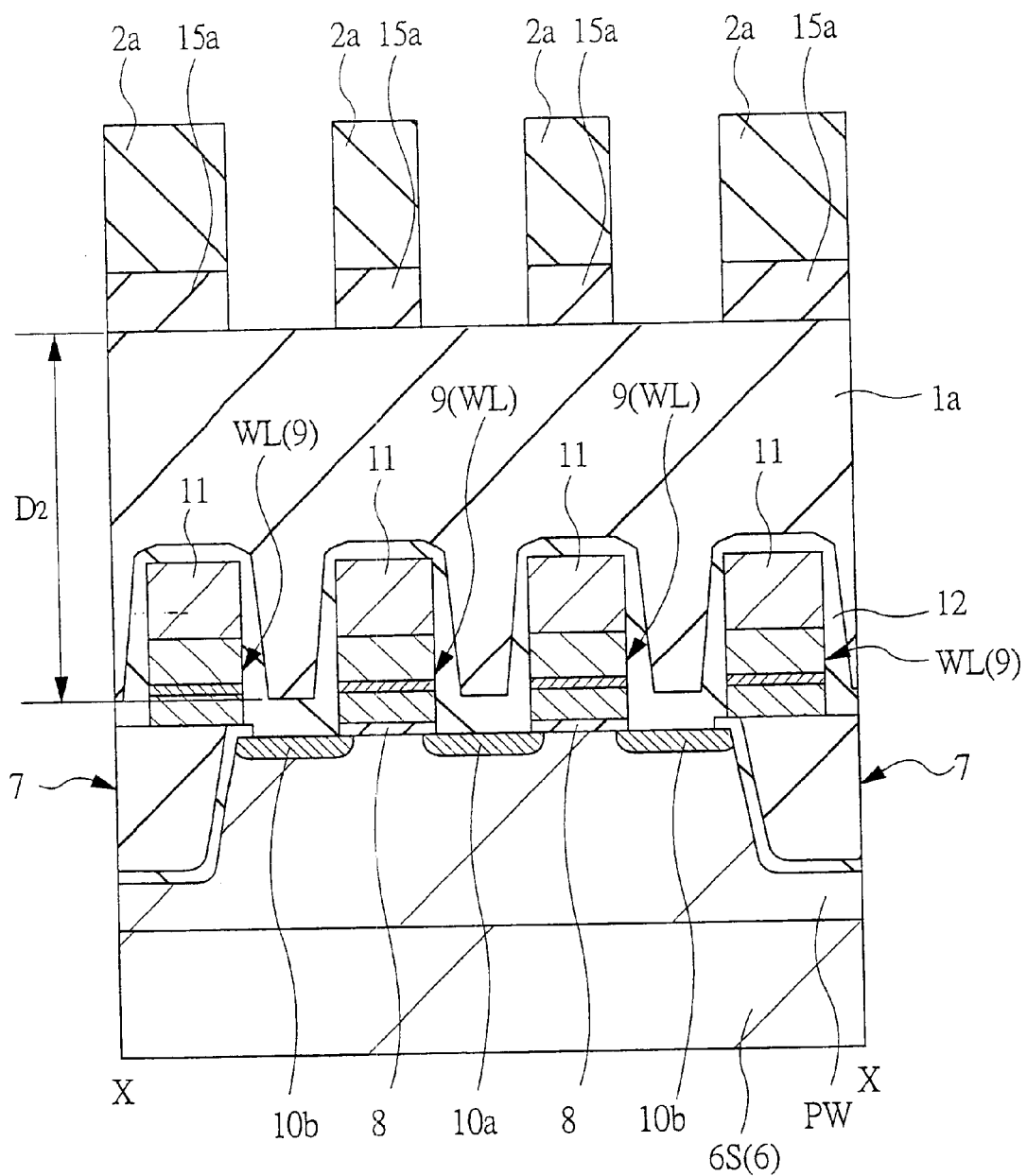
Figure 14:
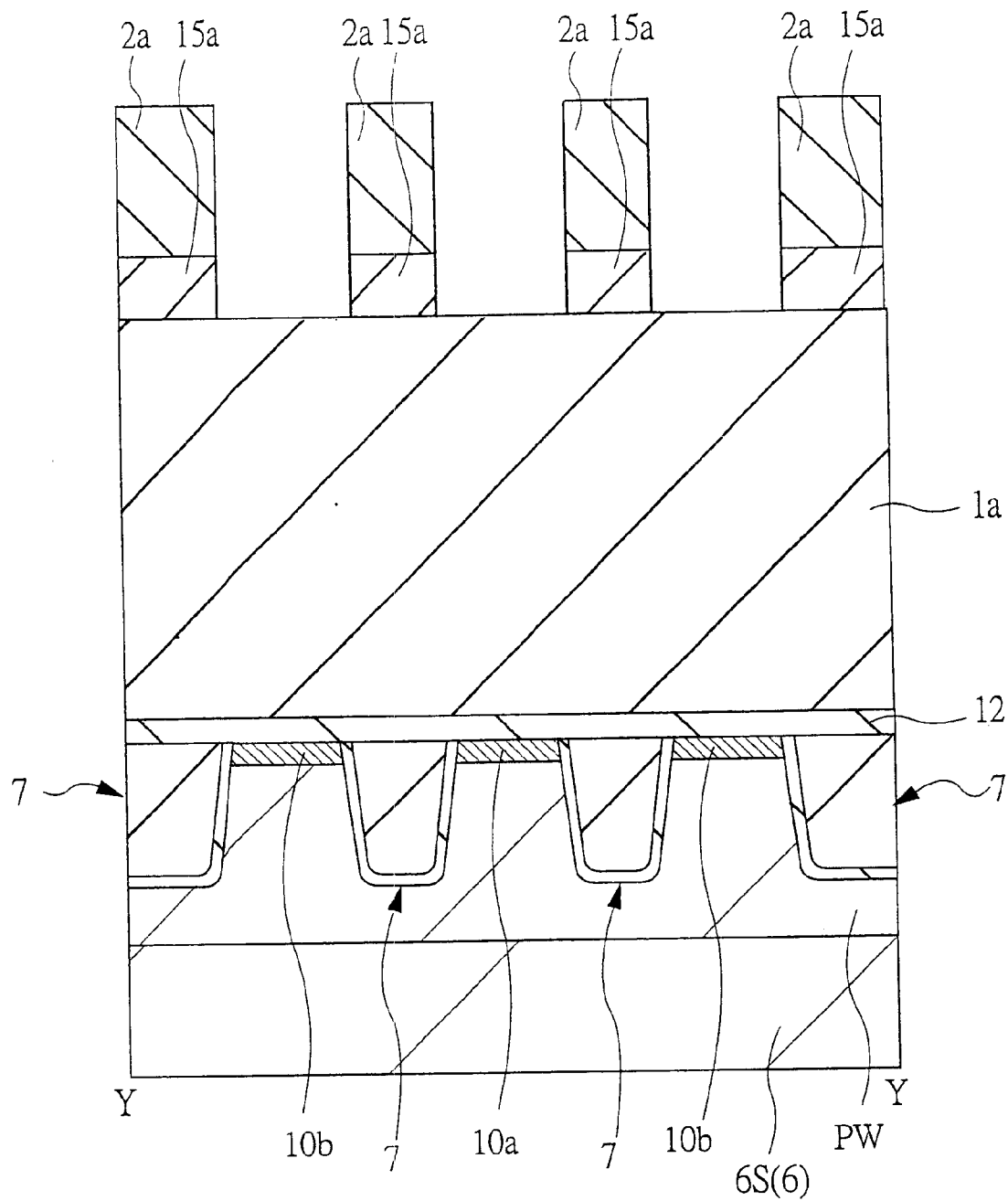
Figure 15:
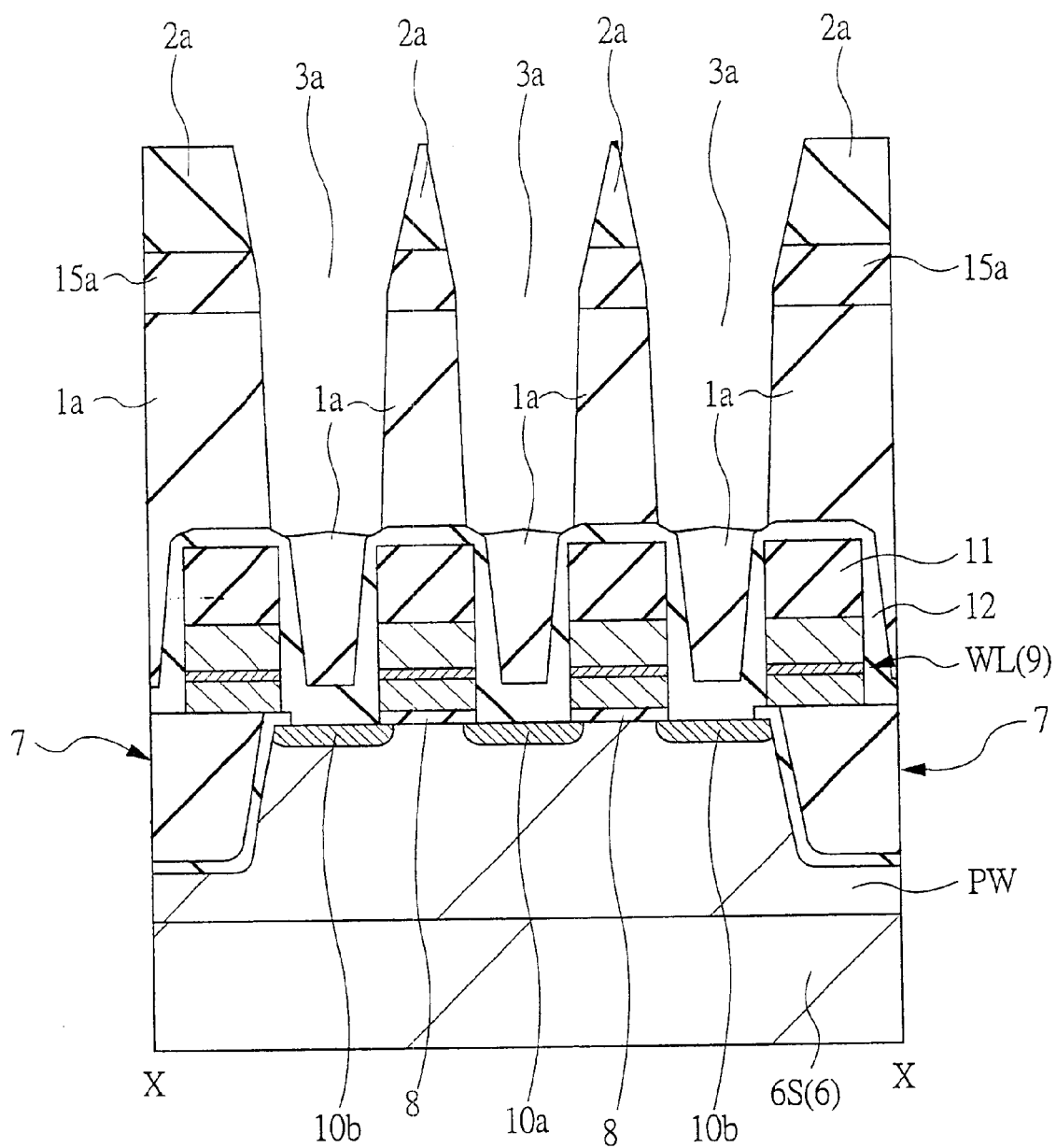
Figure 16:
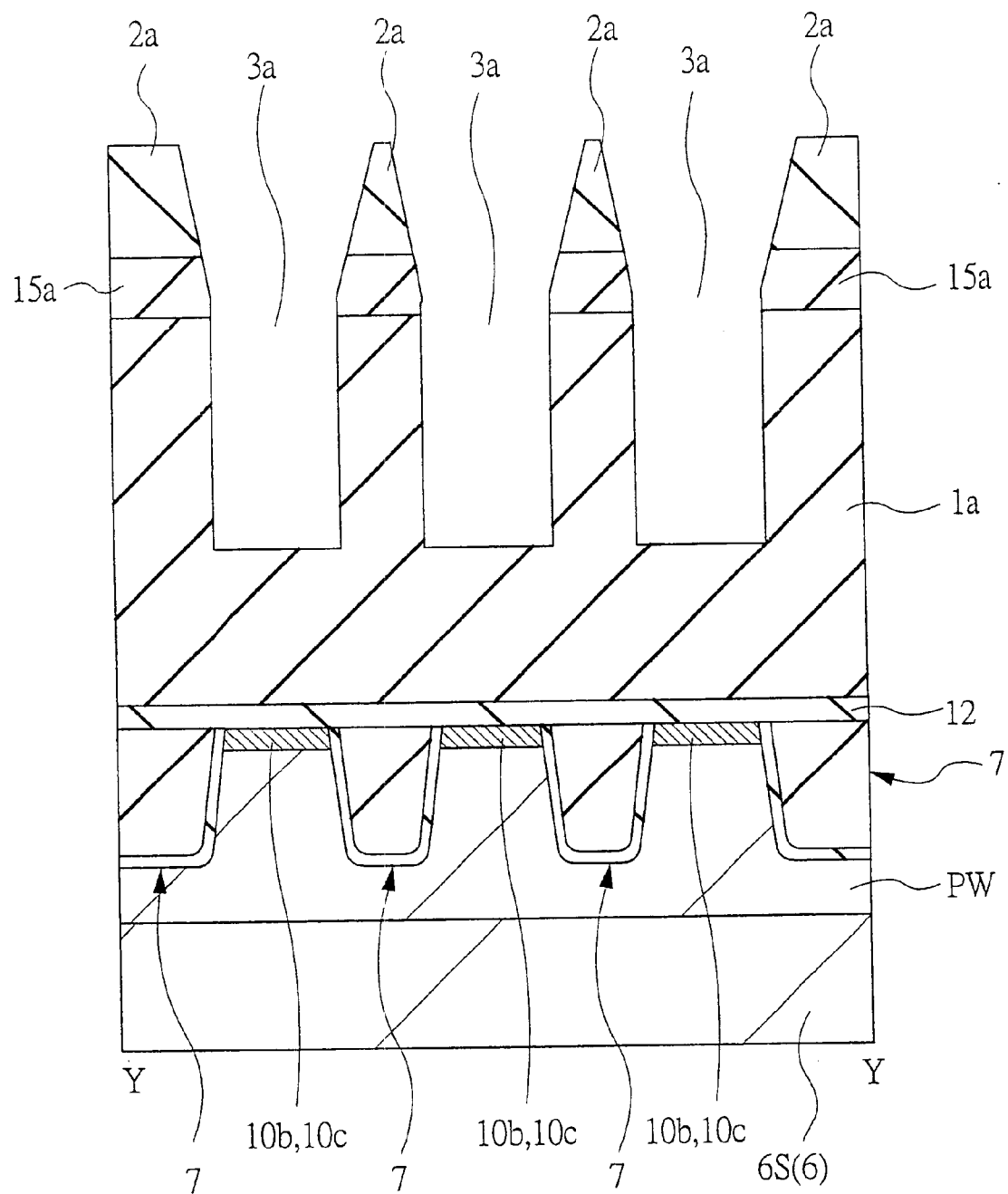
Figure 17A:
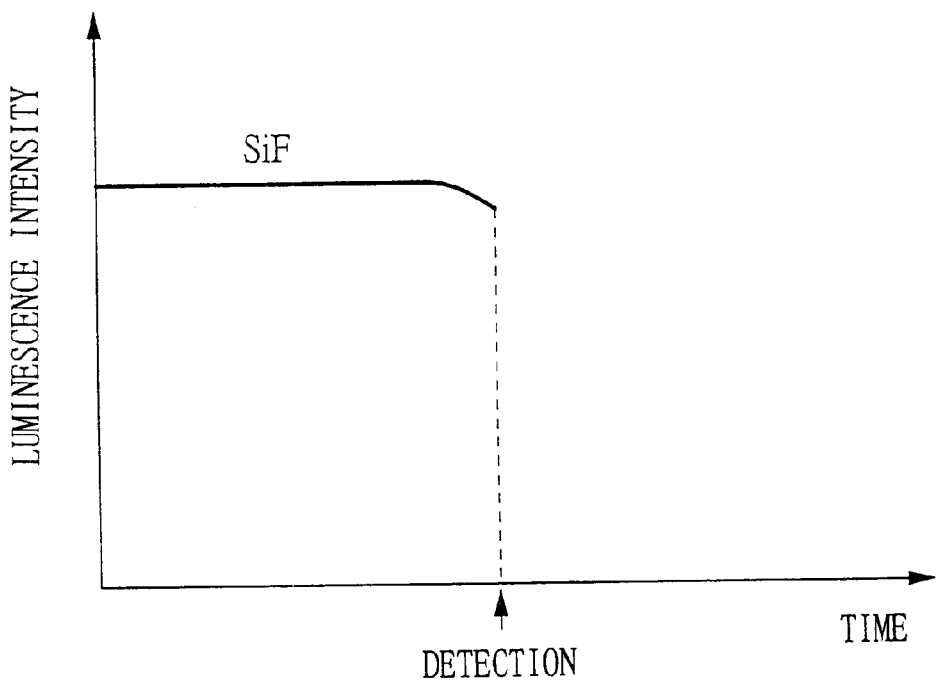
Figure 17B:
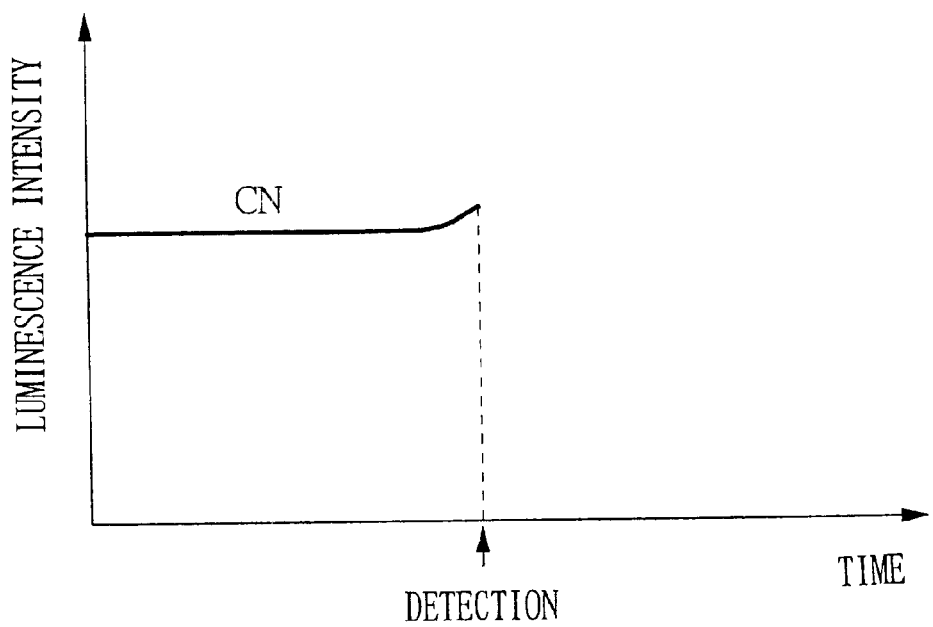
Figure 18:
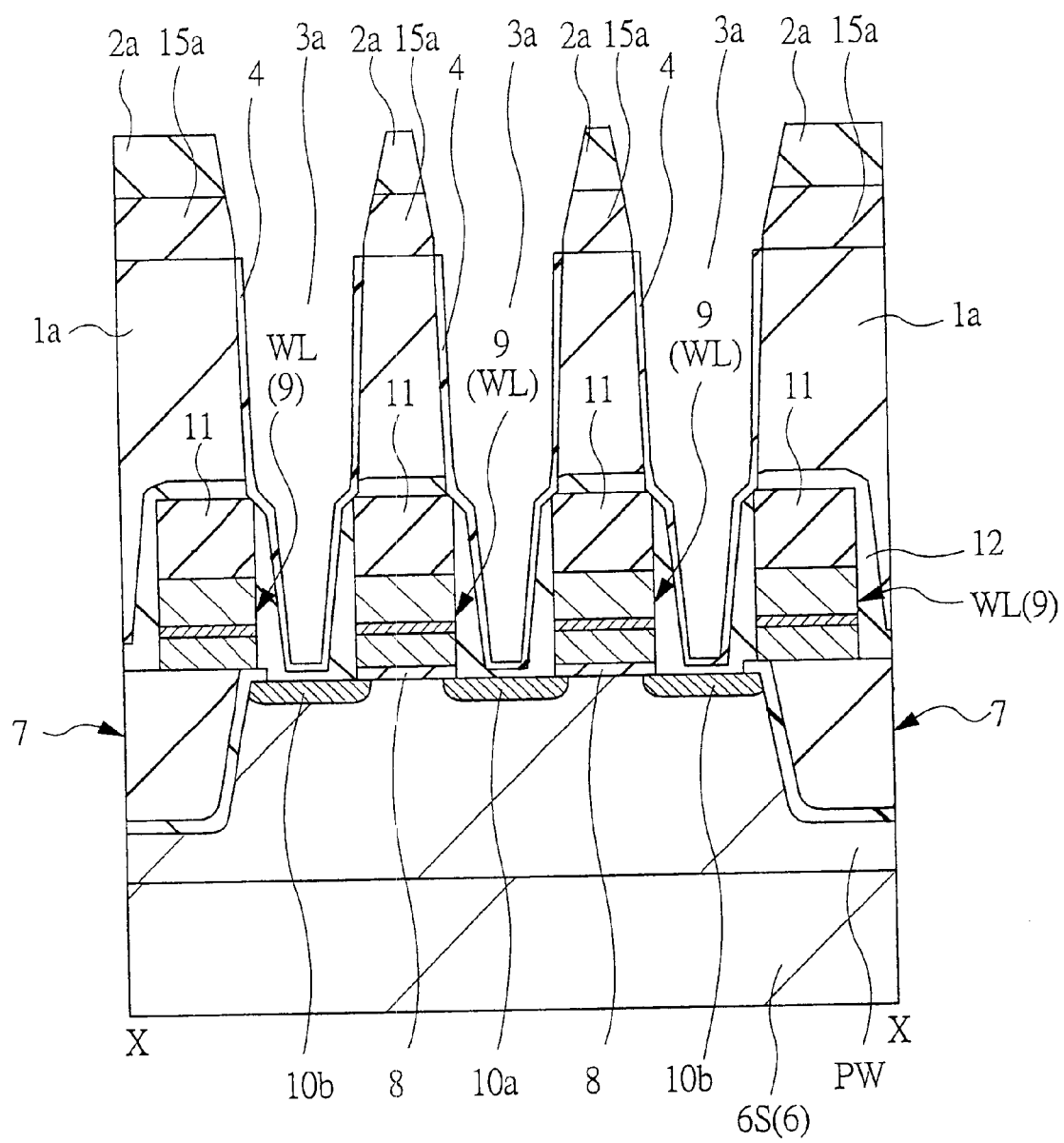
Figure 19:
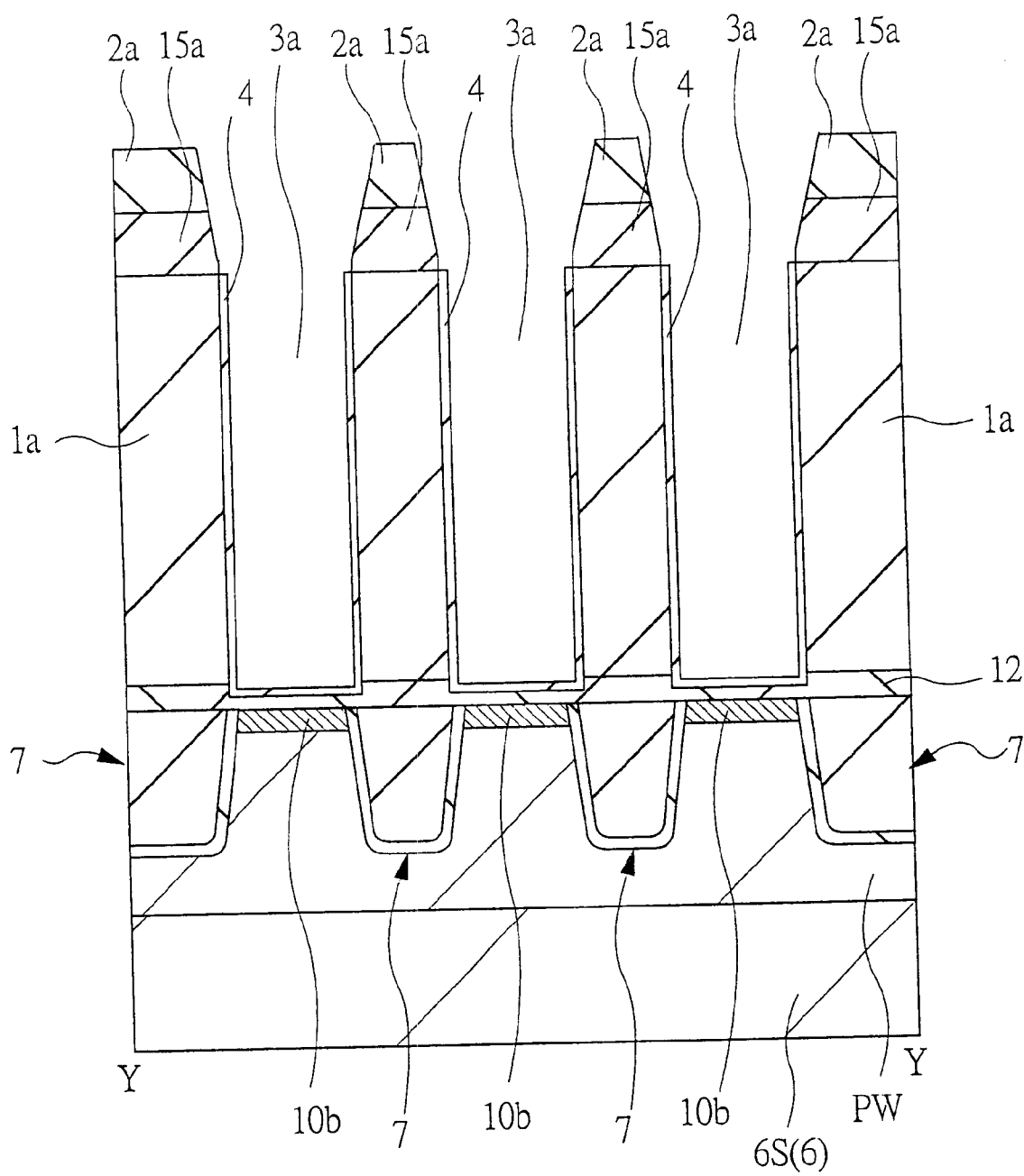
Figure 20A:
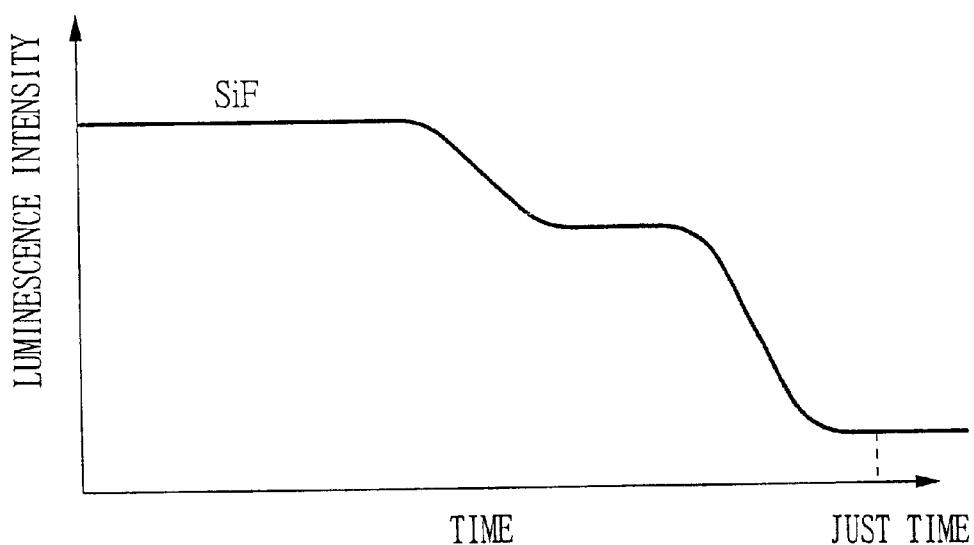
Figure 20B:
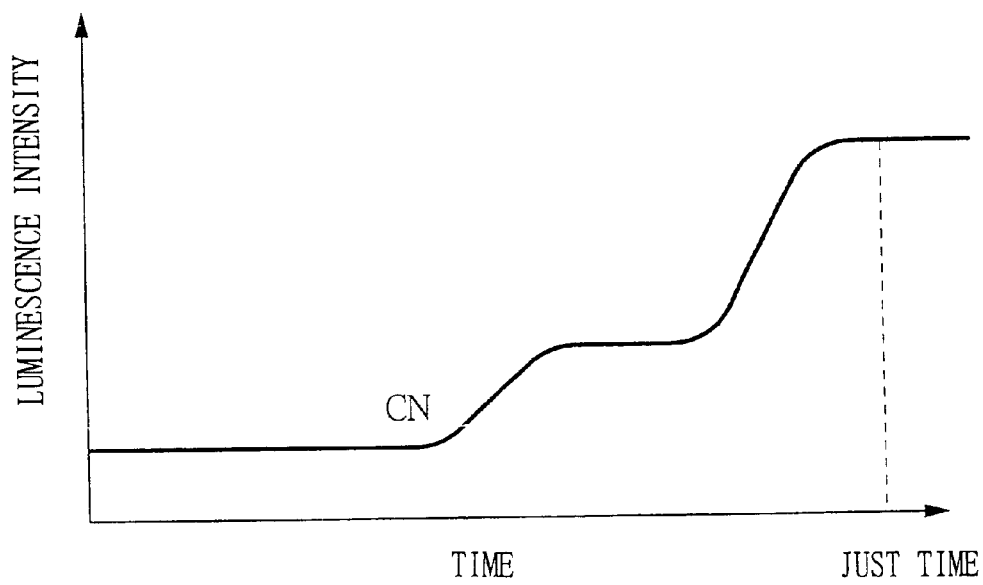
Figure 21:
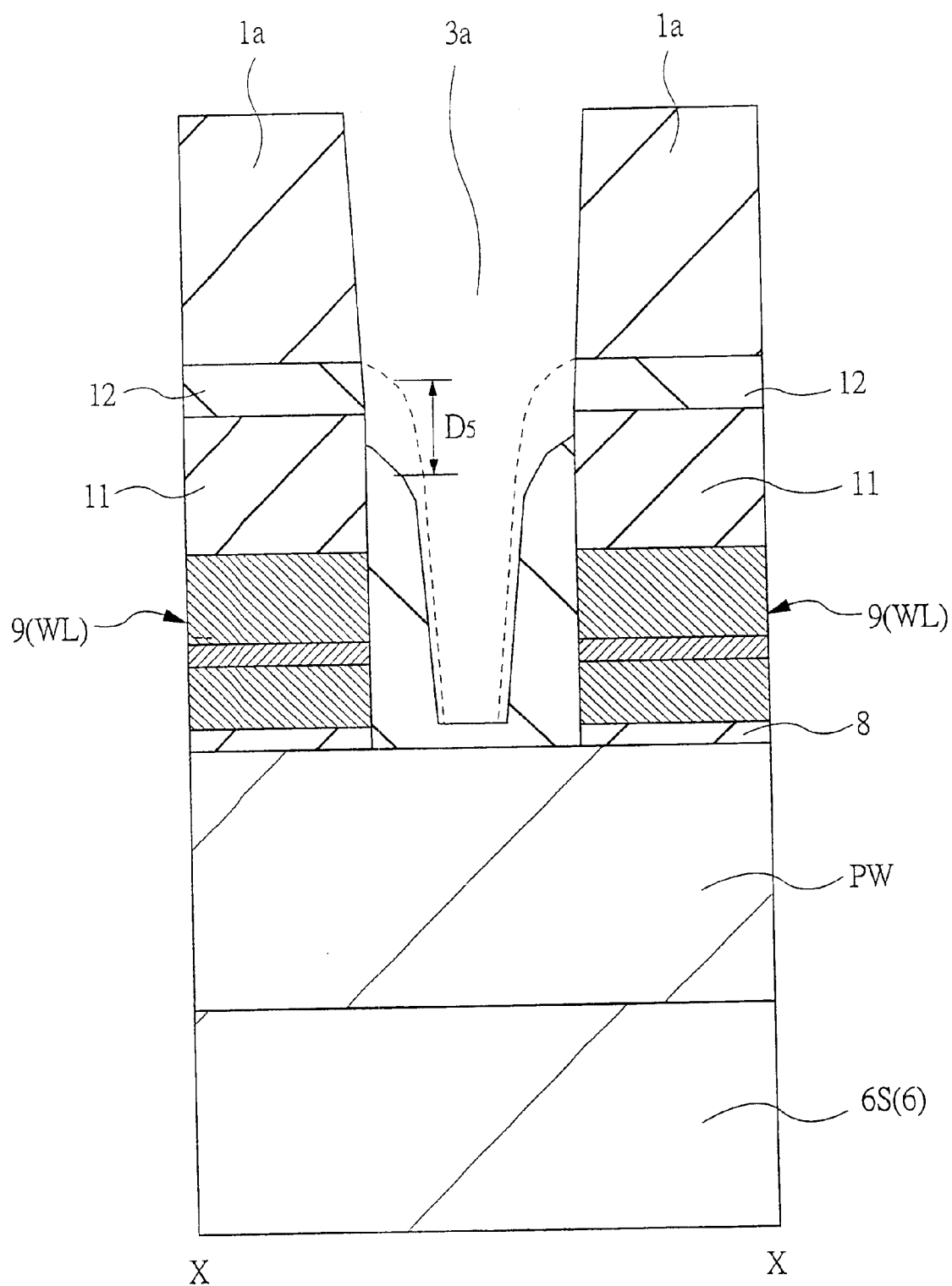
Figure 22:
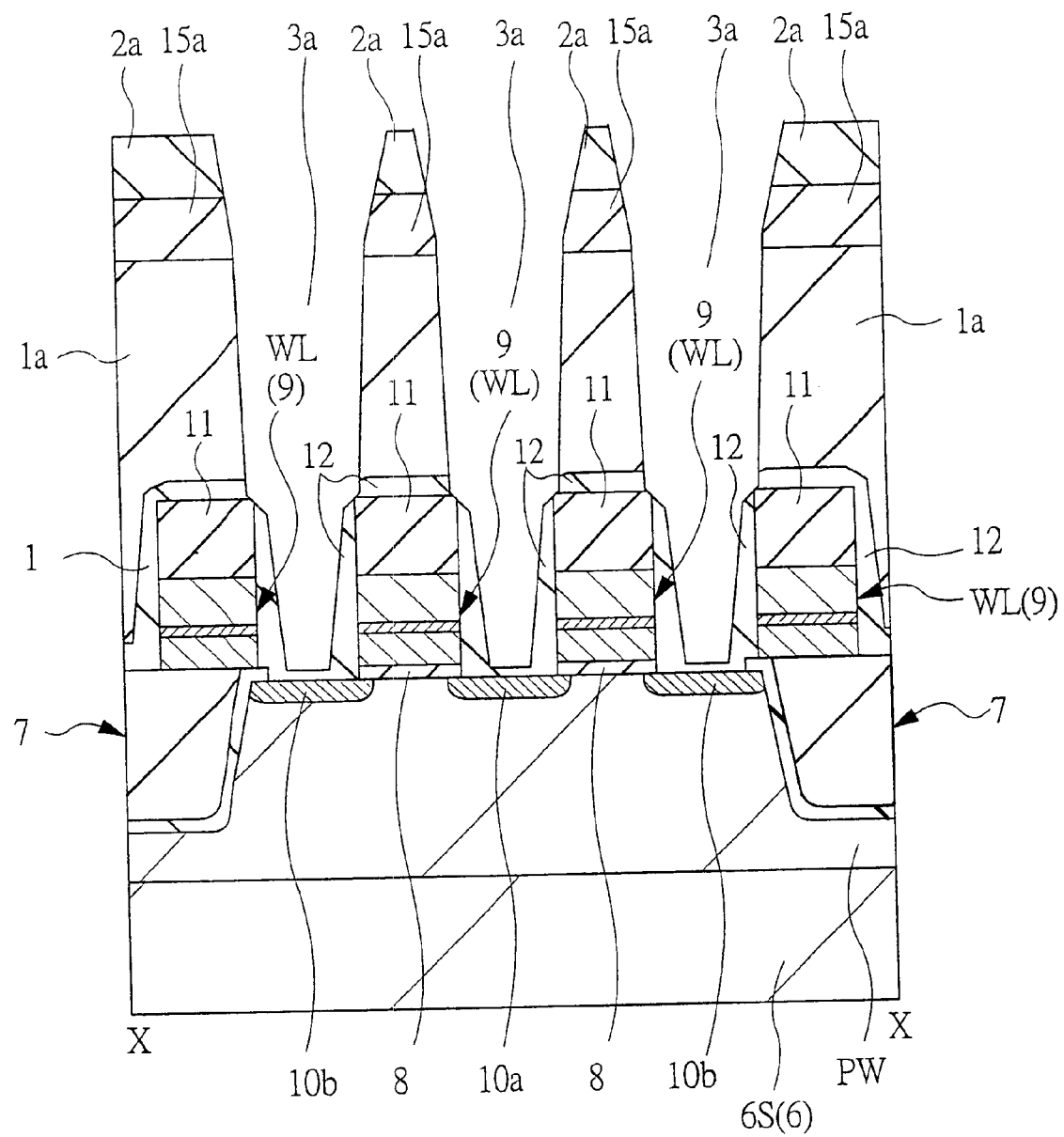
Figure 23:
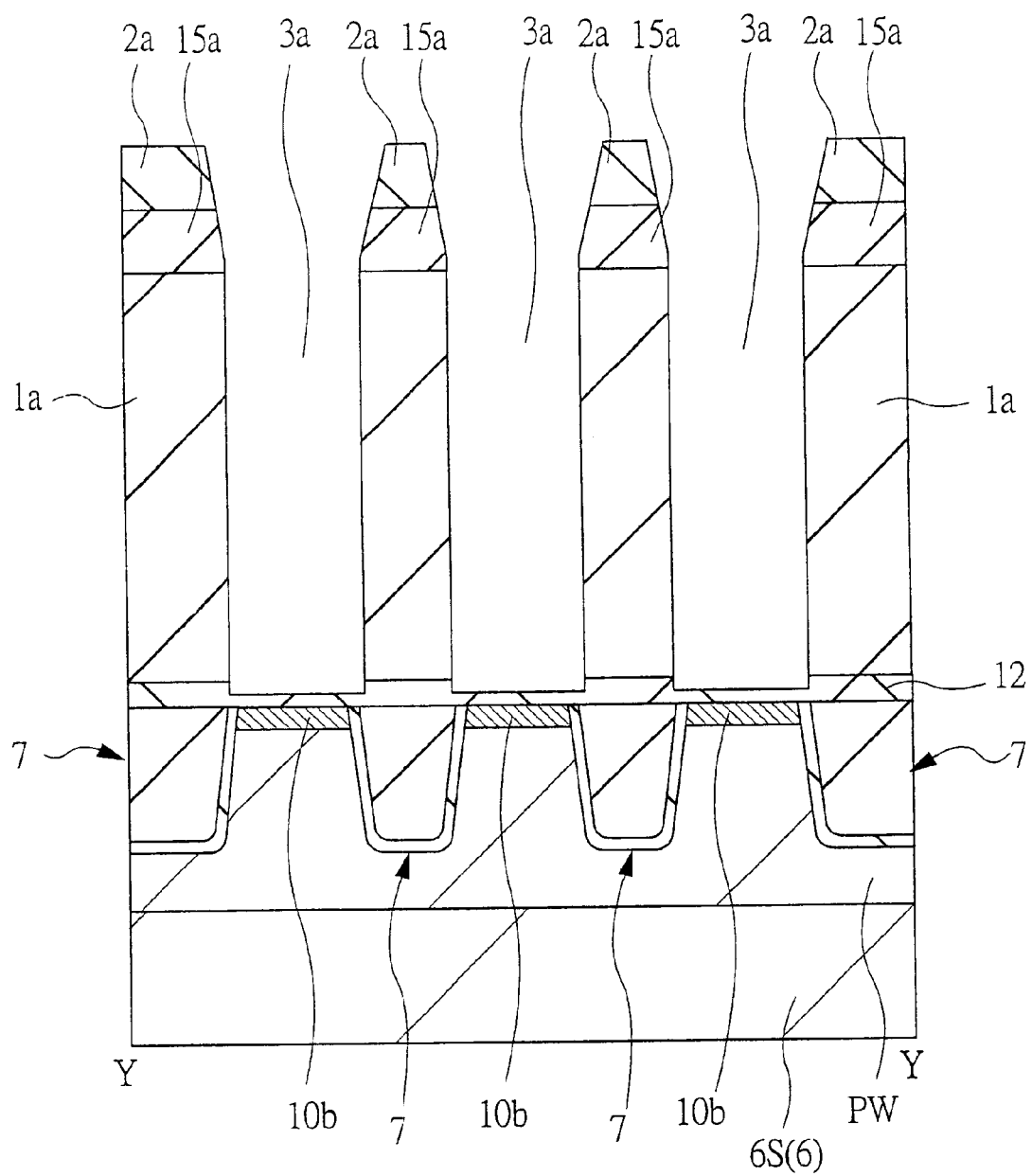
Figure 24:
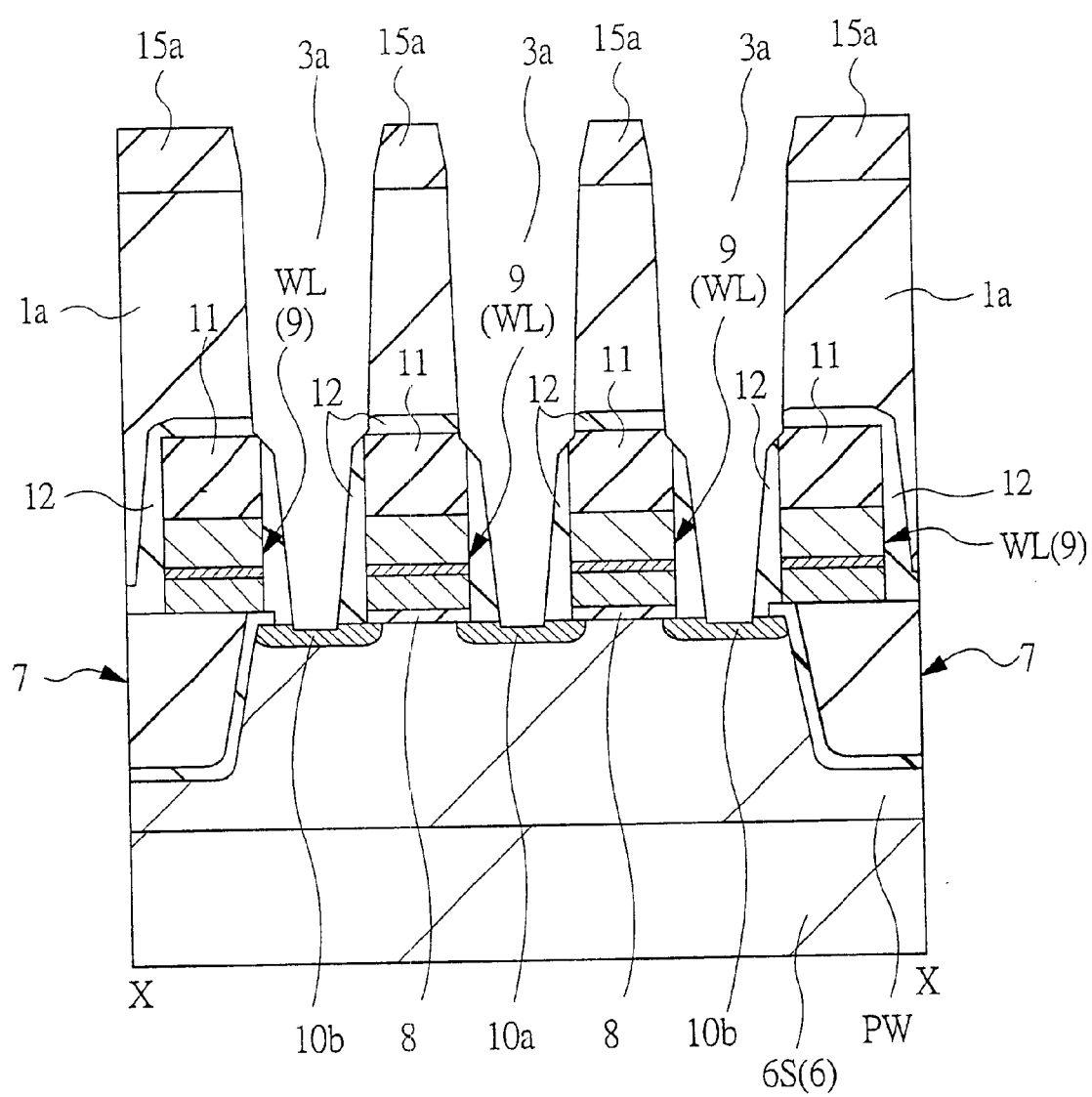
Figure 25:
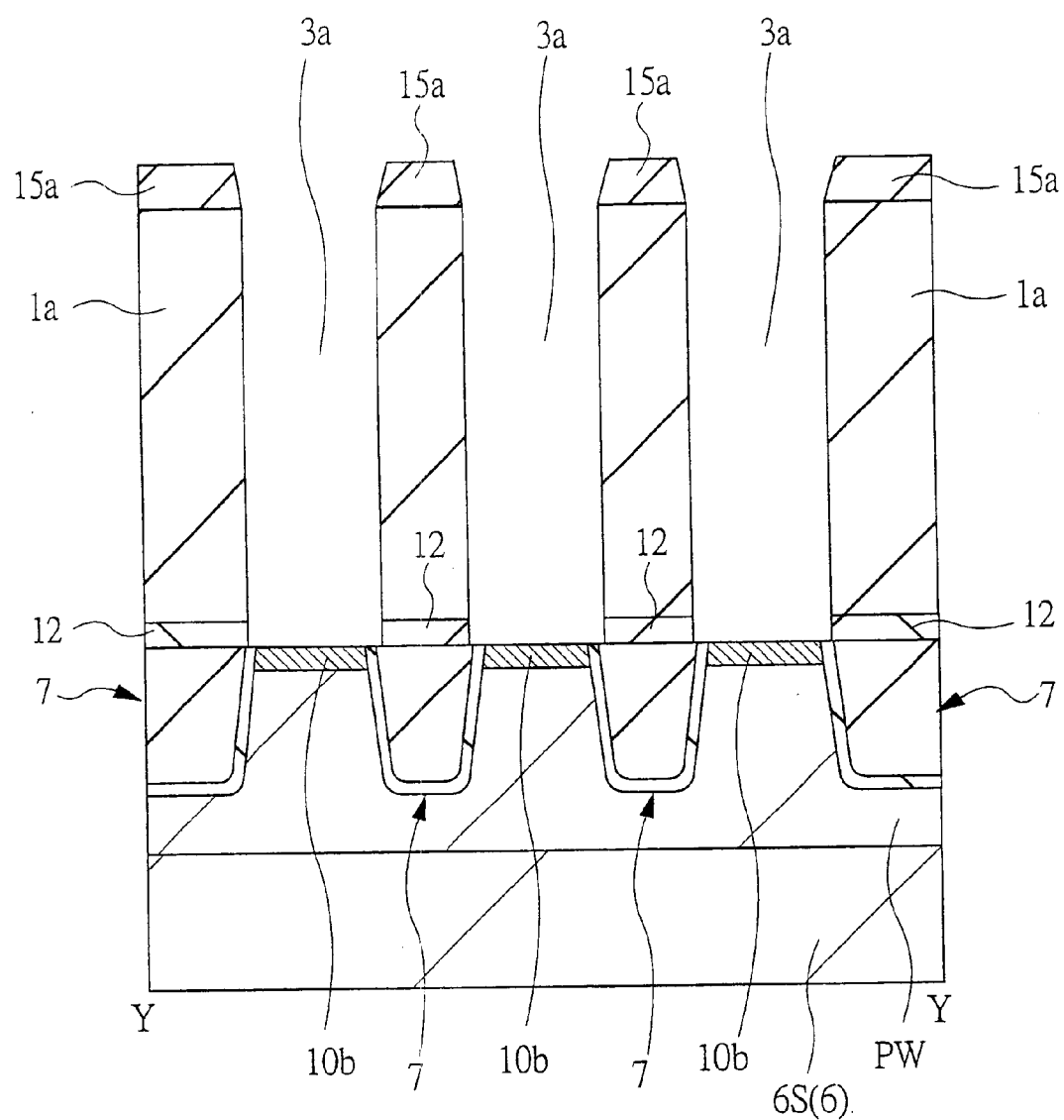
Figure 26:
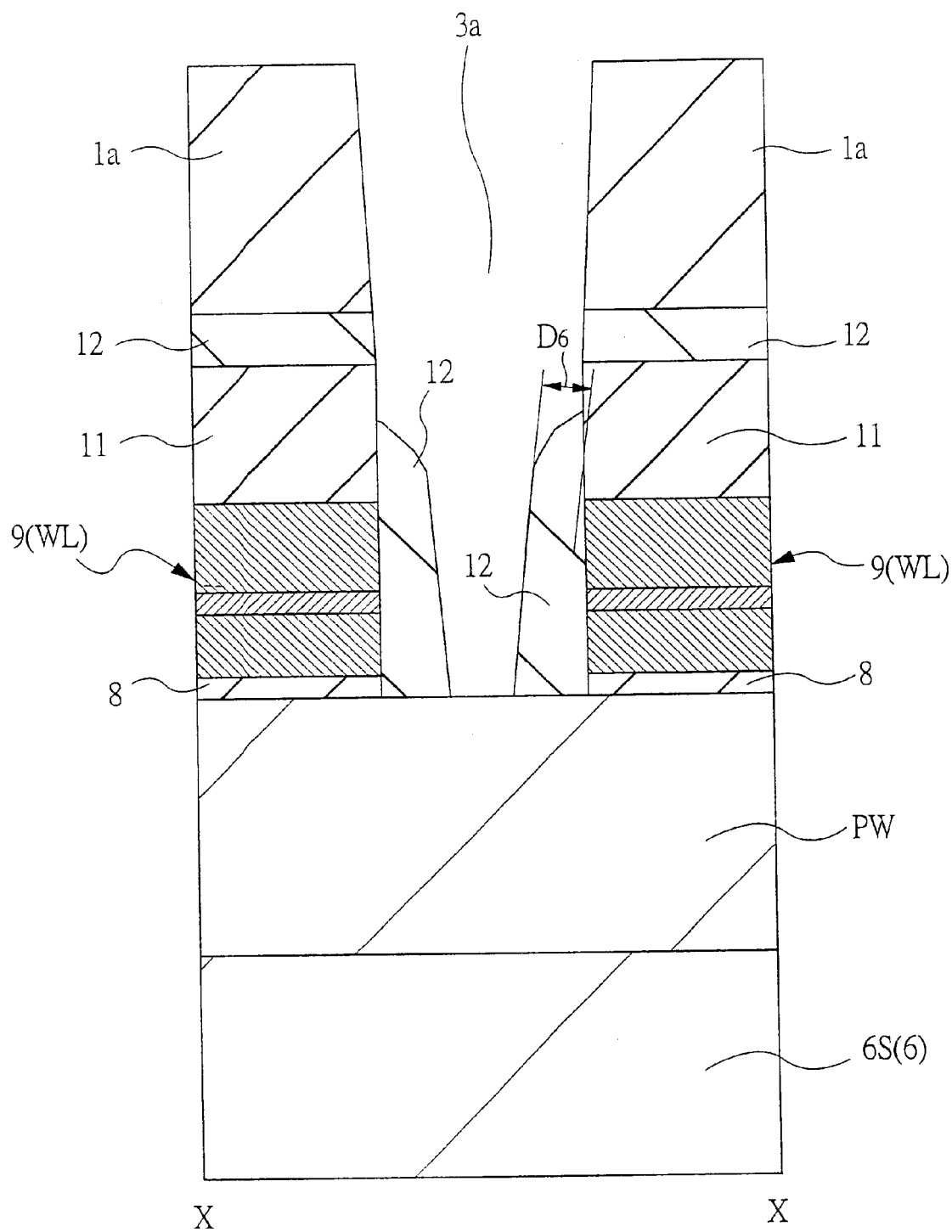
Figure 27:
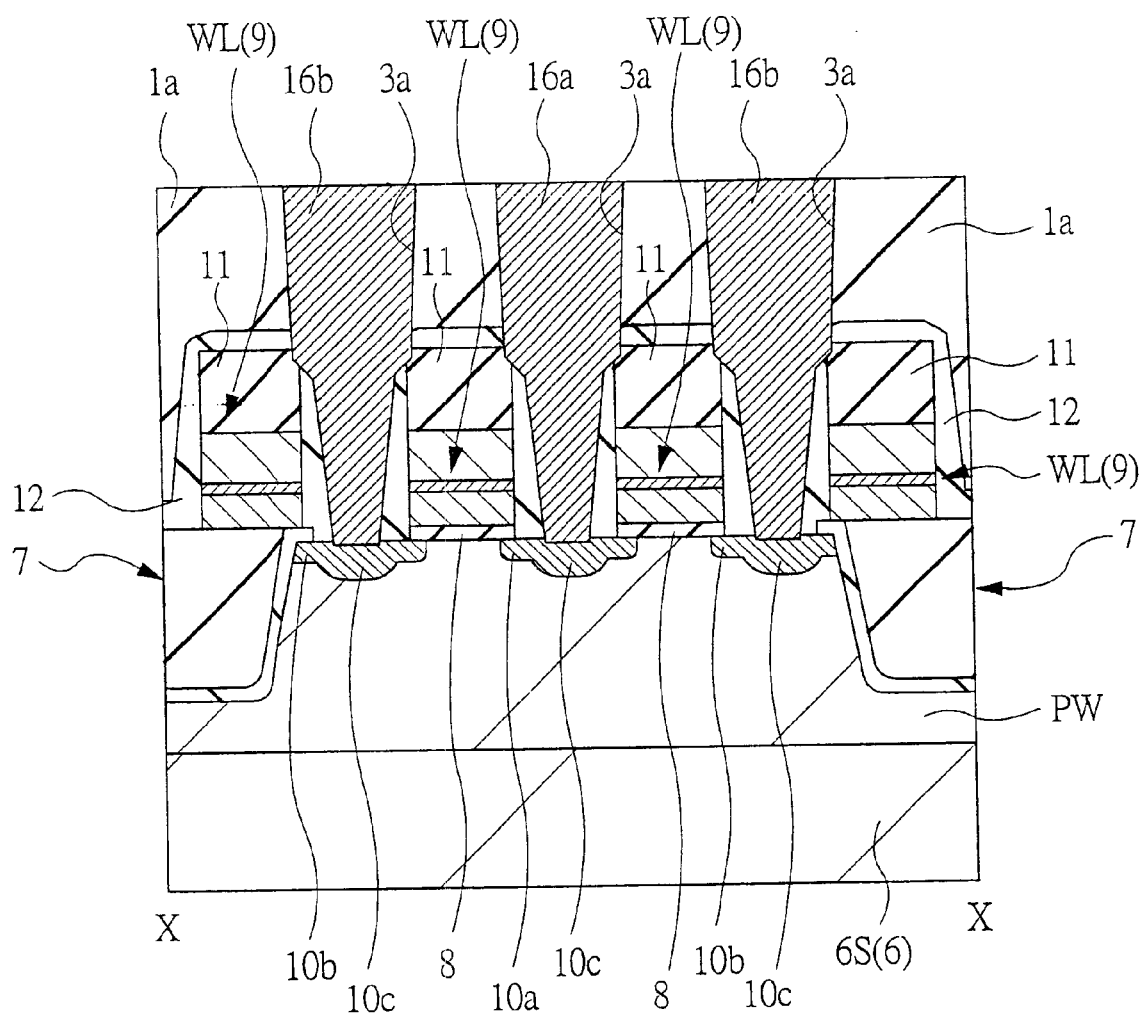
Figure 28:
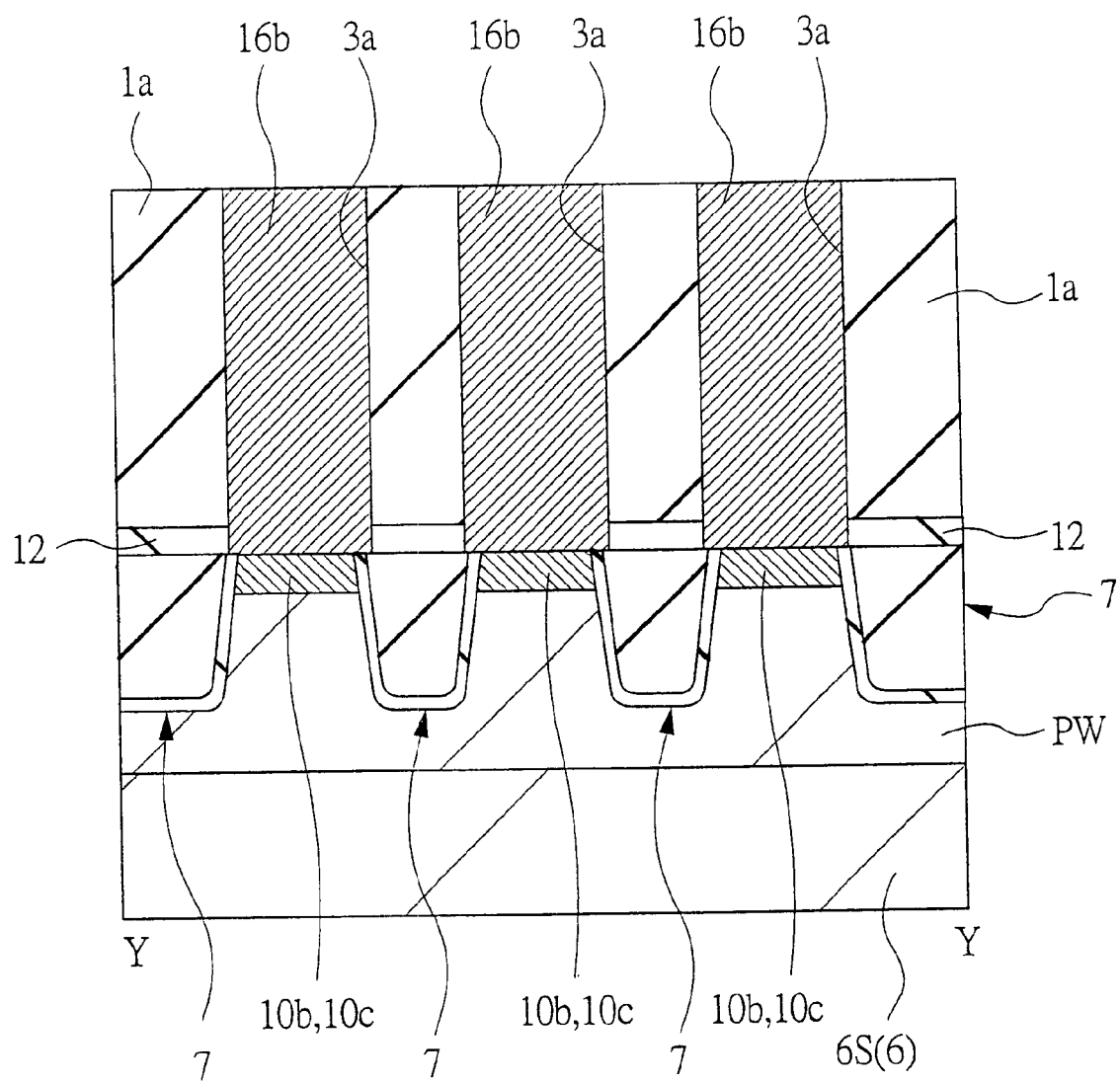
Figure 29:
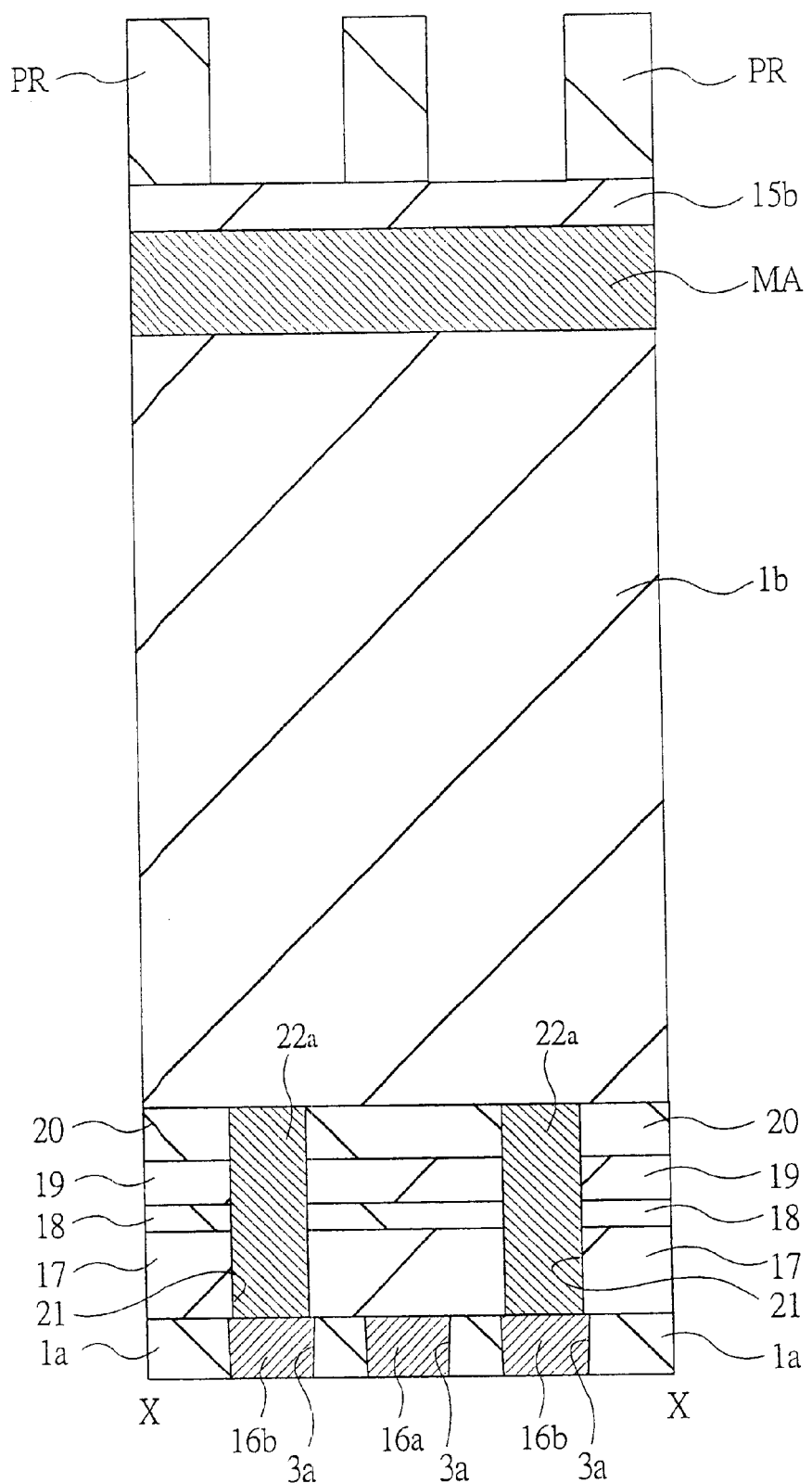
Figure 30:
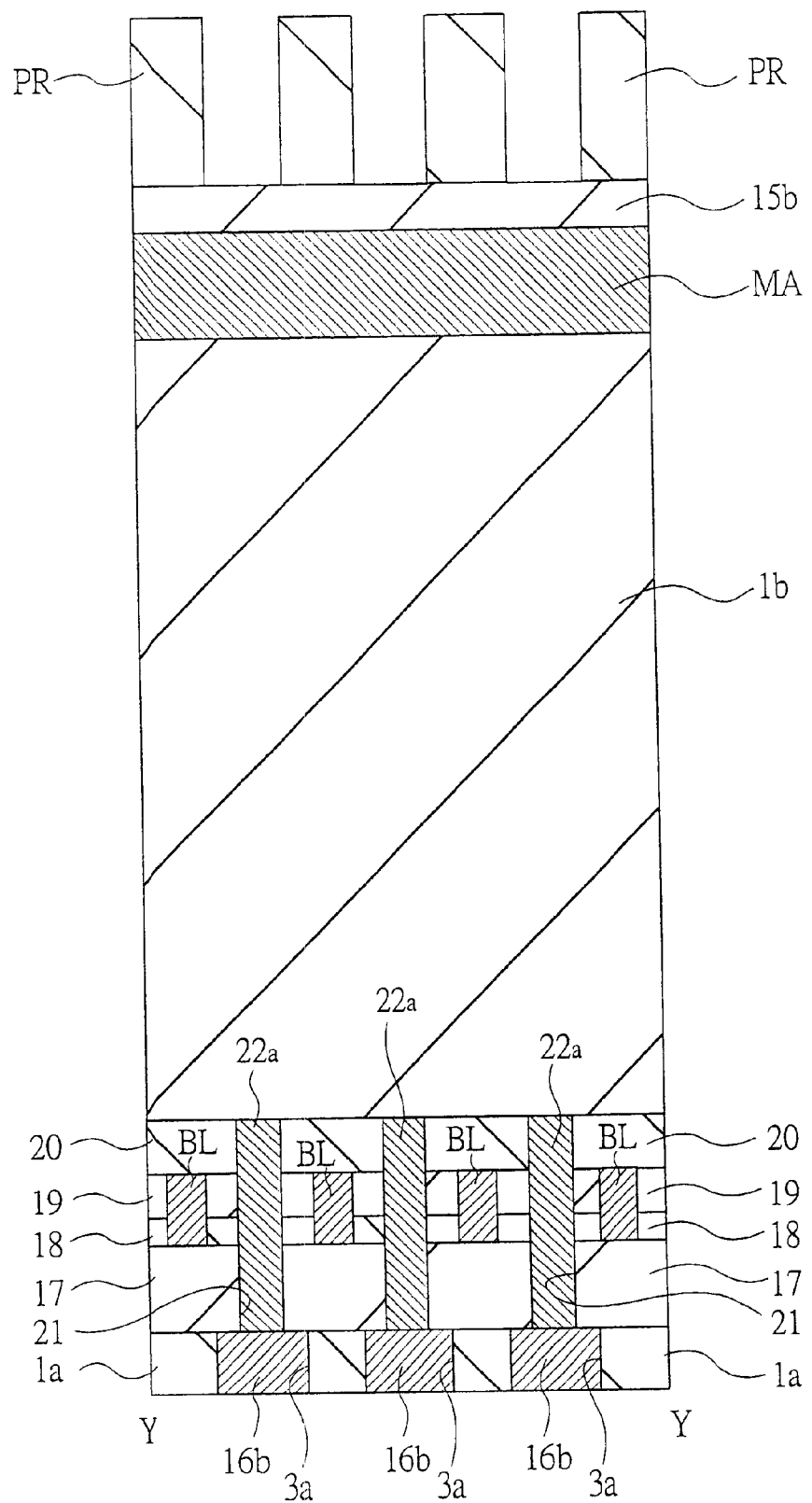
Figure 31:
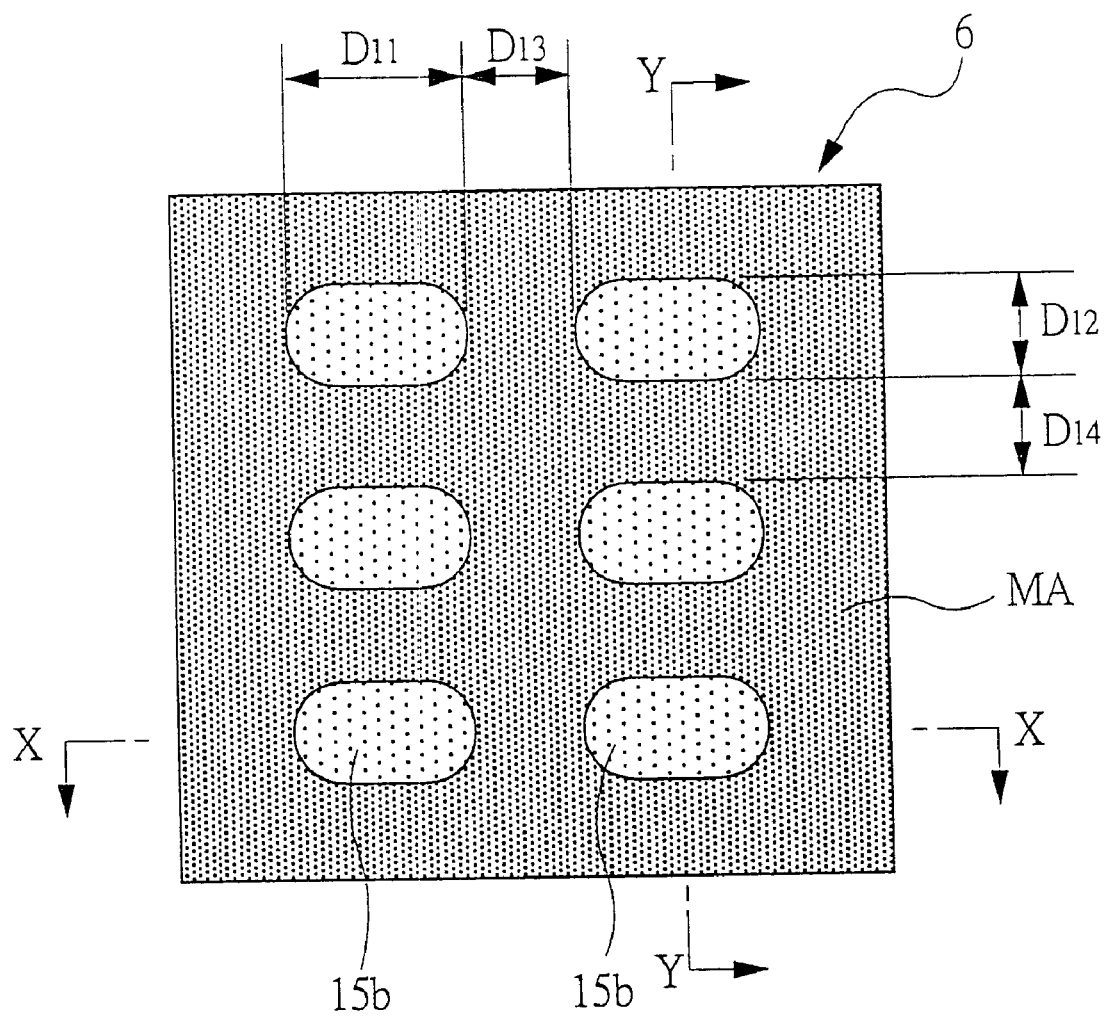
Figure 32:
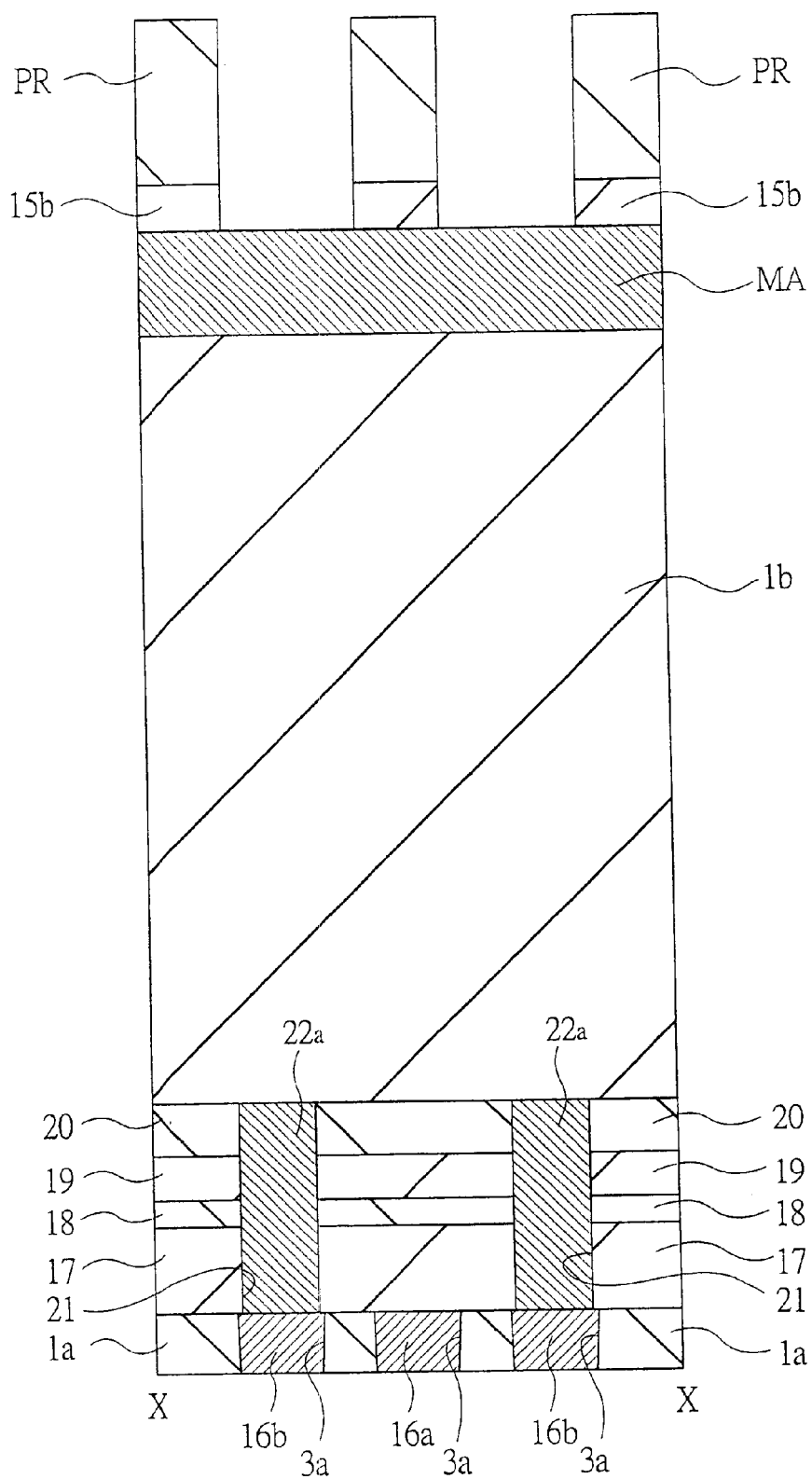
Figure 33:
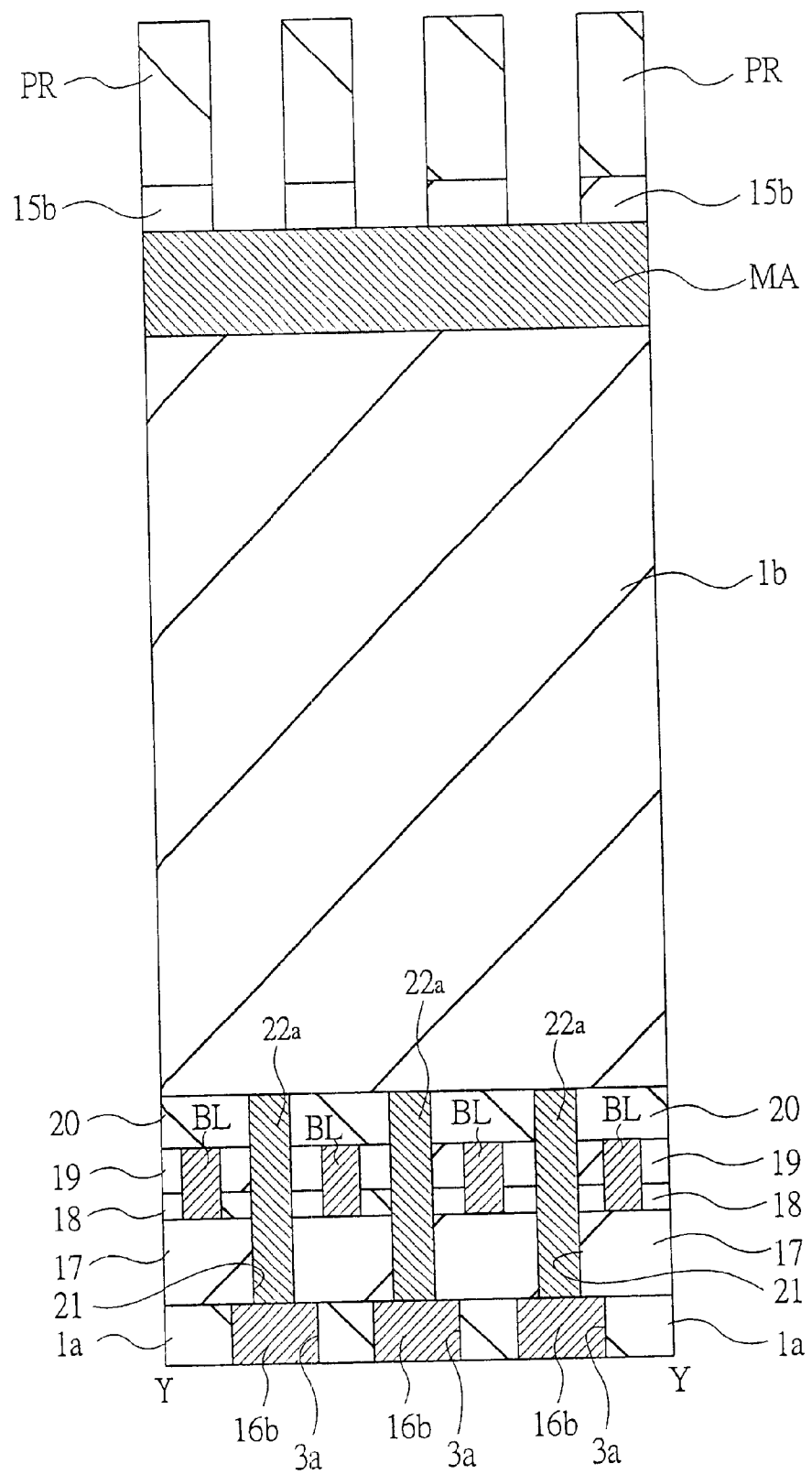
Figure 34:
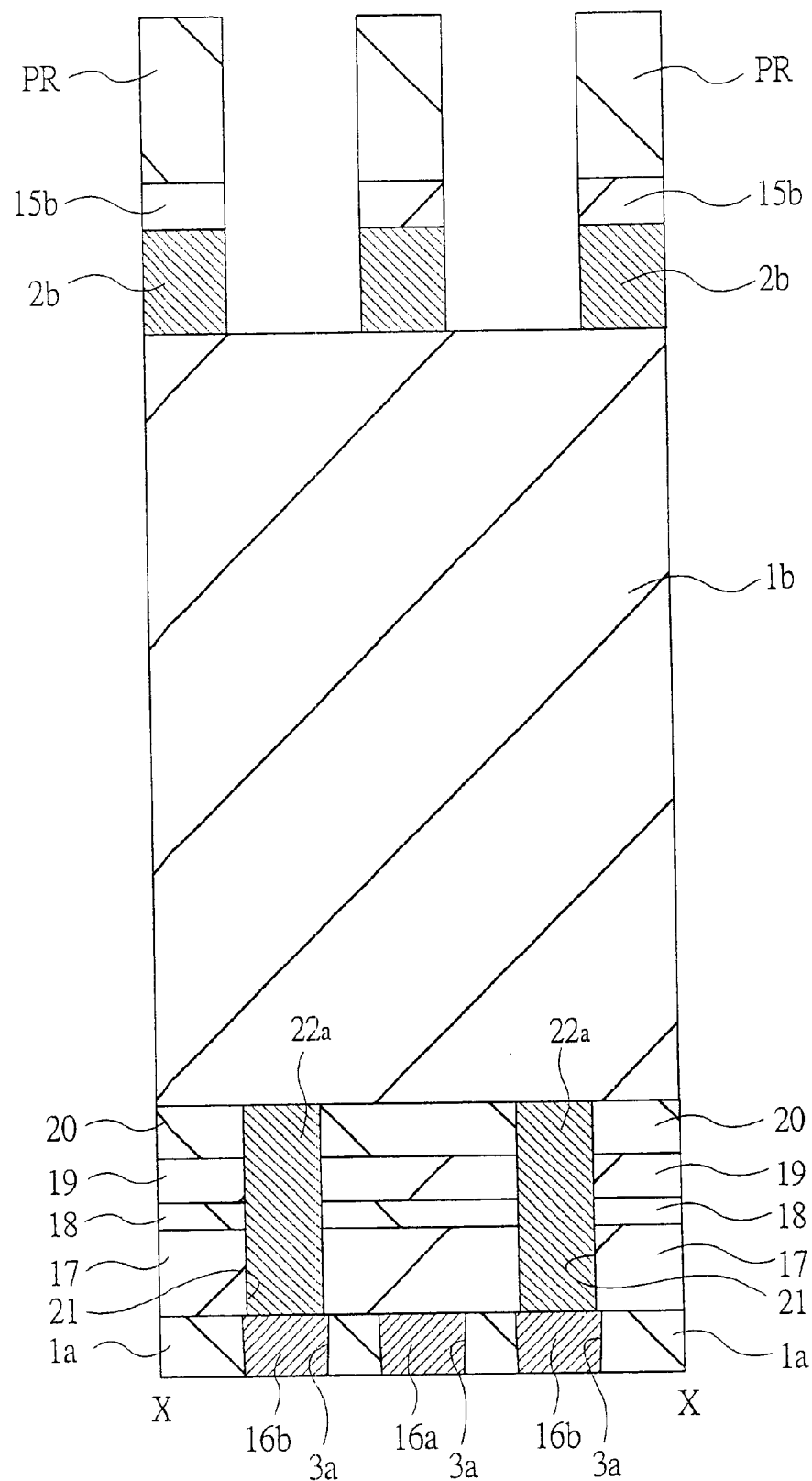
Figure 35:
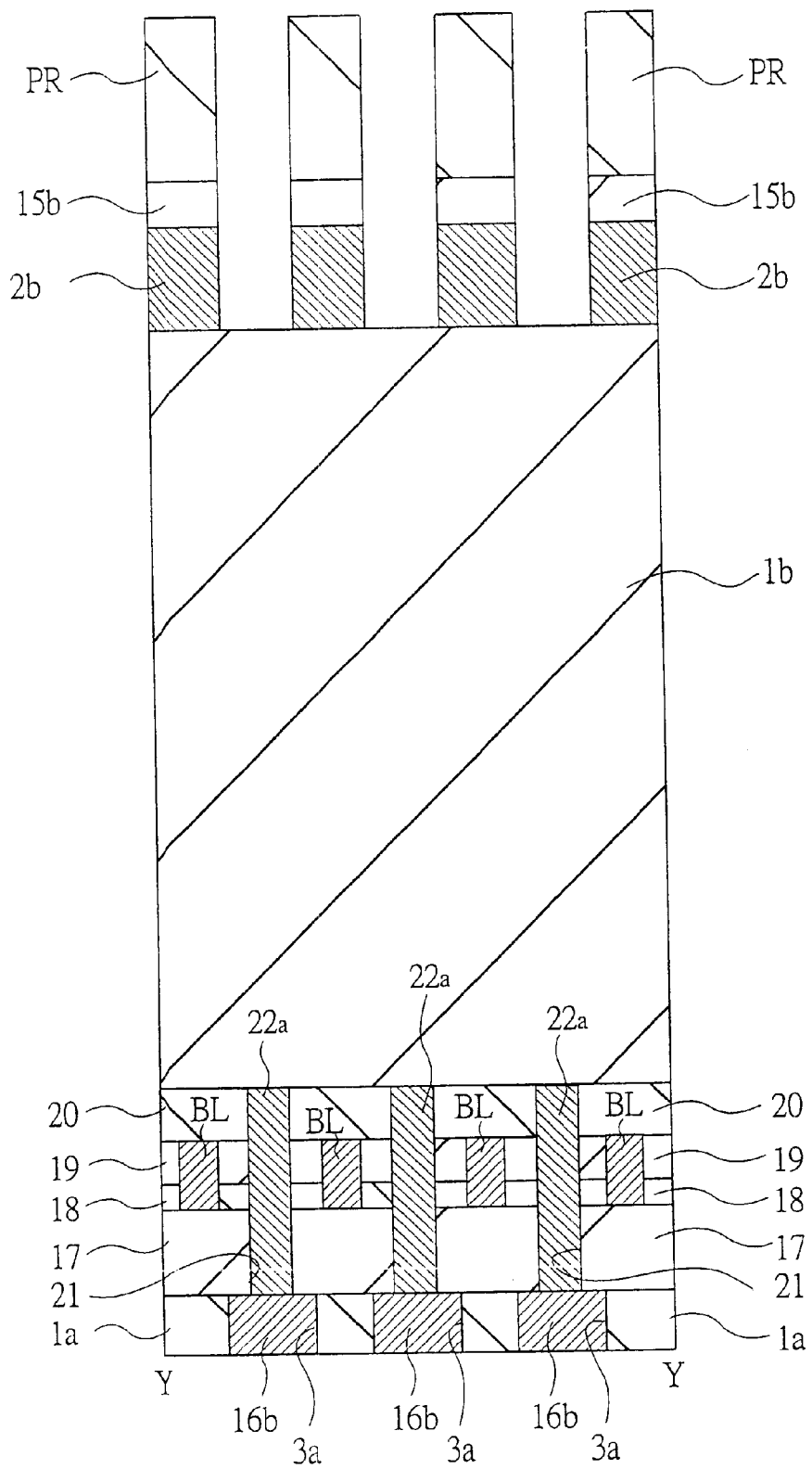
Figure 36:
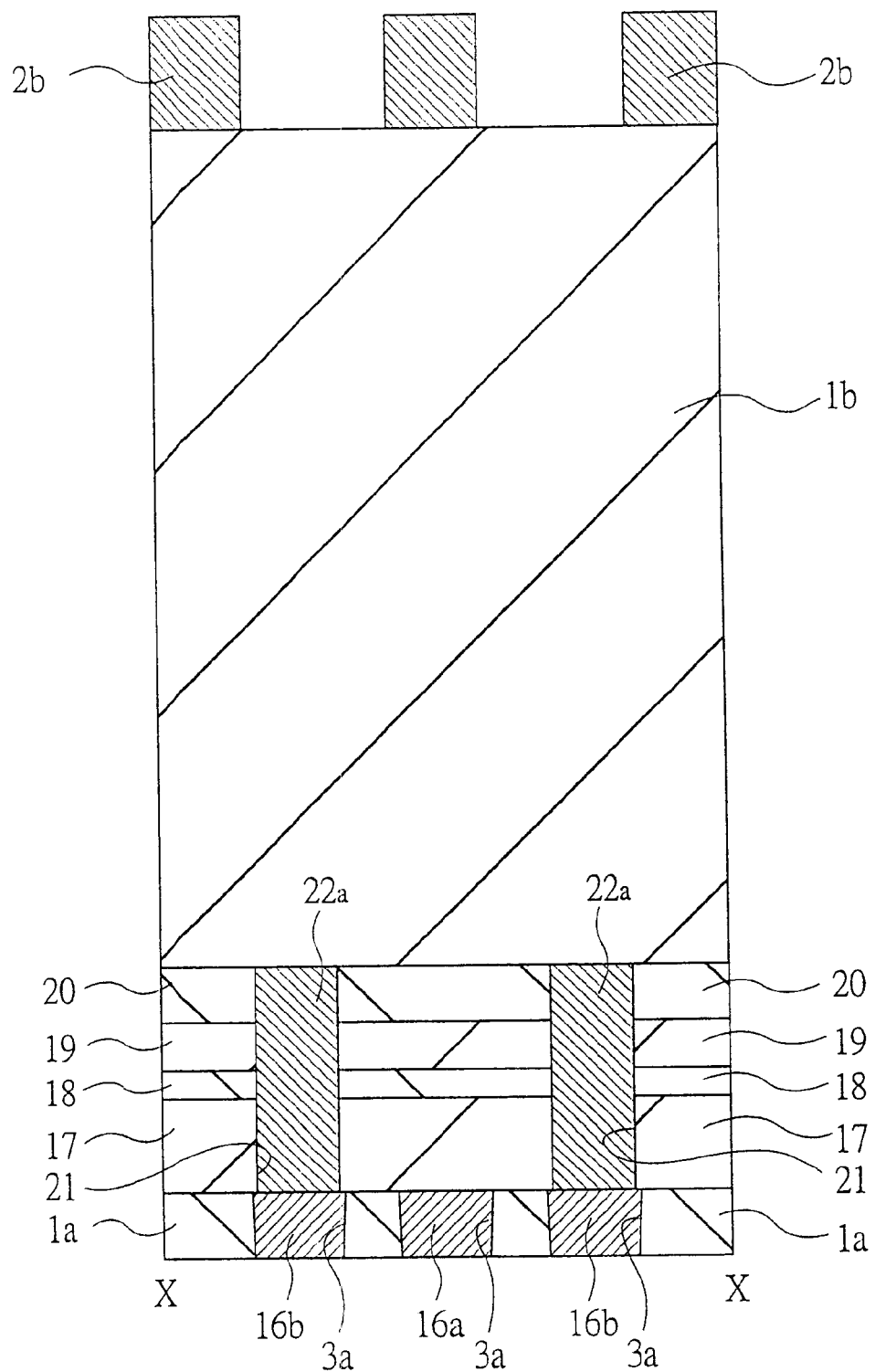
Figure 37:
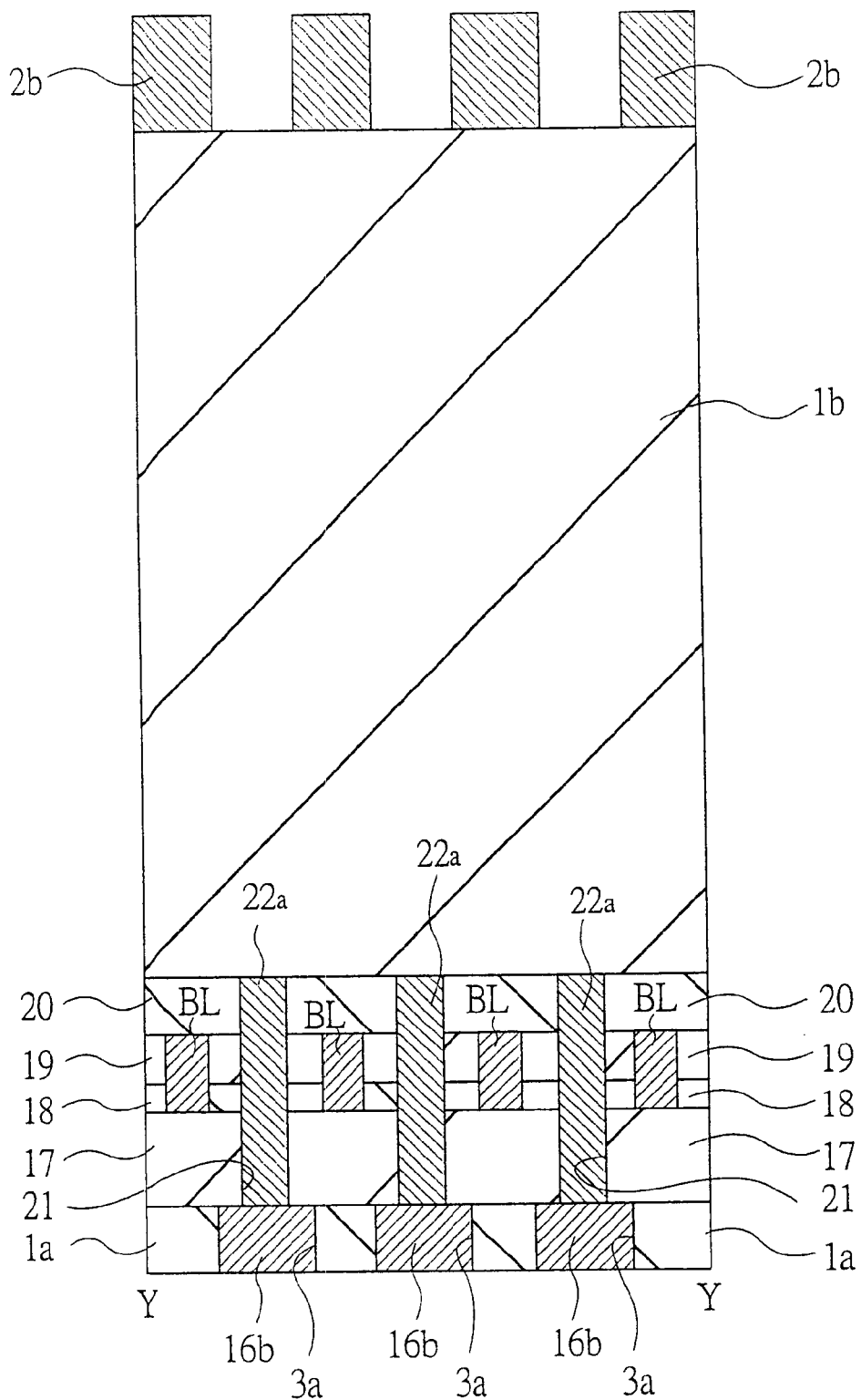
Figure 38:
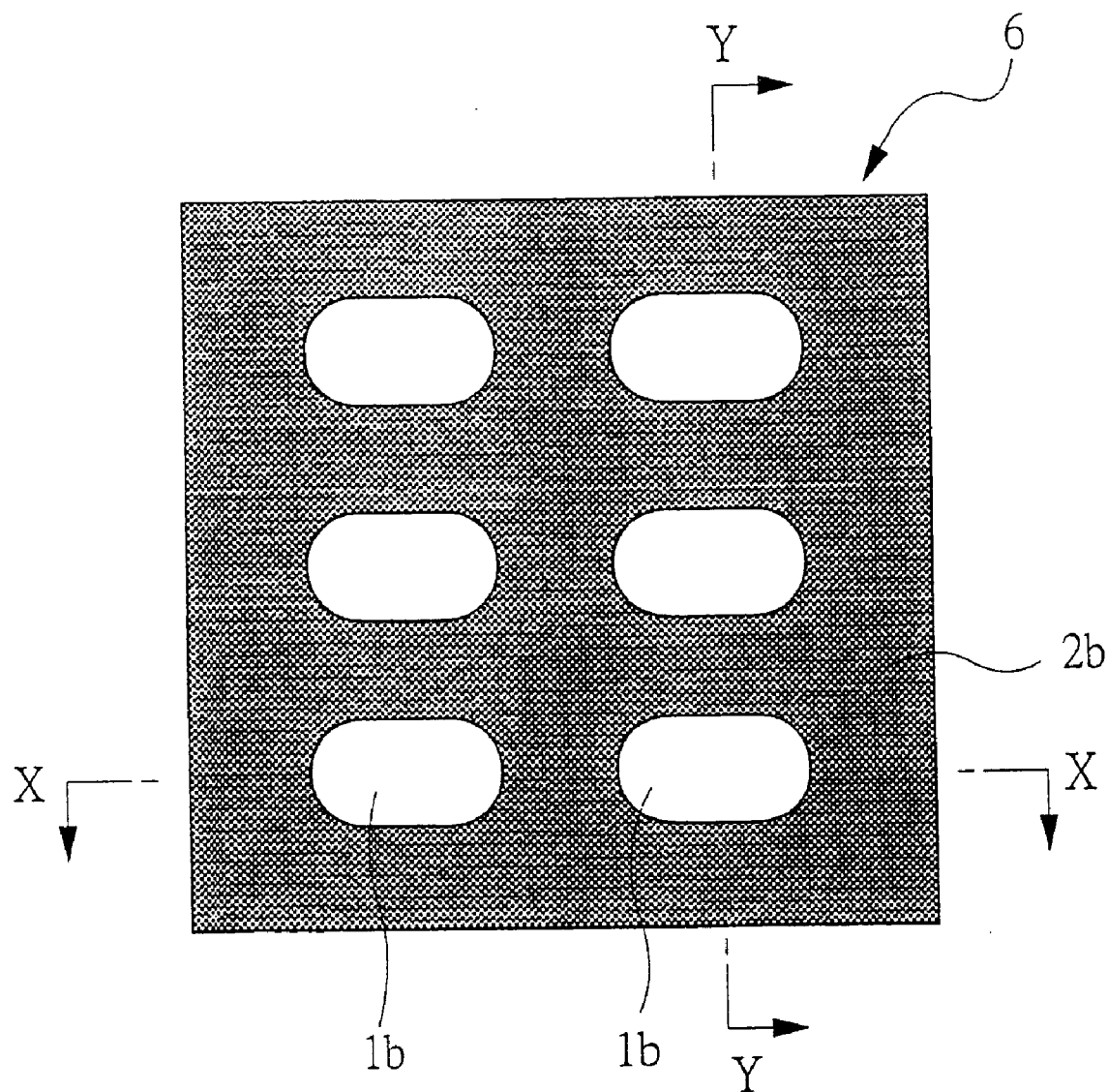
Figure 39:
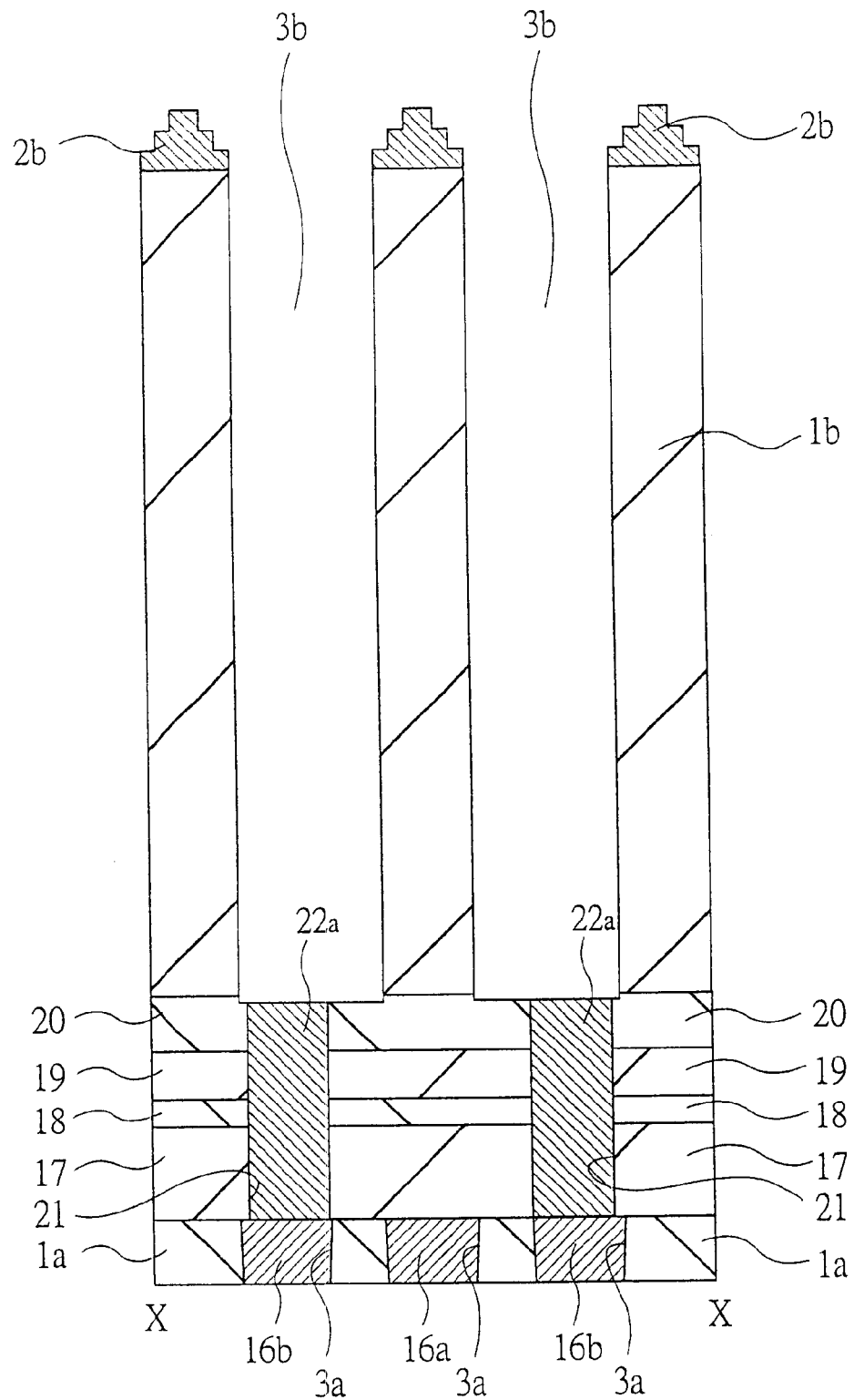
Figure 40:
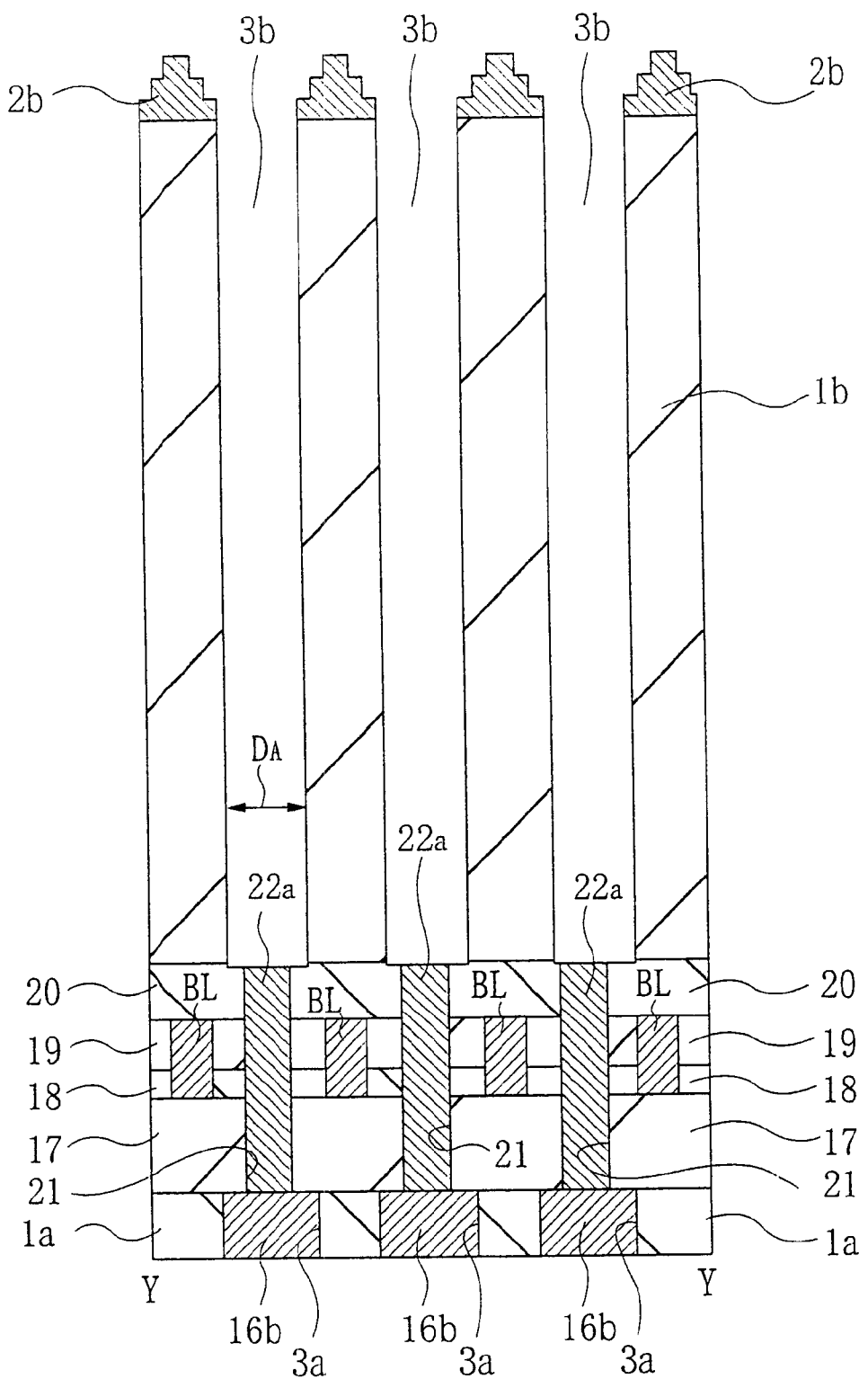
Figure 41:
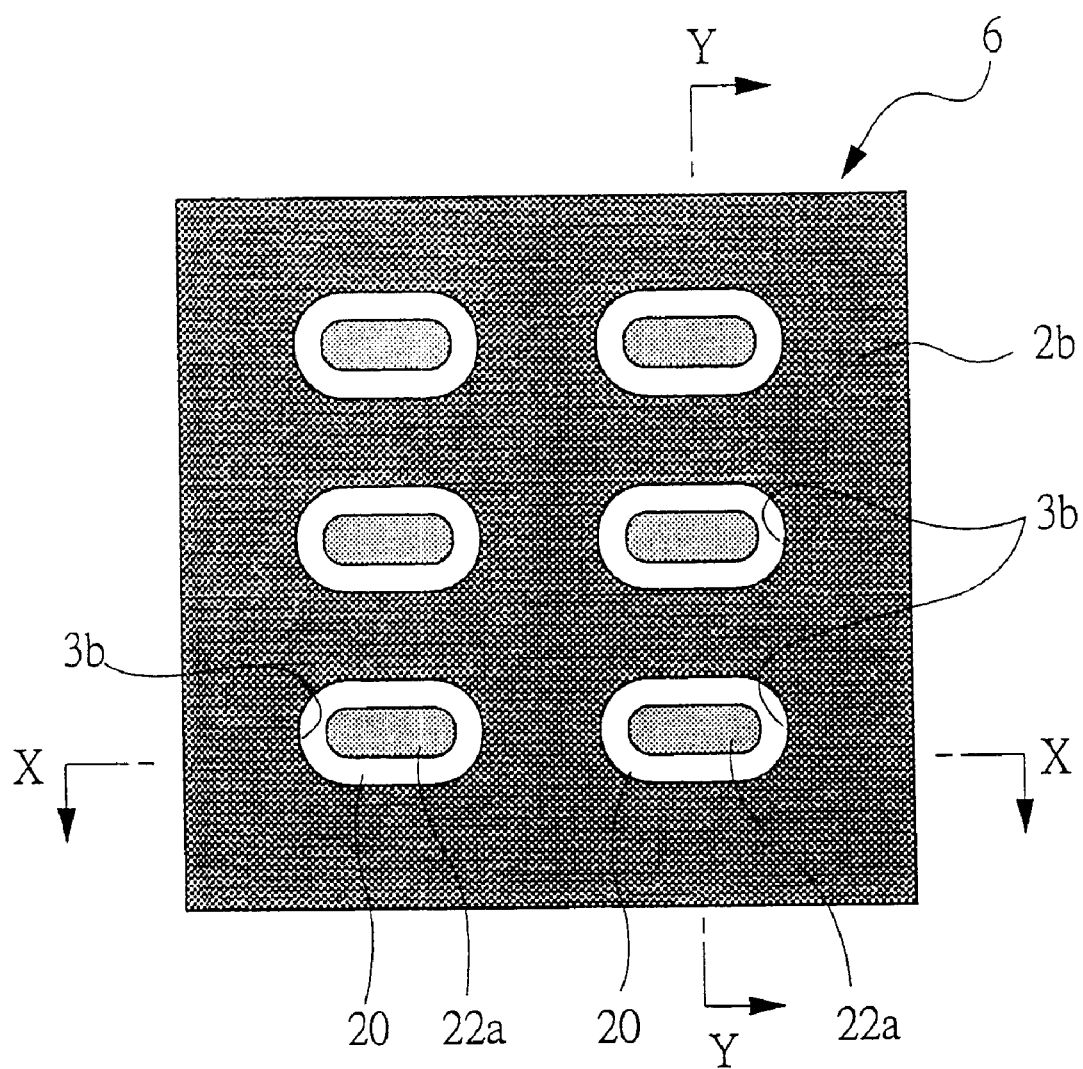
Figure 42:
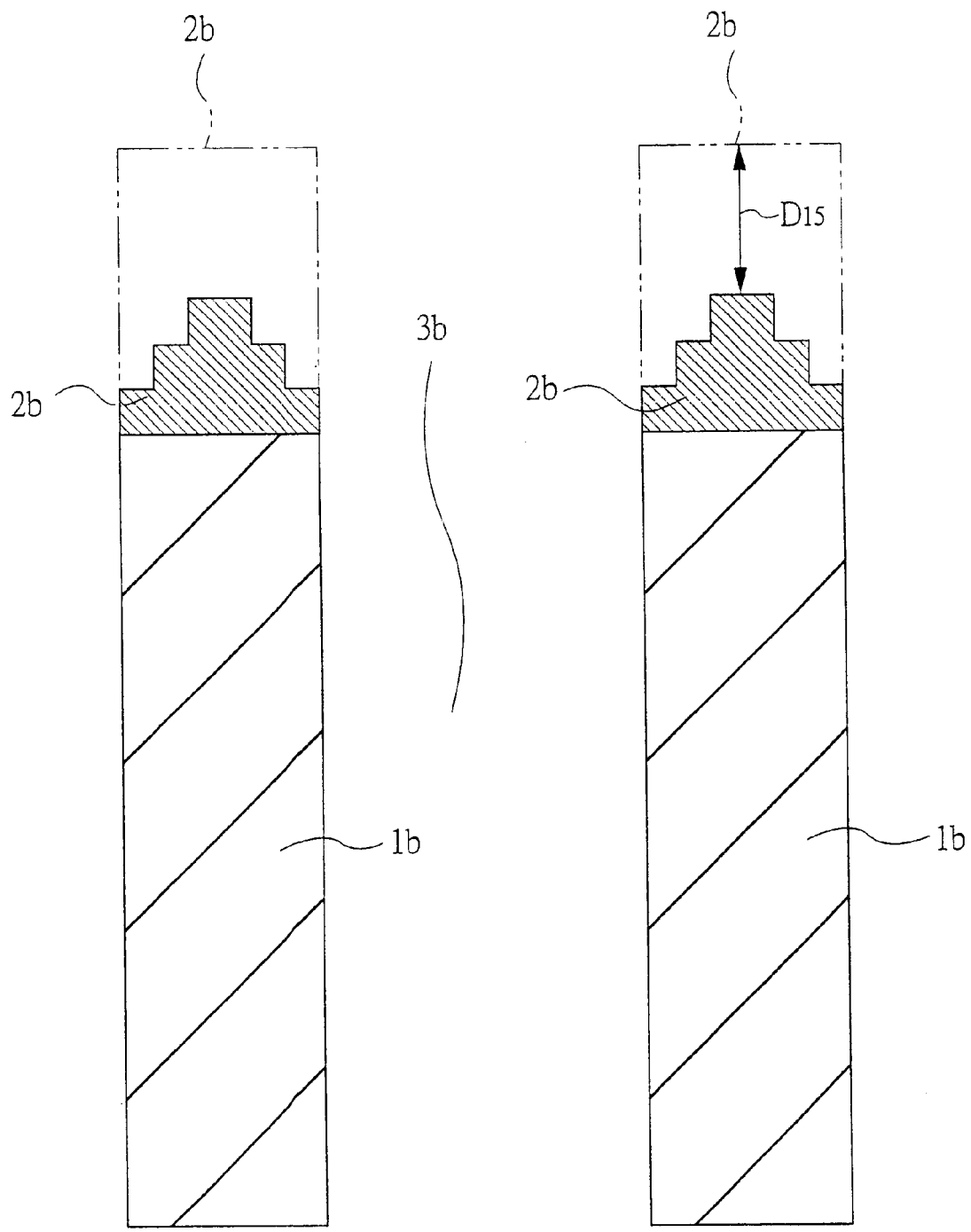
Figure 43:
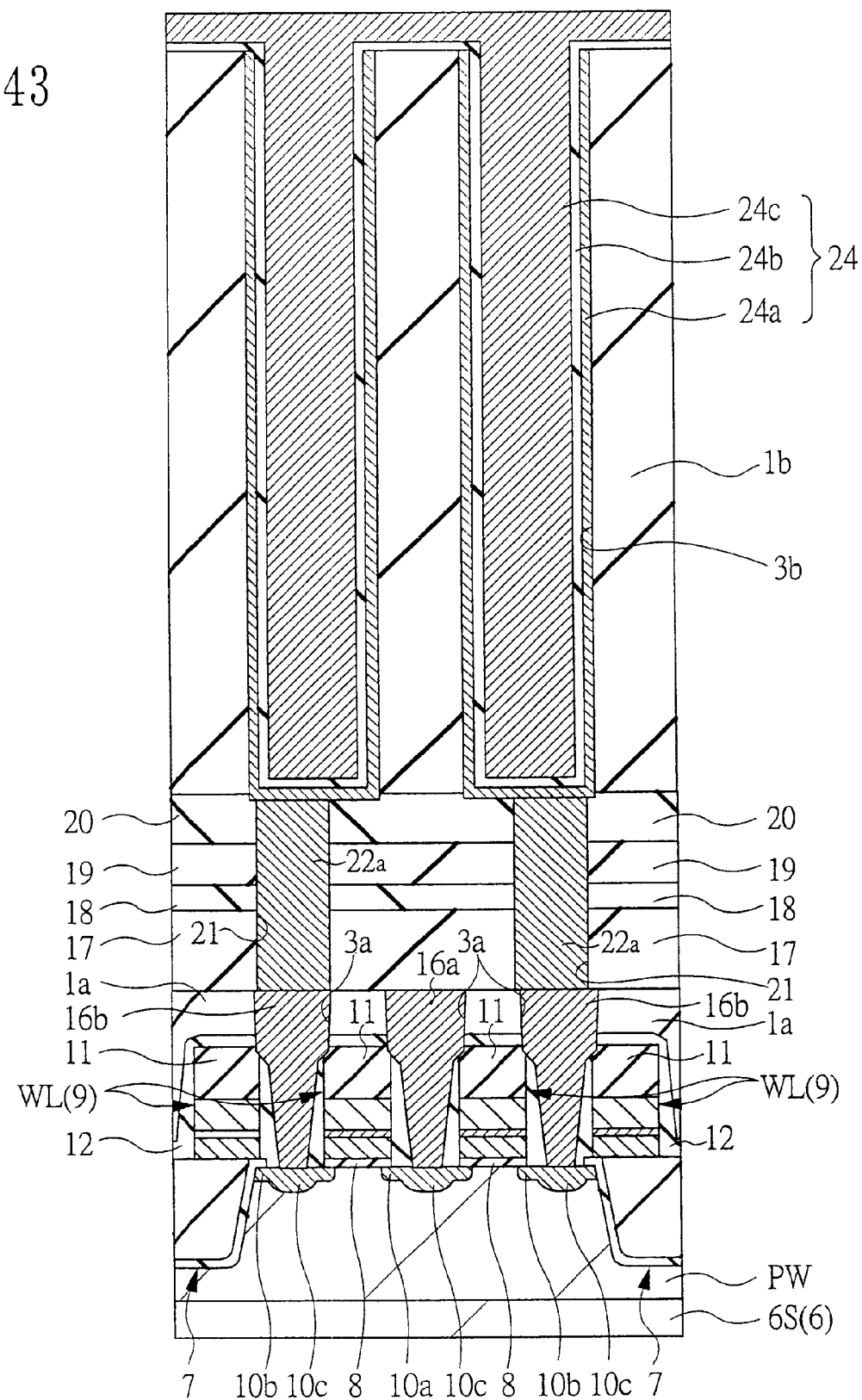
Figure 44:
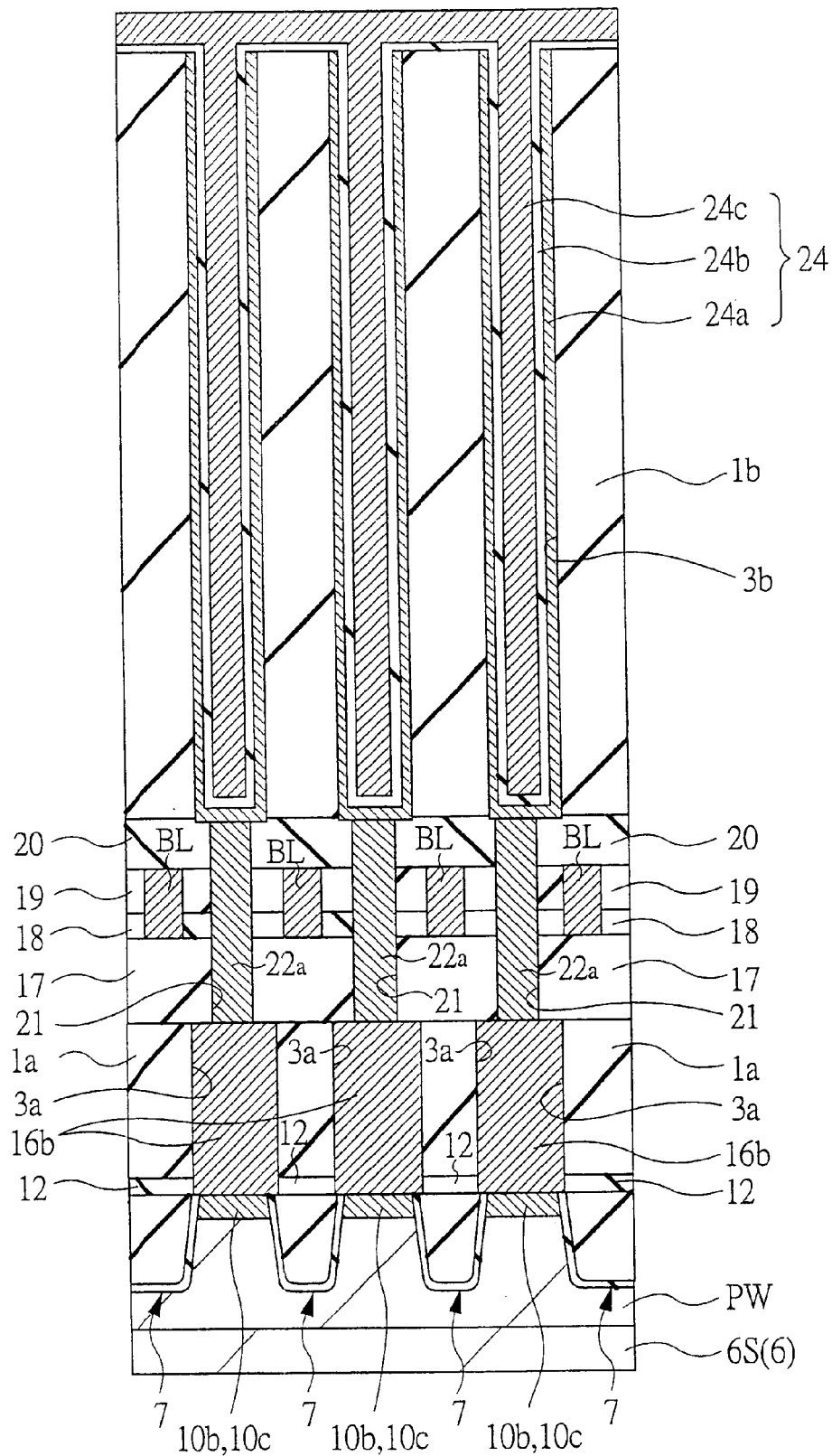

FIGS. 3A to 3D are sectional views of an essential portion of a sample at various etching stages when etching the sample under a condition in which the relative quantity of oxygen is large, that is, the deposition property of a polymer layer is weak (under a condition in which the opening property is good), wherein FIG. 3A shows the initial stage of etching, FIG. 3B shows the next stage of etching, FIG. 3C shows the middle stage of etching and FIG. 3D shows the final stage of etching;

FIGS. 4A to 4C are sectional views of an essential portion of a sample when etching a deep hole by the etching art studied by the present inventor et al. when considering problems under etching, wherein FIG. 4A shows the initial stage of etching of the art, FIG. 4B shows the next stage of etching, and FIG. 4C shows the further next stage of etching;

FIGS. 5A to 5C are sectional views of an essential portion of a sample showing the etching theory of an insulating film made of silicon oxide or the like, wherein FIG. 5A schematically shows a state in which CFx, Ar$^+$, and oxygen (O) enters a hole, FIG. 5B schematically shows the functions of CFx and Ar+, and FIG. 5C schematically shows the function of oxygen (O);

FIGS. 6A to 6D are sectional views of an essential portion of a sample of an embodiment of the present invention under etching, wherein FIG. 6A shows the initial stage of etching in the first step, FIG. 6B shows the etching stage in the first step following FIG. 6A, FIG. 6C shows the initial stage of etching in the second step following FIG. 6B, and FIG. 6D shows the final stage of etching in the second step following FIG. 6C;

FIG. 7 is a graph showing the relation between etching time and quantity of oxygen when comparing a specific example of the technical though of the present invention with the etching art described for FIG. 4;

FIG. 8 is an illustration showing the etching time in the first step and the oxygen-flow-rate dependency in the second step obtained through experiments performed by the present inventor et al.;

FIG. 9 is an illustration of an etching system used for the present embodiment;

FIG. 10 is a general top view of a wafer in the DRAM manufacturing process;

FIG. 11 is a sectional view of an essential portion of a semiconductor integrated circuit device of an embodiment of the present invention under the manufacturing process;

FIG. 12 is a sectional view of an essential portion of a plane vertical to FIG. 11 of the semiconductor integrated circuit device same as that in FIG. 11 under the manufacturing process;

FIG. 13 is a sectional view of an essential portion of the semiconductor integrated circuit device under the manufacturing process following FIG. 11;

FIG. 14 is a sectional view of an essential portion of a plane vertical to FIG. 13 of the semiconductor integrated circuit device same as that in FIG. 13 under the manufacturing process;

FIG. 15 is a sectional view of an essential portion of the semiconductor integrated circuit device under the manufacturing process following FIG. 13;

FIG. 16 is a sectional view of an essential portion of a plane vertical to FIG. 15 of the semiconductor integrated circuit device same as that in FIG. 15 under the manufacturing process;

FIGS. 17A and 17B are graphs showing relations between etching times and luminescence intensities used to detect the end point of the etching in the first step, wherein FIG. 17A shows a graph observing silicon fluoride among rays emitted from the plasma in the etching chamber, and FIG. 17B shows a graph observing CN in the plasma;

FIG. 18 is a sectional view of an essential portion of the semiconductor integrated circuit device under the manufacturing process following 15;

FIG. 19 is a sectional view of an essential portion of a plane vertical to FIG. 18 of the semiconductor integrated circuit device same as that in FIG. 18 under the manufacturing process;

FIGS. 20A and 20B are graphs showing relations between etching times and luminescence intensities used to detect the end point of the etching in the second step, wherein FIG. 20A shows a graph observing SiF among rays emitted from the plasma, and FIG. 20B shows a graph observing CN in the plasma;

FIG. 21 is an enlarged sectional view of an essential portion of the semiconductor integrated circuit device in FIG. 18 under the manufacturing process;

FIG. 22 is a sectional view of an essential portion of the semiconductor integrated circuit device under the manufacturing process following FIG. 18;

FIG. 23 is a sectional view of an essential portion of a plane vertical to FIG. 22 of the semiconductor integrated circuit device same as that in FIG. 22 under the manufacturing process;

FIG. 24 is a sectional view of an essential portion of the semiconductor integrated circuit device under the manufacturing process following FIG. 22;

FIG. 25 is a sectional view of an essential portion of a plane vertical to FIG. 24 of the semiconductor integrated circuit device same as that in FIG. 24 under the manufacturing process;

FIG. 26 is an enlarged sectional view of an essential portion of the semiconductor integrated circuit device in FIG. 24 under the manufacturing process;

FIG. 27 is a sectional view of an essential portion of the semiconductor integrated circuit device under the manufacturing process following FIG. 24;

FIG. 28 is a sectional view of an essential portion of a plane vertical to FIG. 24 of the semiconductor integrated circuit device same as that in FIG. 24 under the manufacturing process;

FIG. 29 is a sectional view of an essential portion of the semiconductor integrated circuit device under the manufacturing process following FIG. 27;

FIG. 30 is a sectional view of an essential portion of a plane vertical to FIG. 29 of the semiconductor integrated circuit device same as that in FIG. 29 under the manufacturing process;

FIG. 31 is a top view of an essential portion of a semiconductor wafer under the manufacturing process of the semiconductor integrated circuit device in FIGS. 29 and 30;

FIG. 32 is a sectional view of an essential portion of the semiconductor integrated circuit device under the manufacturing process following FIG. 29;

FIG. 33 is a sectional view of an essential portion of a plane vertical to FIG. 32 of the semiconductor integrated circuit device same as that in FIG. 32 under the manufacturing process;

FIG. 34 is a sectional view of an essential portion of the semiconductor integrated circuit device under the manufacturing process following FIG. 32;

FIG. 35 is a sectional view of an essential portion of a plane vertical to FIG. 34 of the semiconductor integrated circuit device same as that in FIG. 34 under the manufacturing process;

FIG. 36 is a sectional view of an essential portion of the semiconductor integrated circuit device under the manufacturing process following FIG. 34;

FIG. 37 is a sectional view of an essential portion of a plane vertical to FIG. 36 of the semiconductor integrated circuit device same as that in FIG. 36 under the manufacturing process;

FIG. 38 is a top view of an essential portion of a semiconductor wafer under the manufacturing process of the semiconductor integrated circuit device in FIGS. 36 and 37;

FIG. 39 is a sectional view of an essential portion of the semiconductor integrated circuit device under the manufacturing process following FIG. 36;

FIG. 40 is a sectional view of an essential portion of a plane vertical to FIG. 39 of the semiconductor integrated circuit device same as that in FIG. 39 under the manufacturing process;

FIG. 41 is a top view of an essential portion of a semiconductor wafer under the manufacturing process of the semiconductor integrated circuit device in FIGS. 39 and 40;

FIG. 42 is an enlarged sectional view of an essential portion of the semiconductor integrated circuit device in FIG. 39 under the manufacturing process;

FIG. 43 is a sectional view of an essential portion of the semiconductor integrated circuit device under the manufacturing process following FIG. 39; and FIG. 44 is a sectional view of an essential portion of a plane vertical to FIG. 43 of the semiconductor integrated circuit device same as that in FIG. 43 under the manufacturing process.

DESCRIPTION OF THE PREFERRED EMBODIMENTS

Before describing the present invention in detail, meanings of terms used in this specification are described below.

1. A device face denotes the principal plane of a semiconductor wafer, on which integrated circuit patterns corresponding to a plurality of chip areas are formed through photolithography. That is, the device face denotes the principal plane opposite to "back plane".

2. A semiconductor integrated circuit wafer or a semiconductor wafer denotes one of a single-crystal silicon substrate (circular in general), a sapphire substrate, a glass substrate, other insulating, anti-insulating, or semiconductor substrate, and a combined substrate of these substrates. Moreover, a "semiconductor integrated circuit device" (or "electronic device" or "electronic circuit device") includes not only a device formed on a single-crystal silicon substrate but also a device formed on one of the above various substrates or one of an SOI (Silicon On Insulator) substrate, a TFT (Thin Film Transistor) liquid-crystal fabrication substrate, and an STN (Super Twisted Nematic) liquid-crystal fabrication substrate unless otherwise specified.

3. Silicon nitride denotes includes not only $Si_3N_4$ but also an insulating film made of silicon nitride having similar composition.

4. An etching gas contains a reaction gas, a diluent gas, and other gas. The reactive gas is a gas mainly contributing to reactions such as etching and deposition, which can be further classified into a main reaction gas and an addition reaction gas. A fluorocarbon-based gas serves as a main reaction gas used for an SAC (Self Aligned Contact) process and an HARC (High Aspect Ratio Contact) process and a gas containing oxygen ($O_2$) serves as an addition reaction gas. The fluorocarbon-based gas can be classified into the saturated type and the unsaturated type.

5. An electrode wiring denotes the general name of an electrode or wiring constituting an integrated circuit pattern, which serves as a component for forming an electrical-signal path.

The following embodiment is described by dividing it into a plurality of sections or embodiments according to necessity. However, unless otherwise specified, they are related with each other and one of them serves as a modification, detail, or supplementary explanation of a part or the whole of the other.

Moreover, in the case of the following embodiment, when the number of elements and the like (including number of pieces, numerical value, quantity, and range) is described, the number is not restricted to a specific number except that the number is specified or theoretically clearly restricted to a specific number but it is permitted that the number is equal to or more than or less than a specified number.

Furthermore, in the case of the following embodiment, it is a matter of course that components (including element steps) of the embodiment are not always indispensable except that the components are specified or theoretically clearly considered to be indispensable.

Furthermore, in the case of the following embodiment, when the shape or positional relation of a component or the like is described, a component substantially approximating to or similar to the shape is included except a case in which the shape or positional relation is specified or not theoretically clearly specified. The same is true for the above numerical value and rang.

Furthermore, in all drawings for explaining the embodiment, members having the same function are provided with the same symbol and their repetitive descriptions are omitted. Furthermore, in the case of the following embodiment, the description of the same or similar portion is not repeated in principle except when necessary.

An embodiment of the present invention is described below in detail by referring to the accompanying drawings.

Embodiment 1

Figure 1A:
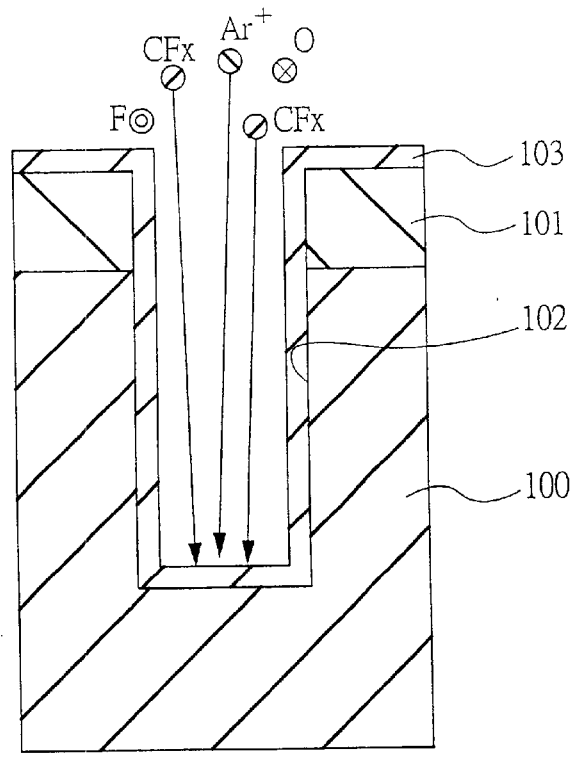
Figure 1B:
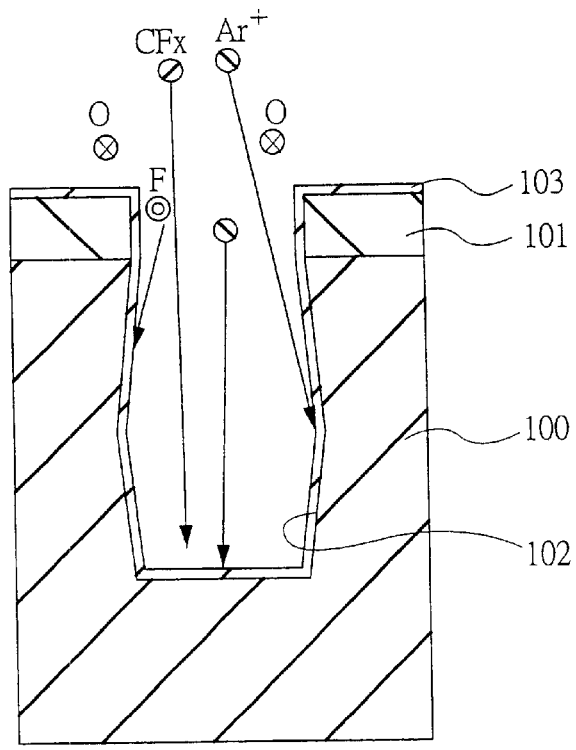

FIGS. 1A and 1B are sectional views of an essential portion of a sample for explaining a problem of a method for forming a deep hole through etching, which problem has been studied by the present inventors.

A mask pattern 101 is formed on an insulating film 100 made of a silicon-oxide film. The mask pattern 101 is a pattern serving as an etching mask and uses, for example, one of a wolfram film, photoresist film, silicon-nitride film, and polysilicon film. A hole 102 will be drilled through plasma etching. An etching gas uses, for example, a mixed gas of $C_5F_8$, oxygen ($O_2$), and argon (Ar). In FIGS. 1A and 1B, a black circle denotes $Ar^+$, a hatched circle denotes CFx, and a circle provided with a cross denotes oxygen (O).

FIG. 1A shows a case in which relatively much $C_5F_8$ is used, that is, a case in which relatively much $O_2$ is used. In this case, a polymer layer 103 made of CFx (x=0 to 2) becomes excessive and thickly deposits on (attaches to) the surface (upper face and opening side face) of the mask pattern 101 and the inner face (inside face and bottom face) of the hole 102. Therefore, deposition of the polymer layer 103 becomes more dominant than etching reaction and thereby, etching stops (etch stop).

FIG. 1B shows a case in which a relatively little $C_5F_8$ is used, that is, a case in which relatively much $O_2$ is used. In this case, the polymer layer 103 made of CFx (x=0 to 2) thinly deposits on (attaches to) the surface (upper face and opening side face) of the mask pattern 101 and the inner face (inside face and bottom face) of the hole 102. In this case, because the deposition property of the polymer layer 103 on the inside face of the hole 102 is low and thereby, the protective effect is deteriorated, etching of the inside face of the hole 102 is accelerated due to $Ar^+$ and fluorine (F) which are diagonal components (bowing shape). Moreover, because the polymer layer 103 on the upper face of the mask pattern 101 is thin and thereby, the protective effect is deteriorated, etching of the mask pattern 101 is accelerated (decrease of mask selection ratio).

FIG. 2 and FIGS. 3A to 3D show sectional views of an essential portion of a sample when actually forming a deep hole through etching.

Figure 2:
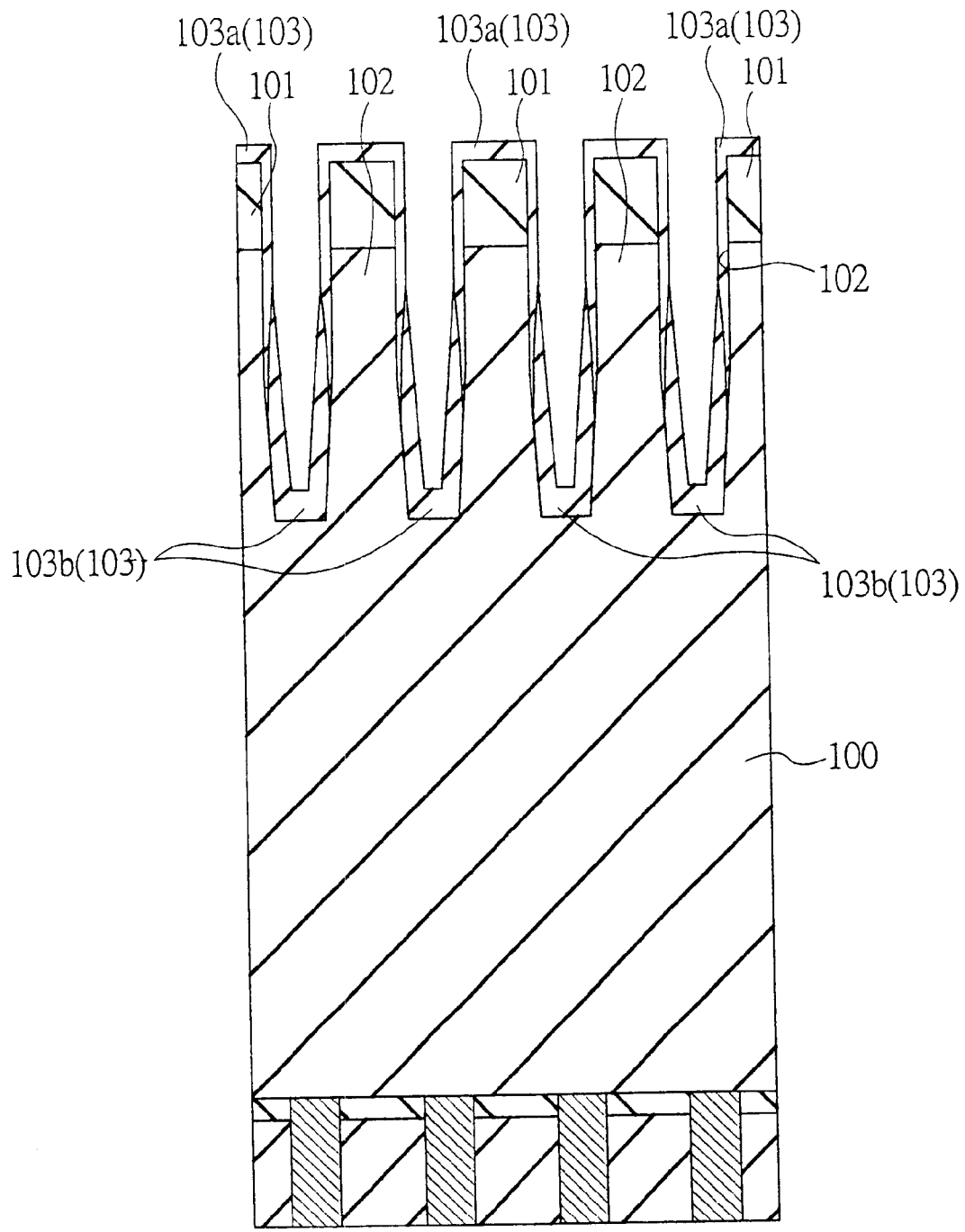
FIG. 2 is a sectional view of an essential portion of a sample at the initial stage when etching the sample under a condition in which the relative quantity of oxygen is small, that is, the deposition property of a polymer layer is strong (under a condition in which the opening property is bad)

FIG. 2 is a sectional view of an essential portion of the sample at the initial stage of etching when the sample is etched by decreasing the relative quantity of oxygen, that is, by strengthening the deposition property of the above polymer layer (bad opening property).

A polymer layer 103a made of carbon (C) of CFx (x=0) mainly attaches to the surface (upper face and opening side face) of the mask pattern 101 and the upper inside face of the hole 102 and a polymer layer 103b made of CFx (x=1, 2) mainly attaches to the bottom face of the lower inside face of the hole 102. When enhancing the deposition property from the initial stage of etching, etching stop occurs.

FIGS. 3A to 3D are sectional views of an essential portion of a sample at each stage of etching when executing etching by increasing the relative quantity of oxygen, that is, by weakening the deposition property of the above polymer layer (good opening property).

FIG. 3A shows the initial stage of etching. In this case, etching is started under a condition in which the deposition property of CFx (x=0 to 2) is suppressed so as not to cause etch stop. The polymer layer 103a made of carbon (C) of CFx (x=0) mainly attaches to the surface of the mask pattern 101 and the upper inside face of the hole 102 and the polymer layer 103b of CFx (x=1 or 2) mainly attaches to the lower inside face and bottom face of the hole 102. FIG. 3B shows the next stage of etching. In this case, the quantity of the protective polymer layer 103b attached to the inside face of the hole 102 is decreased in an area F1. Moreover, shoulder drop of the mask pattern 101 occurs in the area F2 at the upper portion of the hole 102. FIG. 3C shows the middle stage of etching. Because the polymer layer 103b mainly attaches to the bottom of the hole 102, the quantity of the protective polymer layer 103b attached to the inside face of the hole 102 becomes insufficient in the area F1. Moreover, shoulder drop of the mask pattern 101 increases in the area F2 at the upper portion of the hole 102 and thereby, the function of a mask cannot be secured. FIG. 3D shows the final stage of etching. Because the quantity of the protective polymer layer 103b attached to the inside face of the hole 102 becomes insufficient in the area F1, etching is accelerated in the area F1 and a large bowing occurs. Moreover, because the quantity of the protective polymer layer 103b attached to the upper face of the mask pattern 101 becomes insufficient, the remaining film of the mask pattern 101 decreases (decrease of mask selection ratio). Furthermore, the opening diameter of the hole 101 is increased due to shoulder drop of the mask pattern 101 in the area F2.

FIGS. 4A to 4D show the etching art studied by the present inventor et al., in which sectional views of an essential portion of a sample are shown when etching a deep hole considering the above problems.

FIG. 4A shows the initial stage of etching of the art. In this case, etching is executed by decreasing the relative quantity of $O_2$ in an etching gas. In this case, attached quantities of the polymer layers 103a and 103b are increased as described above. However, because the aspect ratio of the hole 102 is low, a relatively large quantity of $O_2$ is supplied into the hole 102 and etching is slightly accelerated. FIG. 4B shows the next stage of etching. In this case, etching is executed by using $O_2$ slightly more than $O_2$ in the case of FIG. 4A. That is, the flow rate of $O_2$ is increased immediately before etch stop occurs under the condition in FIG. 4A. Thereby, it is possible to slightly decrease attached quantities of the polymer layers 103a and 103b and thereby, avoid etch stop. FIG. 4C shows the next stage of etching. In this case, etching is executed by more slightly increasing the quantity of $O_2$ compared to the stage in FIG. 4B. That is, attached quantities of the polymer layers 103a and 103b are continuously decreased so that etch stop does not occur. Thus, in the case of this art, etch stop greatly depends the aspect ratio of the hole 102. Therefore, when the aspect ratio of the hole 102 increases, it is difficult to control the flow rate of $O_2$ so that etch stop does not occur and it is impossible to form a hole. Moreover, the thickness and dimensions of a mask pattern easily fluctuate and it is impossible to control formation of the hole 102.

Therefore, the present inventors studied the etching principle of an insulating film made of silicon oxide and the like again. FIGS. 5A to 5C are sectional views of an essential portion of a sample showing the principle. A mixed gas of $C_5F_8$, $O_2$ and Ar was used as an etching gas.

FIG. 5A schematically shows a state in which CFx, $Ar^+$, and oxygen (O) enters the hole 102. CFx (x=0 to 2), fluorine (F), and oxygen (O) produced due to gas dissociation enter the hole 102. CFx produced due to dissociation of C5F8 attaches to the surface (inside face and bottom face of hole 102) of the insulating film 100 in the hole 102 and the surface of mask pattern 101 to form the polymer layer 103. Ar is ionized in plasma, accelerated by a bias voltage, and attracted into the hole 102. Moreover, $O_2$ is dissociated to form an oxygen (O) radical.

FIG. 5B schematically shows functions of CFx and Ar+. The polymer layer 103 made of CFx and silicon oxide of the insulating film 100 attached to the surface (inside face and bottom face of hole 102) of the insulating film 100 cause a reaction by the energy of Ar ions. The reaction is shown by the following chemical formula.

[Chemical Formula 1]

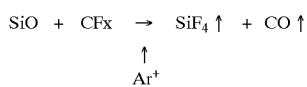

FIG. 5C schematically shows the function of oxygen (O). Oxygen (O) and fluorine (F) react with CFx and control the quantity of the polymer layer 103 made of CFx. When the polymer layer 103 is thin, etching is easily accelerated. When the layer 103 is thick, etching is prevented. These reactions are shown by the following chemical formulas.

[Chemical Formula 2]

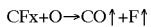

Then, the present inventor et al. formed a deep hole through etching in accordance with problems of the above studied art and restudied results of the etching principle as described below. That is, etching was executed by weakening the deposition property of a polymer layer {CFx (x=0 to 2)}, (good opening property) in the first etching step and then, etching was executed by strengthening the deposition property of the polymer (bad opening property) in the second etching step (multi-step etching).

FIGS. 6A to 6D show specific examples of the above etching. The etching gas used a mixed gas of C5F8, O2, and Ar. FIGS. 6A and 6B show sectional views of an essential portion of a sample in the first step and FIGS. 6C and 6D show sectional views of the essential portion of the sample in the second step. For this example, etching was executed by using $O_2$ more than $C_5F_8$ in the first step and then, etching was executed by using $O_2$ less than $C_5F_8$ in the second step. An insulating film 1 is made of silicon oxide ($SiO_2$) or the like and a mask pattern 2 made of a wolfram film, a photoresist film, a silicon-nitride film, or a polysilicon film is formed on the insulating film 1.

FIG. 6A shows the initial stage of etching in the first step. A polymer layer 4a of carbon (C) of CFx (x=0) and a polymer layer 4b of CFx (x=1, 2) attach in a hole 3 currently drilled on the insulating film 1. Moreover, the polymer layer 4a of carbon attaches to the surface (upper face and opening side face) of the mask pattern 2. At this stage, a proper flow rate of O2 is necessary so that etch stop does not occur due to excessive attachment of the polymer layers 4a and 4b. FIG. 6B shows the etching stage in the first step following FIG. 6A. Only the polymer layer 4b of CFx (x=1, 2) attaches to the bottom of the hole 3. The quantity of the polymer layer 4b at the bottom of the hole 3 decreases and etch stop does not easily occur. An area in which the protective polymer layer 4b of CFx (x=1, 2) becomes insufficient is formed on the inside face of the hole 3.

FIG. 6C shows the initial stage of etching in the second step following FIG. 6B. In this case, the quantity of the polymer layer 4b of CFx at the bottom of the hole 3 increases. Moreover, the quantity of a polymer layer of carbon attached to the surface of the mask pattern 2 increases. When the hole 3 becomes deeper, the quantity of CFx reaching the bottom of the hole 3 decreases. Therefore, etch stop does not easily occur. The quantity of the protective polymer layer 4b of CFx on the inside face of the hole 3 is increased by decreasing the quantity of $O_2$ while preventing etch stop from occurring. FIG. 6D shows the final stage of etching in the second step following FIG. 6C. In this case, a state in which formation of the hole 3 having a purposed depth is completed is shown. By continuing etching while adjusting the quantity of the polymer layer 4b of CFx at the bottom of the hole 3 so that etch stop does not occur, working is realized in which a bowing does not easily occur and much mask pattern 2 remains.

FIG. 7 is a graph showing the relationship between etching time and oxygen quantity as a result of comparing a specific example of the technical thought of the present invention with the etching art described for FIG. 4. In the case of the art described for FIG. 4, the oxygen quantity increases as the etching time increases. In the case of the specific example of the technical thought of the present invention, the oxygen quantity decreases as the etching time increases.

FIG. 8 shows the etching time in the first step and the oxygen-flow-rate dependency in the second step obtained through experiments performed by the present inventor et al. In the first step, the flow rate of oxygen was kept constant at 28 $cm^3$/min. When setting the etching time in the first step to 30 sec, a hole having a depth of approx. 300 nm is formed. In this case, as a result of changing the first step to the second step and decreasing the flow rate of oxygen to 24 or 26 $cm^3$/min, it was impossible to form a hole up to a final target depth. When setting the flow rate of oxygen to 28 $cm^3$/min as changed to the second step, a mask pattern disappeared though a hole could be formed.

Then, when setting the etching time in the first step to one minute, a hole having a depth of approx. 600 nm was formed. In this case, as a result of changing the first step to the second step and decreasing the flow rate of oxygen to 24 $cm^3$/min, it was impossible to form a hole up to a final target depth. Moreover, as a result of decreasing the flow rate of oxygen in the second step to 26 $cm^3$/min, it was possible to preferably form a hole up to a final target depth without causing a large bowing while securing a mask selection ratio. Moreover, when setting the flow rate of oxygen in the second step to 28 $cm^3$/min same as that in the first step, a mask patter disappeared though a hole could be drilled.

Then, when setting the etching time in the first step to 2 minutes, a hole having a depth of approx. 1. 2 $\mu$m was formed. In this case, as a result of changing the first step to the second step and decreasing the flow rate of oxygen to 24 or 26 $cm^3$/min, it was possible to preferably drill a hole up to a final target depth without causing a large bowing while securing a mask selection ratio in any case. Moreover, when setting the flow rate of oxygen in the second step to 28 $cm^3$/min same as the case of the first step, a mask pattern disappeared though a hole could be formed.

In the above case, the first step was changed to the second step in accordance with the etching time. As a result, it is concluded that it is preferable to use an etching time in which the depth (in this case, a value obtained by adding the depth of the hole 3 formed on the insulating film 1 and the thickness of the mask pattern 2) D1 of the hole 3 in FIG. 6B is equal to approx. 1 $\mu$m, that is, approx. a half the depth of the completed hole 3 or approx. a half the thickness of the insulating film 1. It is also permitted to change steps at a position shallower or deeper than the depth D1. The study by the present inventors concludes that it is preferable to change the first step to the second step when the aspect ratio of the hole 3 at the stage in FIG. 6B (stage immediately before change of steps) ranges between 2 and 14, between 4 and 12, or between 6 and 10. Moreover, the study by the present inventor et al. concludes that it is preferable to use the technical thought of the present invention when the aspect ratio of the hole 3 at the stage in FIG. 6D (final stage) is 10 or more, 12 or more, 14 or more, or 16 or more.

According to the above method of the present invention, the following actions are obtained. Carbon ($CF_0$), fluorine (F), CFx (x=1, 2), $O_2$, and Ar obtained through dissociation of $C_5F_8$ or the like by plasma relates to etching. Among these substances, carbon attaches to the upper inside face of the hole 3 and the surface of the mask pattern 2 at the initial stage of etching and reacts with a material to be etched to accelerate etching. Oxygen reacts with carbon and CFx to adjust the quantity of them to be attached. Ar serves as ions to assist a reaction. Though carbon attaches to the inside face of the hole 3 at its shallow portion and the surface of the mask pattern 2, it hardly reaches the bottom of the hole 3. However, CFx does not attach to a shallow portion of the hole 3 but it reaches up to the bottom of the deep hole 3. Moreover, a large quantity of oxygen (O) remains at the upper portion of the hole 3 and a small quantity of it remains at the bottom of the hole 3. To decrease etching areas of the inside face of the hole 3 and the mask pattern 2, it is necessary to use much carbon and CFx compared to oxygen (O). However, when using excessive carbon and CFx, etch stop occurs. Therefore, at the initial stage of etching, the rate of oxygen is increased (that is, rates of carbon and CFx are decreased) to prevent etch stop because depositions of carbon and CFx are present and etch stop easily occurs. When the hole 3 becomes deep to a certain extent, carbon does not reach the bottom of the hole 3, almost only CFx remains, and the quantity of CFx attached to the bottom of the hole 3 decreases. Therefore, it is possible to accelerate etching of the bottom of the hole 3 by increasing the attached quantity of CFx so that etch stop does not occur. In this case, carbon also increases but it works only to protect the inside face of the hole 3 and the mask pattern 2. As a result, it is possible to form the hole 3 having a high aspect ratio. Particularly, it is possible to form the hole 3 having a high aspect ratio without forming a bowing in the hole 3, greatly shaving the mask pattern 2, or increasing the diameter of the upper portion of the hole 3.

In the above example, etching is executed in two steps. However, it is also permitted to increase the number of steps. In this case, because the flow rate of oxygen is finely controlled, it is possible to more preferably form the hole 3 having a high aspect ratio.

Moreover, for the above example, a case is described in which a condition that the deposition property of a polymer layer of CFx (x=0 to 2) is weak (good opening property) and a condition that the deposition property of the polymer layer is strong (bad opening property) are changed by changing flow rates of oxygen. However, not only the above case but also various modifications are allowed.

For example, it is permitted to increase the flow rate of a CF-based gas such as $C_5F_8$ in the second step instead of the first step while fixing the flow rate of oxygen in the first and second steps.

Moreover, it is permitted to decrease the bias power (high-frequency power) between upper and lower electrodes of an etching system in the second step instead of the first step.

Furthermore, it is permitted to combine an art for changing the above bias power with an art for changing the above oxygen flow rate or that of a CF-based gas.

Then, the etching system used for this embodiment is described below by referring to FIG. 9.

The etching system uses the two-frequency-excitation RIE (Reactive Ion Etching) system (UNITY-IIS-85DI made by Tokyo Electron Limited.) 5. By distinguishing between a driving frequency and a bias frequency, it is possible to independently control the generation and dissociation of plasma and the energy of ions entering a semiconductor wafer (hereafter referred to as wafer) 6. In the case of this etching system 5, a driving frequency is optimized to, for example, 60 MHz and a bias frequency is optimized to, for example, 2 MHz. Thereby, it is possible to stably generate plasma at a lower pressure (up to 1 Pa) and a high density (up to $10^{11}$ cm$^{-3}$) correspondingly to a high-aspect oxide-film etching process. Moreover, the change to high evacuation {change of exhaust rates of turbo-molecular pump from 1,300 (l/s) to 2,200 (l/s)} is performed.

A chamber 5a forming the etching chamber of the etching system 5 is made of aluminum formed into a cylinder and alumite treatment (anode oxidation) is applied to the surface of the chamber 5a. The chamber 5 is grounded. The bottom of the chamber 5a is provided with an almost-cylindrical susceptor support table through an insulating plate made of ceramic or the like and moreover provided with a susceptor 5b constituting a lower electrode on the table. A cooling chamber is formed in the susceptor support table. A coolant such as liquid nitrogen is introduced into and circulated through the cooling chamber. Because the cold of the coolant is conducted to a wafer 6 through the susceptor 5b, thereby the temperature of the principal plane (corresponding to the above device face) of the wafer 6 is controlled and set to a desired value.

The upper-face center of the susceptor 5b is formed into a convex disk and an electrostatic chuck 5c whose top view is almost the same as that of the wafer 6 is provided on the susceptor 5. The wafer 6 is electrostatically attracted by, for example, the Coulomb force when a predetermined DC voltage is applied to an electrode set between insulating plates of the electrostatic chuck 5c. A gas channel for supplying a heat transfer medium such as helium (He) gas to the back of the wafer 6 is formed on the insulating plates, susceptor support table, susceptor 5b, and electrostatic chuck 5c and the cold of the susceptor 5b is transferred to the wafer 6 through the heat transfer medium so that the wafer 6 is kept at a predetermined temperature. An annular focus ring is set to the upper-face circumference of the susceptor 5b so as to surround the wafer 6 on the electrostatic chuck 5c. The focus ring is made of silicon same as the wafer 6 and has a function for improving the uniformity of etching in the principal plane of the wafer 6.

An upper electrode 5d is set above the susceptor 5b so as to face the susceptor 5b in parallel. The upper electrode 5d is supported by the upper portion of the chamber 5a through an insulating material and has an electrode plate 5d1 and an electrode support 5d2 for supporting the plate 5d1. The electrode plate 5d1 is made of, for example, silicon, silicon carbide (SiC), or amorphous carbon and set to the opposite face of the susceptor 5b, and has a lot of holes 5d3. Moreover, the electrode support 5d2 is made of aluminum (Al) and alumite treatment is applied to the surface of the support 5d2. In the case of the etching system 5, the interval between the susceptor 5b (lower electrode) and upper electrode 5d (hereafter referred to as electrode interval) can be changed in a range of 17 to 60 mm. Moreover, it is preferable to use the silicon that can be scavenged among the above materials as the material of the electrode plate 5d1.

A gas introduction port is formed at the center of the electrode support 5d2 of the upper electrode 5d, a gas supply pipe is connected to the gas introduction port, and moreover, a treatment-gas supply source is mechanically connected to the gas supply pipe through a valve and the above mass-flow controller. An etching gas is supplied from the treatment-gas supply source. A gas exhaust pipe 5e is set to a part of the chamber 5a. The gas exhaust pipe 5e is provided with a vacuum pump such as a turbo-molecular pump and thereby, the inside of the chamber 5a is exhausted up to a predetermined decompression atmosphere (e.g. 1 to 13.3 Pa). The exhaust rate of the vacuum pump is, for example, 2,200 (L/s) so that high evacuation can be realized. Moreover, a gate valve is set to the side wall of the chamber 5a. The wafer 6 is carried between the chamber 5a and a load-lock chamber adjacent to the chamber 5a while the gate valve opens.

A first high-frequency power source 5f is electrically connected to the upper electrode 5d through a matching unit and a high-pass filter HPF. It is possible to set a frequency of 50 to 150 MHz to the first high-frequency power source 5*f*. By applying the above high frequency, it is possible to generate high-density plasma under a preferable dissociation state in the chamber 5*a* and perform plasma etching at a pressure lower than ever. It is preferable to use 50 to 80 MHz or typically use 60 MHz or a frequency close to 60 MHz as the frequency of the first high-frequency power source 5*f*.

A second high-frequency power source 5*g* is electrically connected to the susceptor 5*b* serving as the lower electrode through a low-pass filter LPF and a matching unit. It is possible to set a frequency of 1 to 4 MHz to the second high-frequency power source 5*g*. By applying a voltage of a frequency in the above range, it is possible to provide a proper ion action to the wafer 6 without damaging the wafer 6. It is preferable to use 1 to 3 MHz or typically use 2 MHz or a frequency close to 2 MHz as the frequency of the second high-frequency power source 5*g*.

In the etching system 5, the treatment pressure disclosed in this specification is measured by, for example, a Baratron vacuum gauge. The Baratron vacuum gauge is set to the side wall in the chamber 5*a* and slightly separate from the upper and lower electrodes. Therefore, the treatment pressure is substantially different from the pressure between the upper electrode 5*d* and susceptor 5*b* (lower electrode) faced each other.

The configuration of the etching system 5 is not restricted to the above mentioned but it can be modified. Even when another parallel-plate-type etching system is used, it is possible to apply the present invention.

Then, a case is described below in which the technical thought of the present invention is applied to a manufacturing method of a semiconductor integrated circuit device having a DRAM. FIG. 10 shows a general top view of a wafer 6 (semiconductor substrate 6S) in the manufacturing process of a DRAM. The wafer 6 is formed to be almost circular and a cutout 6*a* used for alignment is formed on a part of the circumference of the wafer 6. The wafer 6 has a diameter of approx. 200 mm, for example. However, the diameter of the wafer 6 is not restricted to the ones but they can be changed. For example, it is also possible to use a large wafer having a diameter of 300 mm. In FIG. 10, X axis and Y axis vertical to X axis are virtually assigned to the wafer 6. X axis is an axis extending in the horizontal direction and Y axis is an axis extending in the vertical direction in FIG. 10 so as to pass on the cutout 6*a*. In sectional views hereafter used, a sectional view provided with X, X shows an essential-portion sectional view along Y axis in FIG. 10 and a sectional view provided with Y, Y shows an essential-portion sectional view along Y axis in FIG. 10.

FIGS. 11 and 12 show essential-portion sectional views of the above X, X and Y, Y in the memory cell area of the wafer 6 in the manufacturing process of the DRAM of this embodiment. First, a separation portion 7 is formed on the principal plane of a semiconductor substrate 6S made of p-type single-crystal silicon having a resistivity of approx. 10 Ωcm (at this stage, the wafer 6 has an almost-circular cross section) to form a p-well PW on the semiconductor substrate 6S. The separation portion 7 is formed by dry-etching the device face of the semiconductor substrate 6S in a device separation area to form a trench having a predetermined depth, then depositing an insulating film made of a silicon oxide film or the like on the device face of the semiconductor substrate 6S including the inside of the trench by CVD (Chemical Vapor Deposition), polishing the insulating film by CMP (Chemical Mechanical Polishing), and leaving the insulating film in the trench (trench isolation). Moreover, the p-well PW is formed by ion-implanting an impurity such as boron (B) into the semiconductor substrate 6S, then annealing (heat-treating) the semiconductor substrate 6S, and diffusing the impurity.

Then, the surface of the p-well PW is cleaned by a hydrofluoric-acid(HF)-based cleaning solvent and the semiconductor substrate 6S is wet-oxidized to form a clean gate insulating film 8 on the surface of the p-well PW. The gate insulating film 8 is made of, for example, silicon oxide and has a thickness of approx. 6 nm in terms of silicon-dioxide film thickness.

It is also permitted to form the gate insulating film 8 by an oxynitride silicon film instead of a silicon-oxide film. Thereby, it is possible to improve the hot carrier resistance and insulation resistance of the gate insulting film 8. An oxynitride silicon film can be formed by heat-treating the semiconductor substrate 6S in an atmosphere containing a nitrogen gas such as NO, $NO_2$, or $NH_3$. Moreover, it is possible to obtain the same advantage as described above by forming the gate insulating film 8 made of silicon oxide, heat-treating the semiconductor substrate 6S in the above nitrogen-gas-contained atmosphere, and segregating nitrogen on the interface between the gate insulating film 8 and the semiconductor substrate 6S.

Moreover, it is permitted to form the gate insulating film 8 by a combined insulating film of a silicon-nitride or silicon-oxide film and a silicon-nitride film. When the thickness of the gate insulating film 8 made of silicon oxide is decreased up to less than 5 nm, particularly up to less than 3 nm in terms of silicon-dioxide film thickness, a tunnel current directly occurs or reduction of a withstand voltage due to hot carriers caused by a stress is actualized. Because a silicon-nitride film has a dielectric constant higher than that of a silicon-oxide film, it is possible to make the actual thickness of the silicon-nitride film larger than a thickness in terms of silicon-dioxide film thickness. That is, when a silicon-nitride film is used, it is possible to obtain a capacity equal to the capacity of a relatively-thin silicon-dioxide film even if the silicon-nitride film is physically thick. Therefore, by forming the gate insulating film 8 by a single silicon-nitride film or a combined film of the silicon-nitride film and a silicon-oxide film, it is possible to make the effective thickness of the film 8 larger than that of a gate insulating film made of a silicon-oxide film. Therefore, it is possible to prevent a tunnel leak current from occurring or a withstand voltage from being lowered due to hot carriers.

Then, a gate electrode 9 (word line WL) is formed on the gate insulating film 8 and then n-type semiconductor areas 10*a* and 10*b* having a low impurity concentration are formed on the p-well PW at the both sides of the gate electrode 9. The gate electrode 9 (word line WL) is formed by depositing a polysilicon film doped with an impurity such as phosphorus on the semiconductor substrate 6S through CVD, then depositing a wolfram-nitride (WN) film and a wolfram (W) film on the polysilicon film through sputtering, and dry-etching these films by using a photoresist film as a mask. The thickness of the polysilicon film constituting the gate electrode 9 is set to 50 to 100 nm, that of the wolfram-nitride film constituting the electrode 9 is set to several nm, and that of the wolfram constituting the electrode 9 is set to 50 to 100 nm. Moreover, a cap film 11 is formed by depositing a silicon-nitride film having a thickness of approx. 120 nm. Furthermore, the n-type semiconductor areas 10*a* and 10*b* are formed by ion-implanting an impurity such as arsenic (As) into a p-well PW.

Then, an insulating film 12 made of silicon nitride or the like is deposited on the semiconductor substrate 6S up to a thickness of 40 to 60 nm through low-pressure CVD or the like. At this stage, the insulating film 12 is formed so as to cover the device face of the semiconductor substrate 6S, the side face of the gate electrode 9, and the surface (upper face and side face) of the cap film 11 while avoiding the gap between word lines WL adjacent to each other from being embedded.

Then, an insulating film 1a made of a silicon-oxide film is formed by depositing the film 1a on the device face of the semiconductor substrate 6S through CVD or the like and then flattening the upper face of the film 1a through CMP or the like. The dimension D2 showing the thickness of the insulating film 1a is approx. 600 nm, for example. Then, a photoresist pattern (hereafter referred to as resist pattern) 2a is formed by depositing an antireflection film 15a having a thickness of 50 to 200 nm on the insulating film 1a through spin coating and then, depositing a photoresist film having a thickness of 400 to 800 nm through spin coating, patterning the photoresist film, and thereby forming a photoresist pattern (hereafter referred to as resist pattern) 2a. The resist pattern 2a is a mask pattern for forming a contact hole, which is patterned through normal exposure. The opening of the resist pattern 2a is formed to be almost circular, a contact-hole forming area is exposed from the opening but other portion is covered. The dimension D3 of the opening of the resist pattern 2a and the dimension 4 of the adjacent interval of the opening are approx. 160 nm, for example.

Then, as shown in FIGS. 13 and 14, the antireflection film 15a is removed through etching by using the above resist pattern 2a as a mask. The etching system uses an etching system having an applied frequency different from that of the two-frequency-excitation parallel-plate-type RIE system in FIG. 9 though the both etching systems are the same in shape.

Then, a contact hole is formed on the insulating film 1a by using the etching art of the present invention (SAC process).

First, the wafer 6 is set into the etching system 5 shown in FIG. 9 (two-frequency-excitation parallel-plate-type RIE system). Then, the insulating film 1a exposed from the resist pattern 2a and antireflection film 15a is removed through etching by applying the etching in the above first step to the wafer 6 and using the pattern 2a and film 15a as etching masks as shown in FIGS. 15 and 16. The following conditions are used as etching conditions: the pressure in the etching chamber is approx. 2.66 Pa, etching gases and their flow rates are set to $C_5F_8:O_2:Ar$=approx. 16:18:800 $cm^3$/min, the high-frequency power of the upper electrode 5d (refer to FIG. 9) is set to approx. 800 W and that of the susceptor 5b (refer to FIG. 9) is set to approx. 700 W, and the interval between electrodes is set to approx. 21 mm. Moreover, the plasma density is set to approx. $10^{11}/cm^3$, for example.

At this stage, the etching in the first step is executed until the bottom (depth) of the contact hole 3a almost reaches the upper-face height of the cap film 11 on the word line WL. Therefore, the insulating film 1a is left at the bottom side of the contact hole 3a at this stage. The fact that the bottom of the contact hole 3a reaches the above depth through the etching in the first step is automatically detected by observing silicon fluoride (SiF, wavelength of 440 nm) among rays emitted from the plasma in the etching chamber and detecting the drop of the waveform of the silicon fluoride, as shown in FIG. 17A. Moreover, because a part of the insulating film 12 made of silicon nitride is exposed when the contact hole 3a reaches the above depth, it is also possible to automatically detect the above fact by observing CN (wavelength of 388 nm) in the plasma and detecting the rise of the waveform as shown in FIG. 17B.

After it is automatically detected that the contact hole 3a reaches the above depth, the etching in the second step is continuously started without turning off the plasma discharge. That is, the flow rate of $O_2$ among the etching conditions in the first step is changed (decreased) to approx. 15 $cm^3$/min to remove the remaining insulating film 1a through etching as shown in FIGS. 18 and 19. In this case, the etching time is obtained by observing SiF among rays emitted from the plasma as shown in FIG. 20A, detecting the drop of the waveform as the just time when the etching of the insulating film 1a ends, and moreover over-etching the film 1a for approx. 10 sec. Moreover, because the lower insulating film 12 made of a silicon-nitride film is exposed when the insulating film 1a is eliminated, it is possible to obtain the etching time by observing CN (wavelength of 388 nm) in the plasma, detecting the rise of the waveform as the just time when the etching of the insulating film 1a ends, and moreover over-etching the film 1a for approx. 10 sec as shown in FIG. 20B.

Under the etching in the second step, the wafer 6 is kept at up to 120° C. in accordance with the pressure and flow rate of helium (He) gas supplied through the gas channel of the susceptor 5b (refer to FIG. 9) at the back of the wafer 6 or by setting an electrostatic voltage. The temperature of the wafer 6 is the temperature of the device face of the wafer 6 currently etched and heat is mainly supplied from plasma. The temperature is obtained by attaching a temperature-measuring temp-plate to three points such as the center, circumference, and a point between them of the device face of the wafer 6 and averaging measured values at the three points.

After the etching in the second step, the contact hole 3a is not completely formed and the insulating film 12 is left at the bottom of the contact hole 3a as an etching stopper. Moreover, a thin polymer layer 4 made of CFx (x=0 to 2) is attached to the surface of the insulating film 1a in the contact hole 3a at the above stage {inner face (bottom face and inside face) of the contact hole 3a}.

The diameter of the bottom of the contact hole 3a at the above stage is equal to approx. 60 nm, for example. Therefore, the aspect ratio of the contact hole 3a at the above stage is approx. 10=depth of 600/width of 60 because the depth D2 of the insulating film 1a (refer to FIG. 11) is 600 nm. The study by the present inventors concludes that it is preferable to apply the present invention when the aspect ratio is larger than 10, 12, or 14. Though a case of decreasing the oxygen flow rate in the second step is described above, it is also permitted to make the bias power (high-frequency power) applied to the susceptor 5b of the etching system 5 (refer to FIG. 9) in the second step smaller than the bias power applied to the susceptor 5b in the first step or combine the art for changing the bias power with the art for changing the above oxygen flow rate or CF-based-gas flow rate.

After etching, the selection ratio of the silicon-oxide film to the silicon-nitride film is calculated. In this case, the selection ratio is equal to {etching rate of silicon-oxide film (insulating film 1a)}/{etching rate of silicon-nitride film (insulating film 12) at shoulder of gate electrode 9} when etching is executed as illustrated in FIG. 21. The etching rate of the silicon-nitride film at the shoulder of the gate electrode 9 is calculated in accordance with the shaved dimension D5 at the vertical maximally-shaved portion shown in FIG. 21. As a result, it is possible to greatly improve the mask selection ratio compared to the case of a comparative example. FIG. 21 is an enlarged sectional view of the essential portion in FIG. 18. In FIG. 21, the n-type semiconductor areas 10a and 10b, polymer layer 4, antireflection film 15a, or resist pattern 2a shown in FIG. 18 is not illustrated so that FIG. 21 can be easily seen.

Therefore, according to this embodiment, it is possible to form the contact hole 3a having a high aspect ratio as a preferable vertical shape without causing a bowing. Moreover, it is possible to preferably open the contact hole 3a having a high aspect ratio while securing a large-enough mask selection ratio. Furthermore, it is possible to open the contact hole 3a having a high aspect ratio without increasing the upper-portion diameter. Therefore, it is possible to improve the yield and reliability of DRAMs. Moreover, because fining can be accelerated, it is possible to accelerate the improvement of the performance and integration degree of a DRAM.

Then, after the above etching, the above polymer layer 4 is continuously removed without breaking the vacuum state. Thereby, as shown in FIGS. 22 and 23, surfaces of the insulting films 1a and 12 are exposed from the inner face (side face and bottom face) of the contact hole 3a. The treatment conditions in the above case are set to conditions in which only the polymer layer 4 is removed but the resist pattern 2a is not removed. The etching system in the above case also uses the etching system 5 in FIG. 9.

Then, the insulating film 12 at the bottom of the contact hole 3a is continuously removed through etching by using the resist pattern 2a as an etching mask without breaking the vacuum state. Thereby, as shown in FIGS. 24 and 25, a part (n-type semiconductor areas 10a and 10b) of the device face of the semiconductor substrate 6S is exposed from the bottom face of the contact hole 3a to complete the contact hole 3a. The etching system in the above case also uses the etching system 1 in FIG. 9.

According to this embodiment, it is possible to improve the short margin between the gate electrode 9 and the contact hole 3a. The above short margin is obtained by measuring the dimension D6 of a portion where the distance between the gate electrode 9 and contact hole 3a illustrated in FIG. 26 is minimum. In the case of this embodiment, it is possible to obtain a short margin of 30 to 40 nm. It is a matter of course that imperfect opening of the contact hole 3a does not occur. Therefore, it is possible to improve the yield and reliability of high-integration high-performance DRAMs. FIG. 26 is an enlarged sectional view of the essential portion in FIG. 24. In FIG. 26, neither antireflection film 15a nor resist pattern 2a is illustrated so that FIG. 26 can be easily seen.

Then, the resist pattern 2a and antireflection film 15a are removed through ashing, then an n-type doped polysilicon film is deposited through CVD or the like, and moreover the doped polysilicon film is polished through CMP or the like to form plugs 16a and 16b made of doped polysilicon in the contact hole 3a as shown in FIGS. 27 and 28.

Then, the wafer 6 is heat-treated to diffuse the impurity (such as phosphorus or arsenic) in the plugs 16a and 16b into the semiconductor substrate 6S. Thereby, an $n^+$-type semiconductor area 10c is formed in self alignment so that the area 10c is superimposed on the n-type semiconductor areas 10a and 10b for a source and a drain. In up to this process, a plurality of memory selection MISQs are completed in the memory area of each chip of the wafer 6.

Then, as shown in FIGS. 29 and 30, an insulating film 17 made of a silicon-oxide film is deposited on the insulating film 1a and plugs 16a and 16b through plasma CVD or the like using, for example, TEOS gas. Thereafter, a through-hole from which a part of the plug 16a is exposed is formed on the insulating film 17, a metallic film made of, for example, wolfram is deposited in the through-hole and on the insulating film 17 through sputtering and/or CVD, and the metallic film is polished through CMP or the like so that it is left only in the through-hole. Thereby, a plug is formed in the through-hole. The plug is electrically connected with the plug 16a.

Then, an insulating film 18 made of silicon nitride having a thickness of, for example, approx. 50 nm is deposited on the insulating film 17 through CVD or the like and then, an insulating film 19 made of silicon oxide is deposited on the film 18 through plasma CVD using TEOS gas. Then, a trench for forming a bit line is formed on the insulating films 18 and 19, then a metallic film made of, for example, wolfram of the like is deposited in the trenches and on the insulating film 19 through sputtering or the like, and the metallic film is polished through CMP or the like. Thereby, an embedded bit line BL made of wolfram is formed in the bit-line-forming trenches. The bit line BL is electrically connected with the plug 16a through the plug in the through-hole formed on the insulating film 17 and moreover electrically connected with one n-type semiconductor area 10a and $n^+$-type semiconductor area 10c of the memory selection MISQs. Then, an insulating film 20 made of, for example, silicon nitride is formed on the insulating film 19 and embedded bit line BL up to a thickness of approx. 100 nm through plasma CVD or the like.

Then, a through-hole 21 from which the upper face of the plug 16b is exposed is formed on the insulating films 17 to 20 through photolithography and dry etching. The through-hole 21 is formed so that its sectional view is almost elliptical. Then, a doped polysilicon film is deposited in the through-hole 21 and on the insulating film 20 and polished through CMP or the like so that the film is left only in the through-hole 21. Thereby, a plug 22a made of a doped polysilicon film is formed in the through-hole 21. The plug 22a is electrically connected by the plug 16b.

Then, an insulating film 1b made of a silicon-oxide film is deposited on the insulating film 20 through plasma CVD using, for example, TEOS gas up to a thickness of, for example, 2.0 to 3.0 μm or approx. 2.3 μm in this case. Thereafter, a mask-forming film MA made of, for example, a doped polysilicon film is formed on the insulating film 1b trough CVD or the like up to a thickness of 200 to 400 nm or approx. 330 nm in this case. By using doped polysilicon for the mask-forming film MA, it is possible to reduce contamination and simplify working. It is also possible to use a metallic film made of wolfram or the like for the mask-forming film MA. In this case, it is possible to improve the working accuracy of an insulating film (oxide film) because the metallic film is hard and therefore not easily shaved and it is easy to take a selection ratio with other material.

Then, an antireflection film 15b having a thickness of 50 to 200 nm or approx. 80 nm in this case and a photoresist film PR having a thickness of approx. 400 nm are deposited on the mask-forming film MA in order through spin coating. The photoresist film PR is patterned through normal exposure after deposited so that the capacitor-hole forming area of the film PR is exposed and other areas of the film PR are covered. FIG. 31 shows a top view of an essential portion of the wafer 6 at this stage. In FIG. 31, the photoresist film PR is relatively densely hatched and the antireflection film 15b is coarsely hatched so that FIG. 31 can be easily seen. In FIG. 31, the longitudinal dimension D11 of the capacitor-hole forming opening is set to approx. 250 nm, the crosswise dimension D12 of it is set to approx. 130 nm, the longitudinal adjacent dimension D13 of it is set to approx. 170 nm, and the crosswise adjacent dimension (separation width)

D14 is set to approx. 130 nm. According to the study by the present inventors, it is preferable to use an etching method of the present invention for a product having the separation width of approx. 150 nm or 140 nm, particularly 130 nm or less. This is because adjacent capacitor holes are short-circuited due to a bowing when the adjacent internal decreases and the short circuit can be prevented by applying the present invention capable of reducing or eliminating bowings. Side faces of capacitor holes are slightly etched through etching or cleaning after the capacitor holes are drilled. Therefore, when the separation width is small (e.g. 130 nm), an etching method of the present invention is particularly effective.

Then, as shown in FIGS. 32 and 33, the antireflection film 15b is removed by using the above photoresist film PR as a mask. Etching conditions in this case are shown below. That is, an etching system and etching conditions are the same as the case of the above antireflection film 15a.

Then, a hard mask pattern 2b is formed as shown in FIGS. 34 and 35 by using the photoresist PR as an etching mask and thereby removing the doped polysilicon film exposed from the PR through etching.

Then, the photoresist film PR is removed through ashing or the like as shown in FIGS. 36 and 37. FIG. 38 is a top view of an essential portion of the wafer 6 as this stage. In FIG. 38, the hard mask pattern 2b is hatched so that FIG. 38 can be easily seen. A plurality of openings whose cross sections are round-square quadrangular are regularly arranged on the hard mask pattern 2b. The insulating film 1b is exposed from the openings. A capacitor hole is formed on portions exposed from the openings.

Then, as shown in FIGS. 39 and 40 a capacitor hole 3b is formed through the above etching art of the present invention by using the hard mask pattern 2b as an etching mask and thereby removing the portion of the insulating film 1b exposed from the pattern 2b through etching (HARC process).

Etching conditions used for the HARC process are shown below. First, the etching in the above first step is executed up to the middle depth of the capacitor hole 3b. In this case, etching gases and their flow rates are set to $C_5F_8:O_2:Ar=$ approx. 24:28:700 cm$^3$/min, the bias power (high-frequency power) of the upper electrode 5d (refer to FIG. 9) is set to approx. 1,800 W, that of the susceptor 5b (refer to FIG. 9) is set to approx. 1,500 W, and the treatment time is set to approx. 2 min. Moreover, the plasma density is set to approx. $5\times10^{11}$/cm$^3$. Change of steps is performed in accordance with time. At this stage, etching is executed until the depth of the contact hole 3b reaches almost half of the full depth of the hole 3b, that is, up to approx. 1 μm. Therefore, the insulating film 1b is left at the bottom of the contact hole 3b at this stage.

Then, after the above etching time, the etching in the above second step is started without stopping plasma discharge. That is, only the flow rate of $O_2$ among the above etching conditions in the first step is changed (reduced) to approx. 24 cm$^3$/min to remove the remaining insulating film 1b through etching. Thereby, the capacitor hole 3b is completed.

It is permitted to change the etching conditions in the second step to the following instead of the above mentioned. That is, it is permitted to change (increase) only the flow rate of $C_5F_8$ to approx. 28 cm$^3$/min so as to relatively reduce the quantity of $O_2$.

Moreover, it is permitted to change (reduce) only the bias power (high-frequency power) for the susceptor 5b (refer to FIG. 9) to approx. 1,200 W.

Furthermore, as another means, it is permitted to change (increase) only the bias power (high-frequency power) for the upper electrode 5d (refer to FIG. 9) among the etching conditions in the above first step to, for example, 2,000 W.

Furthermore, as still another means, it is permitted to properly combine the means for changing bias powers (high-frequency powers) of the upper and lower electrodes of the etching system 5 with the means for changing flow rates of oxygen or CF-based gas of the above etching gas.

In the case of the etching time in the second step, over-etching is executed by 30% by observing carbon nitride (CN) among rays emitted from plasma and assuming the rise of the waveform when the insulating film 20 made of silicon nitride serving as a substrate is exposed as the just time when etching of a silicon-oxide film (insulating film 3e) is completed.

The upper portion of the hard mask pattern 2b after etched in the first and second steps is shaved compared with the upper portion before etched. Moreover, the hard mask pattern 2b is shaved so that the thickness decreases toward the capacitor hole 3b. FIG. 41 shows a top view of an essential portion of the wafer 6 after shaved. In FIG. 41, the hard mask pattern 2b and plug 22a are hatched so that FIG. 41 can be easily seen. The upper portion of the plug 22a and the insulating film 20 are exposed from the bottom of the capacitor hole 3b.

After the etching in the second step is completed, the selection ratio of the silicon-oxide film (insulting film 1b) to the polysilicon film (hard mask pattern 2b) is calculated. The selection ratio can be calculated in accordance with the expression of {etching rate of silicon-oxide film (insulating film 1b)}/{etching rate of silicon-oxide film (hard mask pattern 2b)}. The etching rate of the polysilicon film (hard mask pattern 2b) is calculated in accordance with the dimension D15 of the portion shown in FIG. 42. As a result, it is possible to improve the selection ratio. For example, when completely drilling the capacitor hole 3b in accordance with only the conditions in the first step, the remaining thickness of the polysilicon film (hard mask pattern 2b) shows approx. 39.53 nm as the average value of thickness at positions in a predetermined area. Moreover, there are some areas in which the polysilicon film (hard mask pattern 2b) disappears. In the case of the step etching (means for changing flow rates of an etching gas) of this embodiment, however, the remaining thickness of the polysilicon film (hard mask pattern 2b) shows approx. 93.02 nm as the average of thickness at positions in a predetermined area. Furthermore, in the case of the step etching {means for changing bias powers (high-frequency powers) to be applied to upper and lower electrodes of the etching system 5}, the remaining thickness of the polysilicon film (hard mask pattern 2b) shows approx. 76.74 nm as the average of thickness at positions in a predetermined area. In any case, it is possible to greatly improve the remaining thickness of the polysilicon film (hard mask pattern 2b). Moreover, in any case, the polysilicon film (hard mask pattern 2b) does not disappear in a predetermined area.

Moreover, as a result of measuring a portion (minimum dimension) where the thickness of the insulating film 1b between adjacent capacitor holes 3b is minimized due to a bowing, when completely drilling the capacitor holes 3b in accordance with only the conditions in the first step, the minimum dimension shows approx. 56.98 nm as the average of thickness at positions in a predetermined area. However, in the case of the step etching (means for changing flow rates of an etching gas) of this embodiment, the minimum dimension shows approx. 80.23 nm as the average of thickness at positions in a predetermined area. Moreover, in the case of the step etching {means for changing bias powers (high-frequency powers to be applied to upper and lower electrodes of the etching system 5} of this embodiment, the above minimum dimension shows approx. 79.07 nm as the average of thickness at positions in a predetermined area. In any case, it is possible to greatly improve the minimum dimension.

Furthermore, when drilling the capacitor hole 3b under only the conditions in the first step, the hole bottom dimension (diameter) DA of the capacitor hole 3b shows 73.67 nm as the average of hole bottom dimensions at positions in a predetermined area. However, in the case of the step etching (means for changing flow rates of an etching gas) of this embodiment, the hole bottom dimension DA shows approx. 72 nm as the average of hole bottom dimensions at positions in a predetermined area. Furthermore, in the case of the step etching {means for changing bias powers (high-frequency powers) to be applied to upper and lower electrodes of the etching system 5} of this embodiment, the hole bottom dimension DA shows approx. 64.67 nm as the average of hole bottom dimensions at positions in a predetermined area. Therefore, the opening property almost the same as the case of opening the capacitor hole 3b in only the first step is obtained.

Thus, according to this embodiment, it is possible to form a contact hole 3b having a high aspect ratio without causing a bowing or in a preferable vertical shape in an allowable range even if a bowing occurs. Moreover, it is possible to preferably open the contact hole 3b having a high aspect ratio while sufficiently securing a mask selection ratio. Furthermore, it is possible to open the contact hole 3b having a high aspect ratio without increasing the upper diameter of the hole 3b. Therefore, it is possible to improve the yield and reliability of DRAMs. Moreover, because fining can be accelerated, it is possible to accelerate improvement of performances and integration degrees of DRAMs.

FIGS. 43 and 44 show sectional views of the capacitor hole 3b when forming an information-storing capacitive element 24 in the hole 3b. The information-storing capacitive element 24 has a lower electrode 24a, a capacitor insulating film 24b formed on the surface of the electrode 24a, and a plate electrode 24c. The lower electrode 24a is made of, for example, a doped polysilicon film and electrically connected with the n-type semiconductor area 10b and n+-type semiconductor area 10c of one of memory-selection MISQs through plugs 22a and 16b. The capacitor insulating film 24b is made of a silicon-nitride film, a laminated film of a silicon-nitride film and a silicon-oxide film, or tantalum oxide ($TaO_5$). The plate electrode 24c is made of a metallic film such as titanium nitride.

The above various etching conditions of SAC and HARC processes of this embodiment are a combination of most preferable conditions selected by the present inventor et al. The above various conditions are closely related to each other, in which one value is changed when the other value is changed. Etching conditions are not restricted to the above ones but they can be changed.

Therefore, study results on various etching conditions of the above SAC and HARC processes by the present inventor et al. are described below.

First, plasma densities are described. When a plasma density is too low, the quantity of etchant ($C_xF_y$) to be produced due to dissociation of an etching gas becomes insufficient and the quantity of ions for supplying the energy necessary for the reaction between the etchant and a film to be etched {silicon-oxide film ($SiO_2$)} becomes insufficient. As a result, the etching rate of the film to be etched (silicon-oxide film) lowers and etching may stop. However, when a plasma density is too high, an etching gas is excessively dissociated and a film deposited on the film to be etched (silicon-oxide film) becomes too thick and thereby, etching does not progress.

For an etching gas to dissociate and serve as an etchant, it is necessary that the etching gas be made of molecules in which carbon (C) and fluorine (F) are combined each other as $C_xF_y$. When dissociation excessively progresses, the etching gas is decomposed into carbon and fluorine simplexes. Under the simplex state of them, a silicon-oxide film is not etched.

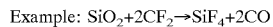

Example: $SiO_2 + 2CF_2 \rightarrow SiF_4 + 2CO$

When considering the above mentioned, it is preferable to set a plasma density to $10^{10}$ to $10^{13}/cm^3$, preferably to $10^{10}$ to $10^{12}/cm^3$ or $5 \times 10^{10}$ to $5 \times 10^{11}/cm^3$.

Then, the interval between upper and lower electrodes of an etching system is described below. The electrode interval has a function for controlling the above plasma density. For example, when the electrode interval becomes 40 mm or more, the plasma density and plasma uniformity are deteriorated. Therefore, when considering the plasma density, it is preferable to set the electrode interval to 17 to 30 mm in view of plasma density and uniformity.

Then, a fluorocarbon-based gas among etching gases is described below. The fluorocarbon-based gas can be classified into the saturated type and the unsaturated type. The saturated type is a gas in which all carbon (C) atoms are single bonds. It is possible to use $CF_4$, $CHF_3$, $CH_2F_2$, $CH_3F$, $C_2F_6$, $C_3F_8$, and $C_4F_8$ as etching gases. Moreover, the unsaturated type is a gas in which carbon (C) atoms have double or triple bonds. It is possible to use $C_5F_8$ or $C_4F_6$ as an etching gas.

In the case of the above embodiment, $C_5F_8$ is used as a main reaction gas because of the following reasons. First, it is possible to improve the deposition property of deposit ($C_xF_y$) as the number of carbon atoms increases and improve a silicon-nitride selection ratio. Moreover, it is possible to improve the silicon-nitride selection ratio and the vertical shape of a hole {the protective property of the hole can be improved by a deposition film ($C_xF_y$)} and thereby, an etching reaction and a deposition reaction are well balanced. Furthermore, because the protective property of a photoresist film can be improved by attaching a deposition film ($C_xF_y$) onto the photoresist film, it is possible to improve the working shape and working dimension of a hole. Furthermore, the global-warming potential (GWP)(90–100) and the life in the atmosphere (1 year) of $C_5F_8$ gas are extremely low compared to $CF_4$ (GWP:6,500, life:50,000 years) and $C_4F_8$ (GWP:870, life:3,200 years). Furthermore, $C_5F_8$ gas does not have any problem in flammability, explosibility, and toxicity. It is permitted to add the above $CF_4$, $CHF_3$, $CH_2F_2$, or $C_4F_8$ to $C_5F_8$ instead of using $C_5F_8$ independently. That is, by adding a gas containing fluorine (F), it is possible to remove the above deposit ($C_xF_y$) and suppress the deposition property.

Furthermore, a diluent gas contained in an etching gas ionizes in plasma to serve as ions and has a function for accelerating the reaction between an etchant and a film to be etched and diluting the concentration of a reaction gas in the etching gas so that excessive etching or deposition reaction does not occur. Argon gas is used as the diluent gas because it is an inert gas and therefore, it does not produce any reaction product with other gas due to a chemical reaction.

Moreover, by adding helium gas to argon gas, it is possible to control a reaction. Furthermore, it is possible to use an inert gas such as helium gas instead of argon gas.

The invention made by the present inventor et al. is specifically described in accordance with the embodiment. However, the present invention is not restricted to the embodiment. It is needless to say that various modifications of the present invention are allowed as long as they are not deviated from the gist of the present invention.

For the above embodiment, a case is described in which the present invention is applied when forming a hole. However, the present invention is not restricted to the above case. It is also possible to apply the present invention to the case of forming a trench for forming a wiring.

Moreover, a case is mainly above described in which the invention made by the present inventor is applied to a DRAM that is included in the background field of the present invention. However, the present invention is not restricted to the above case. The present invention can be also applied to a method for fabricating a semiconductor integrated circuit device having a memory circuit such as an SRAM (Static Random Access Memory) or a flash memory (EEPROM: Electric Erasable Programmable Read-Only Memory), a method for fabricating a semiconductor integrated circuit device having a CMIS (Complementary MIS: Complementary Field-Effect Transistor) circuit, a method for fabricating a semiconductor integrated circuit device having a logic circuit such as a microprocessor, or a method for fabricating a consolidated semiconductor integrated circuit device in which a memory circuit and a logic circuit are set on the same semiconductor substrate.

Advantages obtained from a typical aspect among the aspects of the present inventions disclosed in this application are briefly described below.

According to the present invention, it is possible to form a hole or trench having a high aspect ratio by selectively plasma-etching a silicon-oxide-based insulating film deposited on a semiconductor substrate with a fluorocarbon-based gas and an etching gas containing oxygen firstly under a condition in which the deposition property of a polymer layer is weak and then under a condition in which the deposition property of the polymer layer is strong.

What is claimed is:

1. A method of manufacturing a semiconductor integrated circuit device comprising the step of:
executing first and second steps in order, when a silicon-oxide-based insulating film is etched selectively, by means of plasma-etching the silicon-oxide-based insulating film deposited on a semiconductor substrate with an etching gas containing a fluorocarbon-based gas, oxygen and argon gas wherein
the insulating film is etched in the first step at a first flow-rate ratio of the oxygen in the etching gas such that the deposition property of a polymer layer is weaker than that in the second step and then etched in the second step with a change of flow-rate ratio of the oxygen in the etching gas into at a second flow-rate ratio that is lower than the first flow-rate ratio so as to have the deposition property of the polymer layer stronger than that in the first step.

2. The method of manufacturing a semiconductor integrated circuit device according to claim 1, wherein high-frequency power to be applied to a lower electrode of an etching system in the second step is made smaller than that to be applied to a lower electrode of the etching system in the first step.

3. The method of manufacturing a semiconductor integrated circuit device according to claim 1, wherein a hole or trench is formed on the silicon-oxide insulating film by etching the film.

4. The method of manufacturing a semiconductor integrated circuit device according to claim 3, wherein the aspect ratio of the hole or trench formed in the first step ranges between 2 to 14.

5. The method of manufacturing a semiconductor integrated circuit device according to claim 3, wherein the aspect ratio of the hole or trench formed in the first step ranges between 4 and 12.

6. The method of manufacturing a semiconductor integrated circuit device according to claim 3, wherein the aspect ratio of the hole or trench formed in the first step ranges between 6 and 10.

7. The method of manufacturing a semiconductor integrated circuit device according to claim 3, wherein the aspect ratio of the hole or trench formed in the second step is larger than 10.

8. A method of manufacturing a semiconductor integrated circuit device comprising the step of:
executing etching in a first step and etching in a second step in order in accordance with the quantity of CF-based deposit when a silicon-oxide-based insulating film is etched selectively, by means of plasma-etching the silicon-oxide-based insulating film deposited on semiconductor substrate with an etching gas containing a fluorocarbon-based gas, oxygen and argon gas; wherein
the flow-rate ratio of the oxygen in the etching gas in the second step is made lower than that of the oxygen in the etching gas in the first step.

9. The method of manufacturing a semiconductor integrated circuit device according to claim 8, wherein a hole or trench is formed on the silicon-oxide-based insulating film by etching the film.

10. The method of manufacturing a semiconductor integrated circuit device according to claim 9, wherein the aspect ratio of the hole or trench formed in the first step ranges between 2 and 14.

11. The method of manufacturing a semiconductor integrated circuit device according to claim 9, wherein the aspect ratio of the hole or trench formed in the first step ranges between 4 and 12.

12. The method of manufacturing a semiconductor integrated circuit device according to claim 9, wherein the aspect ratio of the hole or trench formed in the first step ranges between 6 and 10.

13. The method of manufacturing a semiconductor integrated circuit device according to claim 9, wherein the aspect ratio of the hole or trench formed in the first step is larger than 10.

14. A method of manufacturing a semiconductor integrated circuit device, when a silicon-oxide-based insulating film is etched selectively, by means of plasma-etching the insulating film deposited on a semiconductor substrate with an etching gas containing a fluorocarbon-based gas, oxygen and argon gas to form a hole or trench on the silicon-oxide-based insulating film, the method comprising the steps of, executed in order:
(a) a first step of etching to form the hole or trench up to the half depth of it by assuming the flow-rate ratio of the oxygen in the etching gas as a first flow-rate ratio to execute etching in the etching process;
(b) a second step of etching to form the hole or trench while making the flow-rate ratio of the oxygen in the etching gas lower than the first flow-rate ratio in the etching process of second step to execute etching; wherein the aspect ratio of the hole or trench formed in the first step ranges between 2 and 14.

15. The method of manufacturing a semiconductor integrated circuit device according to claim 14, wherein the aspect ratio of the hole or trench formed in the second step is larger than 10.

16. A method of manufacturing a semiconductor integrated circuit device, when a silicon-oxide based insulating film is etched selectively, by means of plasma-etching the insulating film deposited on a semiconductor substrate with an etching gas containing a fluorocarbon-based gas, oxygen and argon gas to form a hole or trench on the silicon-oxide-based insulating film, the method comprising the steps of, executed in order:

(a) a first step of etching to form the hole or trench up to the half depth of it by assuming the flow-rate ratio of the oxygen in the etching gas as a first flow-rate ratio to execute etching in the etching process;

(b) a second step of etching to form the hole or trench while making the flow-rate ratio of the oxygen in the etching gas lower than the first flow-rate ratio in the etching process of second step to execute etching; wherein the aspect ratio of the hole or trench formed in the first step ranges between 4 and 12.

17. The method of manufacturing a semiconductor integrated circuit device according to claim 16, wherein the aspect ratio of the hole or trench formed in the second step is larger than 10.

18. A method of manufacturing a semiconductor integrated circuit device, when a silicon-oxide-based insulating film is etched selectively, by means of plasma-etching the insulating film deposited on a semiconductor substrate with an etching gas containing a fluorocarbon-based gas, oxygen and argon gas to form a hole or trench on the silicon-oxide-based insulating film, the method comprising the steps of, executed in order:

(a) a first step of etching to form the hole or trench up to the half depth of it by assuming the flow-rate ratio of the oxygen in the etching gas as a first flow-rate ratio to execute etching in the etching process;

(b) a second step of etching to form the hole or trench while making the flow-rate ratio of the oxygen in the etching gas lower than the first flow-rate ratio in the etching process of second step to execute etching; wherein the aspect ratio of the hole or trench formed in the first step ranges between 6 and 10.

19. The method of manufacturing a semiconductor integrated circuit device according to claim 18, wherein the aspect ratio of the hole or trench formed in the second step is larger than 10.

20. A method of manufacturing a semiconductor integrated circuit device comprising the steps of:

(a) forming a memory-selecting field-effect transistor on a semiconductor substrate;

(b) depositing a silicon-nitride-based insulating film on the semiconductor substrate for covering the surface of a gate electrode of a memory-cell-selecting field-effect transistor and the surface of the semiconductor substrate;

(c) depositing a silicon-oxide-based insulating film on the semiconductor substrate for covering the silicon-nitride-based insulating film; and (d) executing etching in first step and that in second step in order in accordance with the quantity of CF-based deposit when forming a hole through which the silicon-nitride-based insulating film is exposed on the silicon-oxide insulating film by means of plasma-etching the silicon-oxide insulating film with an etching gas containing a fluorocarbon-based gas, oxygen and argon gas and selectively etching the silicon-oxide-based insulating film; wherein the flow-rate ratio of the oxygen in the etching gas in the second step is made lower than that of the oxygen in the etching gas in the first step.

21. The method of manufacturing a semiconductor integrated circuit device according to claim 20, wherein the first step is automatically changed to the second step by detecting the luminescence intensity of silicon fluoride or carbon nitride detected under etching.

22. The method of manufacturing a semiconductor integrated circuit device according to claim 20, wherein the depth of the hole formed in the first step is upper than the height of the gate electrode of the memory-cell-selecting field effect transistor.

23. The method of manufacturing a semiconductor integrated circuit device according to claim 20, wherein the aspect ratio of the hole formed in the first step ranges between 2 and 14.

24. The method of manufacturing a semiconductor integrated circuit device according to claim 23, wherein the aspect ratio of the hole formed in the first step ranges between 4 and 12.

25. The method of manufacturing a semiconductor integrated circuit device according to claim 20, wherein the aspect ratio of the hole formed in the first step ranges between 6 and 10.

26. The method of manufacturing a semiconductor integrated circuit device according to claim 20, wherein the aspect ratio of the hole formed in the second step is larger than 10.

27. A method of manufacturing a semiconductor integrated circuit device comprising the steps of, executed in order:

(a) forming a memory-cell-selecting field effect transistor on a semiconductor substrate;

(b) depositing a silicon-oxide-based insulating film on the upper layer of the memory-cell-selecting field effect transistor; and (c) executing the etching in first step and that in second step in order in accordance with the quantity of CF-based deposit when forming a hole for an information-storing capacitive element on the silicon-oxide insulating film by means of plasma-etching the silicon-oxide insulating film with an etching gas containing a fluorocarbon-based gas, oxygen and argon gas and selectively etching the silicon-oxide insulating film; wherein the flow-rate ratio of the oxygen in the etching gas in the second step is make lower than that of the oxygen in the etching gas in the first step.

28. The method of manufacturing a semiconductor integrated circuit device according to claim 27, wherein the first step is changed to the second step in accordance with an etching time.

29. The method of manufacturing a semiconductor integrated circuit device according to claim 27, wherein the depth of the hole formed in the first step is half the thickness of the silicon-oxide insulating film or less.

30. The method of manufacturing a semiconductor integrated circuit device according to claim 27, wherein the aspect ratio of the hole for an information-storing capacitive element formed in the first step ranges between 2 and 14.

31. The method of manufacturing a semiconductor integrated circuit device according to claim 27, wherein the aspect ratio of the hole for an information-storing capacitive element formed in the first step ranges between 4 and 12.

32. The method of manufacturing a semiconductor integrated circuit device according to claim 27, wherein the aspect ratio of the hole for an information-storing capacitive element formed in the first step ranges between 6 and 10.

33. The method of manufacturing a semiconductor integrated circuit device according to claim 27, wherein the aspect ratio of the hole for an information-storing capacitive element formed in the first step is larger than 12.

34. A method of manufacturing a semiconductor integrated circuit device comprising the steps of, executed in order:

(a) forming a memory-selecting field-effect transistor on a semiconductor substrate;

(b) depositing a silicon-nitride-based insulating film on the semiconductor substrate for covering the surface of the gate electrode of the memory-cell-selecting field-effect transistor and the surface of the semiconductor substrate;

(c) depositing a silicon-oxide-based insulating film on the semiconductor substrate for covering the silicon-nitride-based insulating film; and (d) executing the etching in first step and that in second step in order in accordance with the quantity of CF-based deposit when forming a hole through which the silicon-nitride-based insulating film is exposed on the silicon-oxide insulating film by means of plasma-etching the silicon-oxide insulating film with an etching gas containing a fluorocarbon-based gas, oxygen and argon gas and selectively etching the silicon-oxide-based insulating film; wherein high-frequency power to be applied to a lower electrode of an etching system in the second step is made smaller than that to be applied a lower electrode of an etching system in the first step.

35. A method of manufacturing a semiconductor integrated circuit device comprising the steps of, executed in order:

(a) forming a memory-selecting field-effect transistor on a semiconductor substrate;

(b) depositing a silicon-oxide-based insulating film on the upper layer of the memory-cell-selecting field effect transistor; and (c) executing the etching in first step and that in second step in order in accordance with the quantity of CF-based deposit when forming a hole for an information-storing capacitive element on the silicon-oxide insulating film by means of plasma-etching the silicon-oxide insulating film with an etching gas containing a fluorocarbon-based gas, oxygen and argon gas and selectively etching the silicon-oxide-based insulating film; wherein high-frequency power to be applied to a lower electrode of an etching system in the second step is made smaller than that to be applied a lower electrode of an etching system in the first step.

* * * * *